United States Patent
Gemma et al.

(10) Patent No.: US 9,239,392 B2
(45) Date of Patent: Jan. 19, 2016

(54) RADIOGRAPHIC IMAGING DEVICE

(71) Applicant: FUJIFILM CORPORATION, Minato-ku, Tokyo (JP)

(72) Inventors: Kohei Gemma, Kanagawa (JP); Kohei Ota, Kanagawa (JP); Tetsuya Tsuji, Kanagawa (JP); Kentaro Noma, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/633,149

(22) Filed: Feb. 27, 2015

(65) Prior Publication Data

US 2015/0247936 A1  Sep. 3, 2015

(30) Foreign Application Priority Data

Mar. 3, 2014 (JP) ................................ 2014-041015
Nov. 19, 2014 (JP) ................................ 2014-234647

(51) Int. Cl.
*G01T 1/10* (2006.01)
*G01T 1/20* (2006.01)
*G01T 1/29* (2006.01)
*H01L 27/146* (2006.01)

(52) U.S. Cl.
CPC ............. *G01T 1/2006* (2013.01); *G01T 1/2012* (2013.01); *G01T 1/2928* (2013.01); *G06T 2207/10116* (2013.01); *H01L 27/14676* (2013.01)

(58) Field of Classification Search
CPC ................... G01T 1/2928; G06T 2207/10116; H01L 27/14676
See application file for complete search history.

(56) References Cited

U.S. PATENT DOCUMENTS

| | | | | |
|---|---|---|---|---|
| 8,098,795 B2* | 1/2012 | Nowak | ...................... | G01T 1/00 378/62 |
| 8,586,934 B2* | 11/2013 | Nakatsugawa | ........ | G01T 1/2985 250/363.02 |
| 2002/0109113 A1* | 8/2002 | Wang | .................... | G01T 1/2014 250/584 |
| 2003/0048938 A1* | 3/2003 | Wang | .................... | G01T 1/2014 382/132 |

FOREIGN PATENT DOCUMENTS

| | | |
|---|---|---|
| JP | H10-233496 A | 9/1998 |
| JP | 2000-292546 A | 10/2000 |
| JP | 2001-108751 A | 4/2001 |
| JP | 2006-500126 A | 1/2006 |
| JP | 2007-007307 A | 1/2007 |
| JP | 2008-535036 A | 8/2008 |
| JP | 2011-072775 A | 4/2011 |
| JP | 2011-224340 A | 11/2011 |
| JP | 2012-238001 A | 12/2012 |

* cited by examiner

*Primary Examiner* — Kiho Kim
(74) *Attorney, Agent, or Firm* — Solaris Intellectual Property Group, PLLC

(57) ABSTRACT

In the radiographic imaging device, a portion of a second effective imaging region at a first side or a second side of a sensor unit of a second radiation detection panel, and a portion of a first effective imaging region at a third side or a fourth side of the sensor unit of a first radiation detection panel, are overlapped in a radiation irradiating direction. A portion of a second effective imaging region at the third side or the fourth side of the sensor unit of the second radiation detection panel, and a portion of a third effective imaging region at the third side or the fourth side of the sensor unit of the third radiation detection panel, are overlapped in the radiation irradiating direction. The second radiation detection panel is disposed at a side opposite the radiation irradiating section side of the first radiation detection panel and the third radiation detection panel.

27 Claims, 39 Drawing Sheets

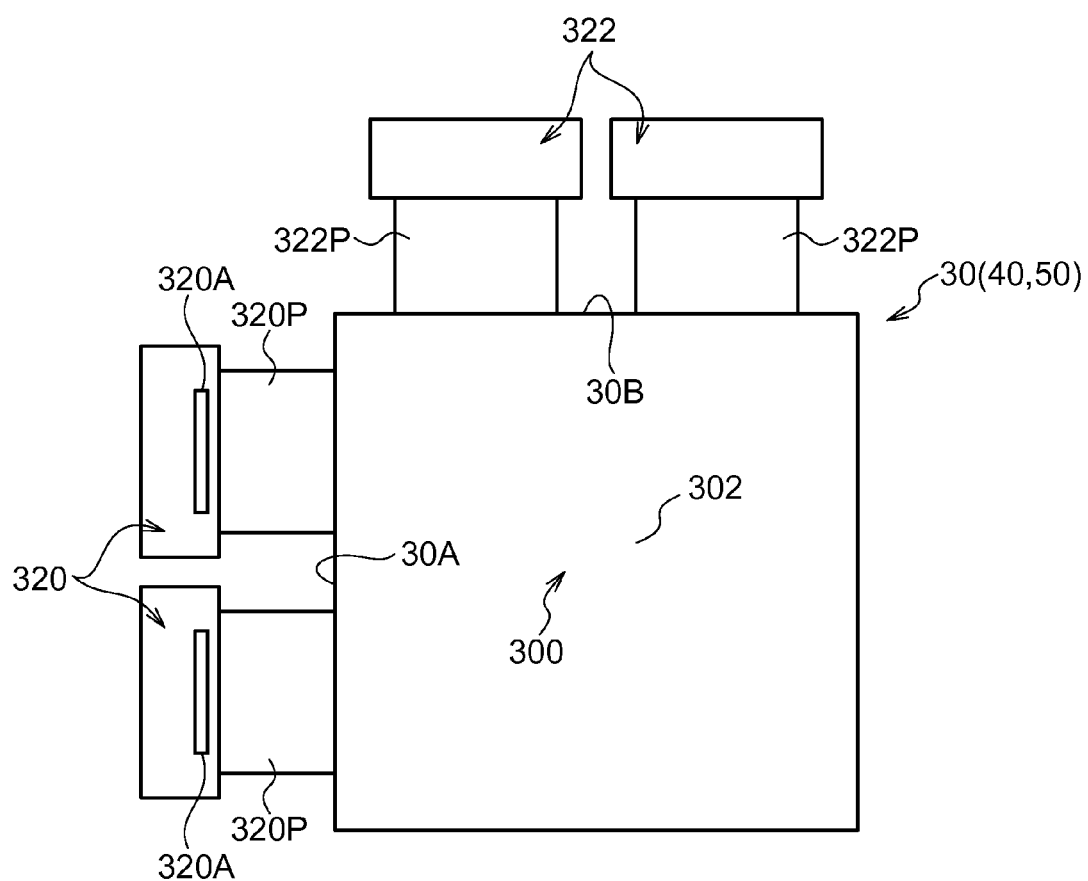

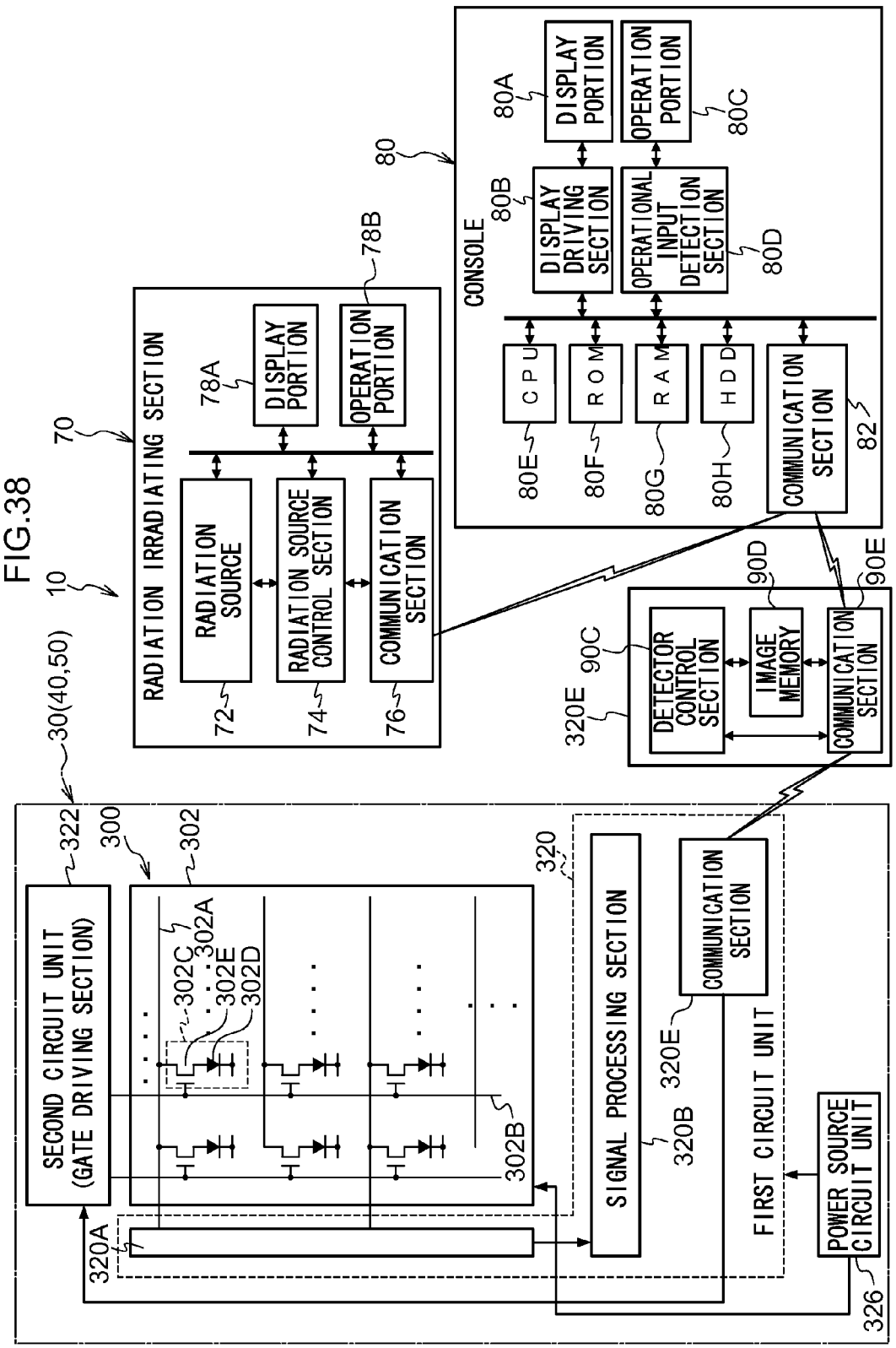

RADIOGRAPHIC IMAGING DEVICE

CROSS-REFERENCE TO RELATED APPLICATION

This application is based on and claims priority under 35 USC 119 from Japanese Patent Applications No. 2014-041015 filed on Mar. 3, 2014 and No. 2014-234647 filed on Nov. 19, 2014, the disclosures of which are incorporated by reference herein.

BACKGROUND

1. Technical Field

The present invention relates to a radiographic imaging device.

2. Related Art

Japanese Patent Application Laid-Open (JP-A) No. 2000-292546 discloses an X-ray image capturing device that is used in medical care. In this X-ray image capturing device, some of the imaging pixels of plural X-ray sensor units are connected in an overlapping manner, and a X-ray image capturing over a wide range is possible.

By the way, for reasons relating to manufacturing, there are limits on how large an X-ray sensor unit can be made. In order to make it possible to capture an image of the majority of a subject by irradiating X-rays a single time by using X-ray sensor units of the existing size, three X-ray sensor units must be connected. However, in an X-ray sensor unit, the imaging pixels are arranged in the form of a two-dimensional matrix. Further, driving circuits that read-out the captured information of the imaging pixels, and processing circuits that carry out signal processing on the read-out captured information, are disposed at the peripheries of the X-ray sensor units. Therefore, even if three X-ray sensor units are connected by merely making some of the imaging pixels overlap one another, the driving circuits and processing circuits exist at the places of connection. As a result, the X-rays are blocked by the driving circuits or processing circuits at the places of connection, and it is difficult to realize long-length image capturing in which three X-rays sensor units are connected at a radiographic imaging device.

SUMMARY

In consideration of the above-described circumstances, an object of the present invention is to provide a radiographic imaging device that enables long-length image capturing of a radiological image by connecting three radiation detection panels, and that can improve the image quality of the captured information at the places of connection of the radiation detection panels.

According to a first aspect of the invention, there is provided a radiographic imaging device including three radiation detection panels that are a first radiation detection panel, a second radiation detection panel and a third radiation detection panel, each radiation detection panel having: a sensor unit that is rectangular flat plate shaped and at which a plurality of detection elements, that detect radiation irradiated from a radiation irradiating section, are arrayed in a matrix structure; and a circuit unit that is connected to the sensor unit, and that is disposed at a first side and a second side that are adjacent to one another of the sensor unit, and that carries out reading-out of radiological image information detected by the detection elements, or signal processing of the read-out radiological image information, wherein the circuit unit is not disposed at a third side that faces the first side and at a fourth side that faces the second side of the sensor unit, and the first radiation detection panel and the third radiation detection panel are disposed such that the third sides or the fourth sides of the sensor units face one another, and a portion of a second effective imaging region at the first side or the second side of the sensor unit of the second radiation detection panel, and a portion of a first effective imaging region at the third side or the fourth side of the sensor unit of the first radiation detection panel, are overlapped in a radiation irradiating direction, and a portion of a second effective imaging region at the third side or the fourth side of the sensor unit of the second radiation detection panel, and a portion of a third effective imaging region at the third side or the fourth side of the sensor unit of the third radiation detection panel, are overlapped in the radiation irradiating direction, and the second radiation detection panel is disposed at a side opposite the radiation irradiating section side of the first radiation detection panel and the third radiation detection panel.

The radiographic imaging device relating to the first aspect has the three radiation detection panels that are the first radiation detection panel, the second radiation detection panel and the third radiation detection panel. A sensor unit and a circuit unit are provided at each of the first radiation detection panel, the second radiation detection panel and the third radiation detection panel. The sensor unit is disposed at the radiation irradiating section side, and detects radiation by detection elements. The sensor unit is formed in a rectangular flat plate shape. The circuit unit is disposed at a first side and a second side, that are adjacent to one another, of the sensor unit, and is not disposed at a third side, that faces the first side, and a fourth side, that faces the second side, of the sensor unit.

Here, the first radiation detection panel and the third radiation detection panel are disposed such that the third sides or the fourth sides of the sensor units thereof, at which the circuit units are not disposed, face one another. Further, at the second radiation detection panel, a portion of the effective imaging region at the first side or the second side of the sensor unit of the second radiation detection panel is disposed so as to be overlapped, in the radiation irradiating direction, with a portion of the effective imaging region at the third side or the fourth side of the sensor unit of the first radiation detection panel. Moreover, at the second radiation detection panel, a portion of the effective imaging region at the third side or the fourth side of the sensor unit of the second radiation detection panel is disposed so as to be overlapped, in the radiation irradiating direction, with a portion of the effective imaging region at the third side or the fourth side of the sensor unit of the third radiation detection panel. Further, the second radiation detection panel is disposed at the side, that is opposite the radiation irradiating section side, of the first radiation detection panel and the third radiation detection panel. Thus, a portion of the effective imaging region of the sensor unit of the second radiation detection panel is overlapped with a portion of the effective imaging region of the sensor unit of the first radiation detection panel, and the circuit units are not interposed at the place of overlapping. Similarly, a portion of the effective imaging region of the sensor unit of the second radiation detection panel is overlapped with a portion of the effective imaging region of the sensor unit of the third radiation detection panel, and the circuit units are not interposed at the place of overlapping. Accordingly, the three radiation detection panels that are the first radiation detection panel, the second radiation detection panel and the third radiation detection panel are connected in one direction, and radiation is not blocked by circuit units at the places of connection.

According to a second aspect of the present invention, in the first aspect of the radiographic imaging device, the sensor unit and the circuit unit may be connected via a flexible substrate.

In accordance with the radiographic imaging device relating to the second aspect, the sensor unit and the circuit unit are connected via the flexible substrate. Therefore, the degrees of freedom in the arrangement layout of the circuit unit or of a portion of the circuit unit can be improved.

According to a third aspect of the present invention, in the first aspect or the second aspect of the radiographic imaging device, the circuit unit may be disposed at the side opposite the radiation irradiating section side of the first radiation detection panel, the second radiation detection panel or the third radiation detection panel.

In accordance with the radiographic imaging device relating to the third aspect, the circuit unit is disposed at the side opposite the radiation irradiating section side of the first radiation detection panel, the second radiation detection panel or the third radiation detection panel. Therefore, radiation is not blocked by the circuit unit. Further, due to the circuit unit being disposed at the side opposite the radiation irradiating section side, the surface area, in the imaging plane direction, that is occupied by the circuit unit is superposed with the surface area occupied by the first radiation detection panel or the like, and compactness of the radiographic imaging device can be realized.

According to a fourth aspect of the present invention, in the first aspect or the second aspect of the radiographic imaging device, at least a portion of the circuit unit may be disposed along a side surface of the first radiation detection panel, the second radiation detection panel or the third radiation detection panel.

In accordance with the radiographic imaging device relating to the fourth aspect, at least a portion of the circuit unit is disposed in the radiation irradiating direction along a side surface of the first radiation detection panel, the second radiation detection panel or the third radiation detection panel. Therefore, erroneous operation, due the irradiating of radiation, of at least a portion of the circuit unit can be suppressed or prevented.

According to a fifth aspect of the present invention, in any one of the first aspect to the fourth aspect of the radiographic imaging device, the circuit unit of the second radiation detection panel may be disposed so as to overlap the first radiation detection panel at the side opposite the radiation irradiating section side of the first radiation detection panel.

In accordance with the radiographic imaging device relating to the fifth aspect, the circuit unit of the second radiation detection panel is disposed so as to overlap the first radiation detection panel, at the side opposite the radiation irradiating section side of the first radiation detection panel. Therefore, the thickness of the circuit unit in the radiation irradiating direction is incorporated within the thickness of the second radiation detection panel. Thus, making the radiographic imaging device thin can be realized.

According to a sixth aspect of the present invention, in the third aspect or the fifth aspect of the radiographic imaging device, a blocking plate that blocks radiation may be provided between the sensor unit and the circuit unit.

In accordance with the radiographic imaging device relating to the sixth aspect, because the blocking plate is provided between the sensor unit and the circuit unit, radiation onto the circuit unit is blocked by the blocking plate. Therefore, erroneous operation, due to irradiating of radiation, of the circuit unit can be suppressed or prevented.

According to a seventh aspect of the present invention, in the sixth aspect of the radiographic imaging device, the blocking plate may be formed of a metal material.

In accordance with the radiographic imaging device relating to the seventh aspect, the blocking plate is formed of a metal material. Because metal materials have excellent thermal conductivity, the ability to dissipate the heat generated by circuit operation of the circuit unit can be improved.

According to an eighth aspect of the present invention, in any one of the first aspect to the seventh aspect of the radiographic imaging device, the first radiation detection panel, the second radiation detection panel and the third radiation detection panel may be accommodated within one panel case.

In accordance with the radiographic imaging device relating to the eighth aspect, the first radiation detection panel, the second radiation detection panel and the third radiation detection panel are accommodated within one panel case. Therefore, shared regions are optimized as compared with a case in which the radiation detection panels are individually accommodated in panel cases. Thus, compactness of the radiographic imaging device can be realized.

According to a ninth aspect of the present invention, in the eighth aspect of the radiographic imaging device, a reinforcing member, that is provided between the sensor unit and the circuit unit and reinforces the sensor unit and mounts the first radiation detection panel, the second radiation detection panel or the third radiation detection panel to the panel case, may be provided.

In accordance with the radiographic imaging device relating to the ninth aspect, because the reinforcing member is provided between the sensor unit and the circuit unit, the sensor unit is reinforced, and the workability of mounting the sensor unit and the circuit unit to the panel case can be improved.

According to a tenth aspect of the present invention, in the ninth aspect of the radiographic imaging device, the sensor unit may have a phosphor layer that converts radiation into light, and a photoelectric conversion panel that includes photoelectric conversion elements that convert light, that has been obtained by conversion by the phosphor layer, into electric signals and switching elements that are connected in series to the photoelectric conversion elements, and the phosphor layer and the photoelectric conversion panel may be layered on the reinforcing member.

In accordance with the radiographic imaging device relating to the tenth aspect, the sensor unit has the phosphor layer and the photoelectric conversion panel. Because the phosphor layer and the photoelectric conversion panel are layered on the reinforcing member, the phosphor layer and the photoelectric conversion panel are reinforced by the reinforcing member. Therefore, for example, in the work of assembling the radiographic imaging device, the phosphor layer and the photoelectric conversion panel can be handled without damage such as breakage or the like arising, and therefore, the handling ability can be improved.

According to an eleventh aspect of the present invention, in the ninth aspect or the tenth aspect of the radiographic imaging device, the reinforcing member may be formed of a carbon fiber reinforced plastic material, a light metal material, or a light alloy material.

In accordance with the radiographic imaging device relating to the eleventh aspect, because the reinforcing member is formed of a material that is light-weight and high-strength, the handling ability can be improved more.

According to a twelfth aspect of the present invention, in the tenth aspect of the radiographic imaging device, the sensor unit may use an irradiation side sampling in which the photoelectric conversion panel is disposed at the radiation irradiating section side, the phosphor layer may be disposed at the side opposite the radiation irradiating section side, and light may be collected from the radiation irradiating section side of the phosphor layer.

In accordance with the radiographic imaging device relating to the twelfth aspect, the ISS (Irradiation Side Sampling), in which the photoelectric conversion panel is disposed at the radiation irradiating section side and the phosphor layer is disposed at the side opposite the radiation irradiating section side and light is collected from the radiation irradiating section side of the phosphor layer, is used at the sensor unit. Therefore, the distance until the light, that is obtained by conversion from the radiation, reaches the photoelectric conversion elements can be shortened. Thus, the photoelectric conversion efficiency is improved, and the image quality of the radiological image can be improved.

According to a thirteenth aspect of the present invention, in any one of the eighth aspect to the twelfth aspect of the radiographic imaging device, an external connection cable, that has a power line and a signal line and that can be connected to a side surface of the panel case at an intermediate portion in a direction of arraying of the first radiation detection panel, the second radiation detection panel and the third radiation detection panel, may be provided.

In accordance with the radiographic imaging device relating to the thirteenth aspect, the external connection cable can be connected to a side surface of the panel case at an intermediate portion in the direction of arraying of the first radiation detection panel and the like. Therefore, the signal transfer path lengths and the power supply path lengths from the external connection cable to the first radiation detection panel, the second radiation detection panel and the third radiation detection panel are made uniform, and the transfer path lengths and the supply path lengths are short. Accordingly, effects of noise at the transfer paths of signals and at the supply paths of the power supply can be reduced.

According to a fourteenth aspect of the present invention, in any one of the eighth aspect to the twelfth aspect of the radiographic imaging device, an external connection cable, that has a power line and a signal line and that can be connected to a side surface of the panel case at one end portion in a direction of arraying of the first radiation detection panel, the second radiation detection panel and the third radiation detection panel, may be provided.

In accordance with the radiographic imaging device relating to the fourteenth aspect, the external connection cable can be connected to a side surface of the panel case at one end portion in the direction of arraying of the first radiation detection panel and the like. Because the mounting and the removing of the external connection cable do not get in the way at one end portion in the arraying direction, the usability is improved.

According to a fifteenth aspect of the present invention, in any one of the eighth aspect to the twelfth aspect of the radiographic imaging device, an external connection cable, that has a power line and a signal line and that can be connected to a side surface of the panel case in an array width direction of the first radiation detection panel, the second radiation detection panel and the third radiation detection panel, may be provided.

In accordance with the radiographic imaging device relating to the fifteenth aspect, the external connection cable can be connected to a side surface of the panel case in the array width direction of the first radiation detection panel and the like. Because the mounting and the removing of the external connection cable do not get in the way in the array width direction, the usability is improved.

According to a sixteenth aspect of the present invention, in any one of the eighth aspect to the fifteenth aspect of the radiographic imaging device, the panel case may have an imaging surface on which marks, that indicate positions corresponding respectively to a first overlapping region, at which the first effective imaging region and the second effective imaging region overlap, and a second overlapping region, at which the second effective imaging region and the third effective imaging region overlap, are marked on the radiation irradiating section side.

According to a seventeenth aspect of the present invention, in any one of the eighth aspect to the sixteenth aspect of the radiographic imaging device, marks, that indicate positions corresponding respectively to the first overlapping region and the second overlapping region, may be marked on a side surface of the panel case.

According to a eighteenth aspect of the present invention, in the sixteenth aspect or the seventeenth aspect of the radiographic imaging device, marks, that indicate positions corresponding respectively to the first effective imaging region, the second effective imaging region and the third effective imaging region, may be further marked on at least one of the imaging surface and a side surface of the panel case.

According to a nineteenth aspect of the present invention, in any one of the sixteenth aspect to the eighteenth aspect of the radiographic imaging device, marks that are marked on the imaging surface and marks that are marked on a side surface of the panel case may be marked at positions corresponding to an angle of oblique incidence of radiation that is irradiated from the radiation irradiating section.

According to a twentieth aspect of the present invention, in any one of sixteenth aspect to the nineteenth aspect of the radiographic imaging device, marks, that indicate positions corresponding to seams of a grid portion in a case in which capturing of a radiological image is carried out by using the grid portion at which are joined together a plurality of grids that remove scattered radiation that is included in the radiation that has been transmitted through the subject, may be further marked at at least one of the imaging surface and a side surface of the panel case.

According to a twenty first aspect of the present invention, in any one of the sixteenth aspect to the twentieth aspect of the radiographic imaging device, marks, that indicate positions corresponding to sizes in cases in which trimming of a radiological image is to be carried out, may be further marked at at least one of the imaging surface and a side surface of the panel case.

According to a twenty second aspect of the present invention, in any one of the sixteenth aspect to the twenty first aspect of the radiographic imaging device, in a case in which a plurality of types of marks are marked at at least one of the imaging surface and a side surface of the panel case, methods of marking the marks may be made to differ in accordance with the types.

According to a twenty third aspect of the present invention, in any one of the eighth aspect to the twenty second aspect of the radiographic imaging device, the panel case may have wheels.

According to a twenty fourth aspect of the present invention, in the twenty third aspect of the radiographic imaging device, the wheels may be provided at a plurality of casters that are removable with respect to the panel case, and mounting portions, that mount the plurality of casters respectively to the panel case, may be provided at the panel case.

According to a twenty fifth aspect of the present invention, in the twenty third aspect of the radiographic imaging device, the panel case may have accommodating portions that accommodate the wheels, and the wheels may be connected to interiors of the accommodating portions by shafts that fix the wheels, that have been taken-out from the accommodating portions, to side surfaces of the panel case.

According to a twenty sixth aspect of the present invention, in any one of the twenty third aspect to the twenty fifth aspect of the radiographic imaging device, the wheels may be provided at a back surface plate of the panel case that is at a side opposite the radiation irradiating section side.

According to a twenty seventh aspect of the present invention, in any one of the twenty third aspect to the twenty sixth aspect of the radiographic imaging device, the wheels may be provided at one side of the panel case, and a grasping portion, that is provided at a side of the panel case that faces the one side, or a grasping portion, that is removable with respect to a side of the panel case that faces the one side, may be provided.

The radiographic imaging device relating to the present invention has the excellent effects of enabling long-length image capturing of a radiological image by connecting three radiation detection panels, and improving the image quality of the radiological image at the places of connection of the radiation detection panels.

BRIEF DESCRIPTION OF THE DRAWINGS

Exemplary embodiments of the present invention will be described in detail based on the following figures, wherein:

FIG. 14 is a schematic plan view of the radiation detection panel of the radiographic imaging device relating to a second modified example of the first embodiment;

FIG. 38 is a system circuit structural drawing of another example of the radiographic imaging device.

DETAILED DESCRIPTION

Figure 1:
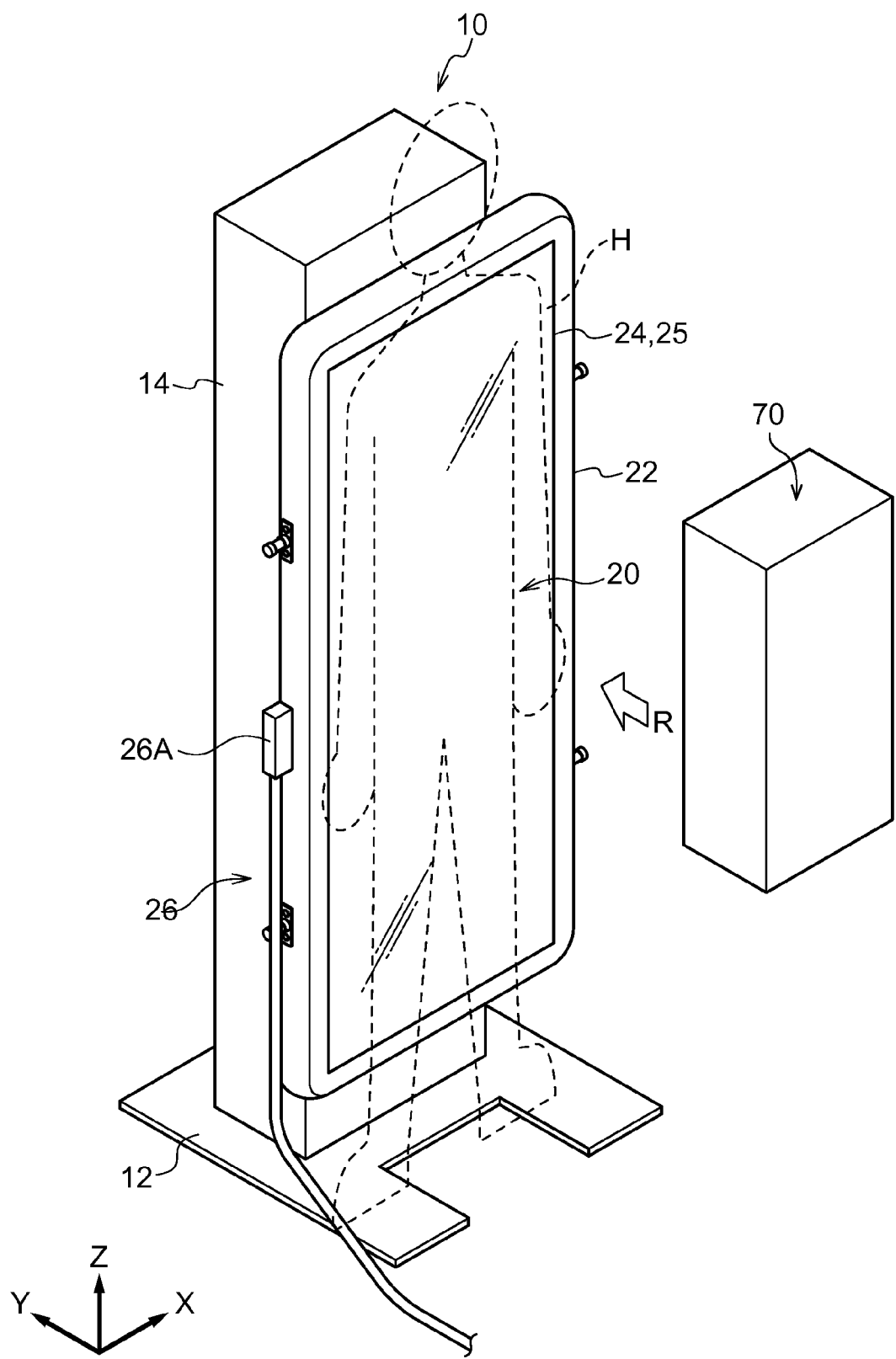
FIG. 1 is a perspective view in which the structure of a radiographic imaging device relating to a first embodiment of the present invention is seen from a radiation irradiating section side.

Embodiments relating to the present invention are described hereinafter with reference to the appended drawings. Note that structural elements having the same functions are denoted by the same reference numerals in the drawings, and redundant description is omitted as appropriate. Further, the arrow X direction that is shown appropriately in the drawings is a horizontal direction that is orthogonal to a direction (hereinafter called the "radiation irradiating direction") of irradiating radiation R that is shown in FIG. 1. The arrow Y direction is a horizontal direction that coincides with the radiation irradiating direction. Further, the arrow Z direction is the upward direction. The arrow X direction, the arrow Y direction and the arrow Z direction are directions coinciding with the X-axis direction, the Y-axis direction and the Z-axis direction of an XYZ coordinate. Note that the directions of application of the radiographic imaging devices relating to the present invention are not limited.

First Embodiment

A radiographic imaging device relating to a first embodiment is described by using FIG. 1 through FIG. 19.

(Overall External Structure of Radiographic Imaging Device)

Figure 2:
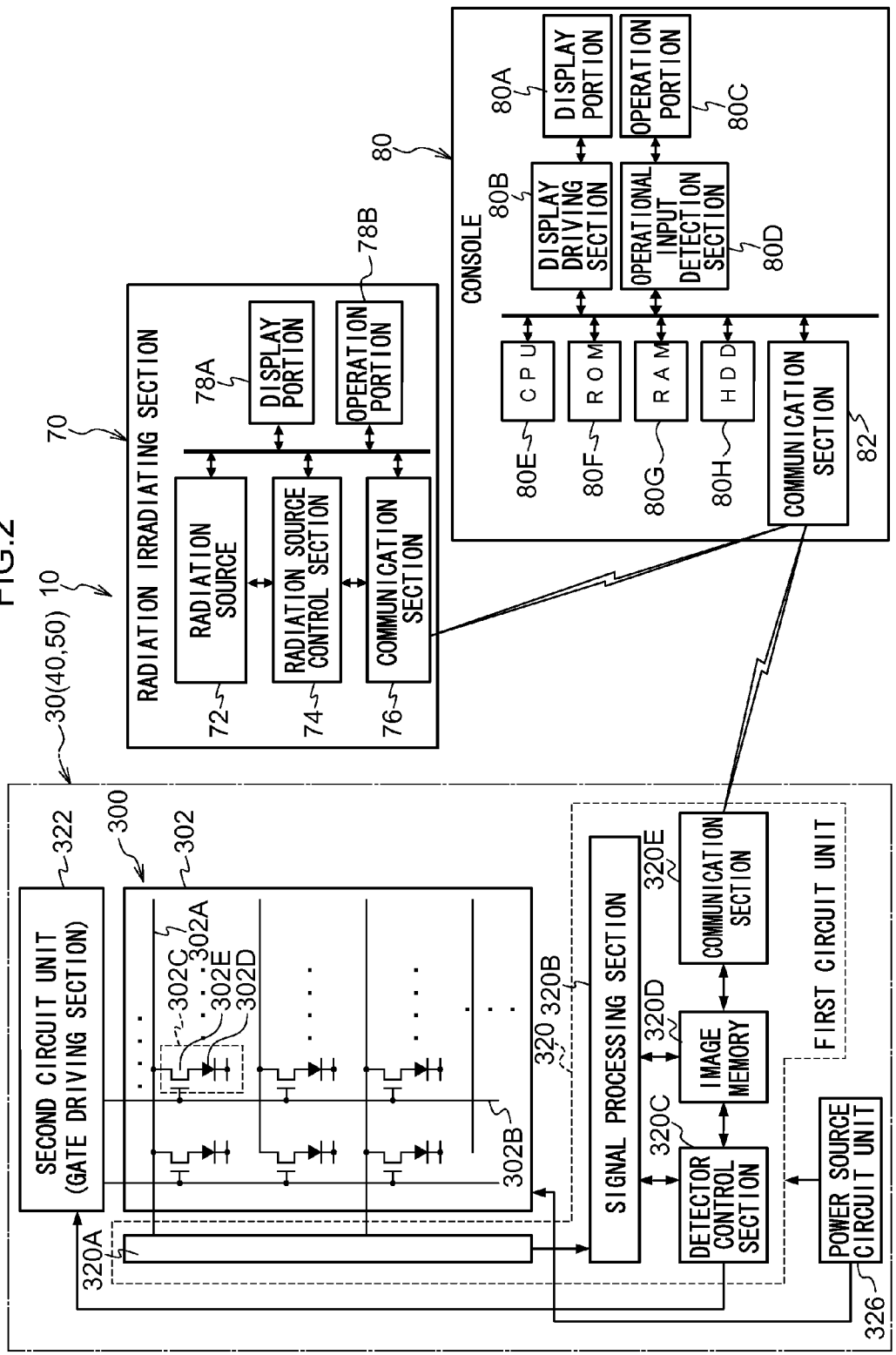
FIG. 2 is a system circuit structural drawing of the radiographic imaging device shown in FIG. 1.

As shown in FIG. 1, a radiographic imaging device 10 has a panel case 20 that is shaped as a rectangular flat plate that is thin and whose length direction is the vertical direction and whose short direction is the left-right direction. The panel case 20 is structured so that three radiation detection panels that are a first radiation detection panel 30, a second radiation detection panel 40 and a third radiation detection panel 50 (refer to FIG. 4 and the like) that are described later are accommodated within the panel case 20. The radiation R is irradiated from a radiation irradiating section 70 that is shown in FIG. 2, toward a subject H. A top plate 24, that has an imaging surface that is shaped as a rectangular flat surface and whose shape is similar to that of the panel case 20 but that is one size smaller than the panel case 20, is provided at a radiation irradiated surface 22 of the panel case 20 that is disposed at the side from which the radiation R is irradiated (hereinafter called the "radiation irradiating section 70 side"). In the present embodiment, the surface, that is at the radiation irradiating section 70 side, of the top plate 24 is the imaging surface. In the present embodiment, the top plate 24 is structured from, for example, a carbon fiber reinforced plastic (CFRP) that is shaped as a rectangular flat plate, and that is light-weight and through which the radiation R is transmitted. The top plate 24 is fixed to a frame main body 202 (see FIG. 4) of the panel case 20 by a fixing means such as screws or the like for example.

The panel case 20 is supported, at the side opposite the radiation irradiating section 70, at a supporting pillar 14 that is shaped as a rectangular pillar whose length direction is the vertical direction. A bottom plate 12, that spreads-out toward the outer sides of the supporting pillar 14, is provided at the lower end portion of the supporting pillar 14. The panel case 20 is stably supported by the bottom plate 12 via the supporting pillar 14. The panel case 20 is mounted to the supporting pillar 14, and is made to be removable from the supporting pillar 14. With the radiographic imaging device 10 shown in FIG. 1, it is possible to capture radiological images of, for example, the subject H who is in a standing state, or the subject H who is in a seated state of being seated in a chair or a wheelchair. Further, the panel case 20 may be supported at the supporting pillar 14 so as to rotate freely with the direction of irradiating the radiation R (the arrow Y direction) being the rotational axis direction. Moreover, capturing of radiological images of the subject H who is in a supine state is possible with the panel case 20 being removed from the supporting pillar 14 and set on the floor, or with the panel case 20 being used as a supine imaging stand.

A connector 26A of an external connection cable 26 can be connected to the side surface at the length direction central portion of the panel case 20. The external connection cable 26 includes at least a power line and a signal line, and carries out supplying of electric power, transmission and reception of signals, and the like with respect to the first radiation detection panel 30 and the like.

(System Structure of Radiographic Imaging Device)

As shown in FIG. 2, the radiographic imaging device 10 has the radiation irradiating section 70, the three radiation detection panels that are the first radiation detection panel 30, the second radiation detection panel 40 and the third radiation detection panel 50 that are accommodated within the panel case 20, and a console 80. A radiological image capturing system is structured by these structures.

1. Circuit Structure of Radiation Irradiating Section

As shown in FIG. 2, the radiation irradiating section 70 has a radiation source 72, a radiation source control section 74, a communication section 76, a display portion 78A and an operation portion 78B. At the communication section 76, various types of information such as exposure conditions and the like are transmitted and received to and from the console 80. At the radiation source control section 74, the operations of the radiation source 72 are controlled on the basis of the exposure conditions that were received via the communication section 76. A microcomputer is provided at the radiation source control section 74, and information, such as the exposure conditions that were received via the communication section 76 and the like, are stored in the memory of the microcomputer. The exposure conditions include, for example, at least information that includes the X-ray tube voltage, the X-ray tube current, the exposure time and the like. The irradiating of the radiation R from the radiation source 72 is controlled by control of the radiation source control section 74 on the basis of these exposure conditions. Information such as the exposure conditions and the like is displayed on the display portion 78A. The operation of starting-up the radiation irradiating section 70, the operation of stopping the radiation irradiating section 70, and the operation of starting irradiating of the radiation R can be carried out at the operation portion 78B.

2. Circuit Structure of Radiation Detection Panel

The three in total radiation detection panels (the first radiation detection panel 30, the second radiation detection panel 40 and the third radiation detection panel 50) are accommodated within the panel case 20.

Figure 6:
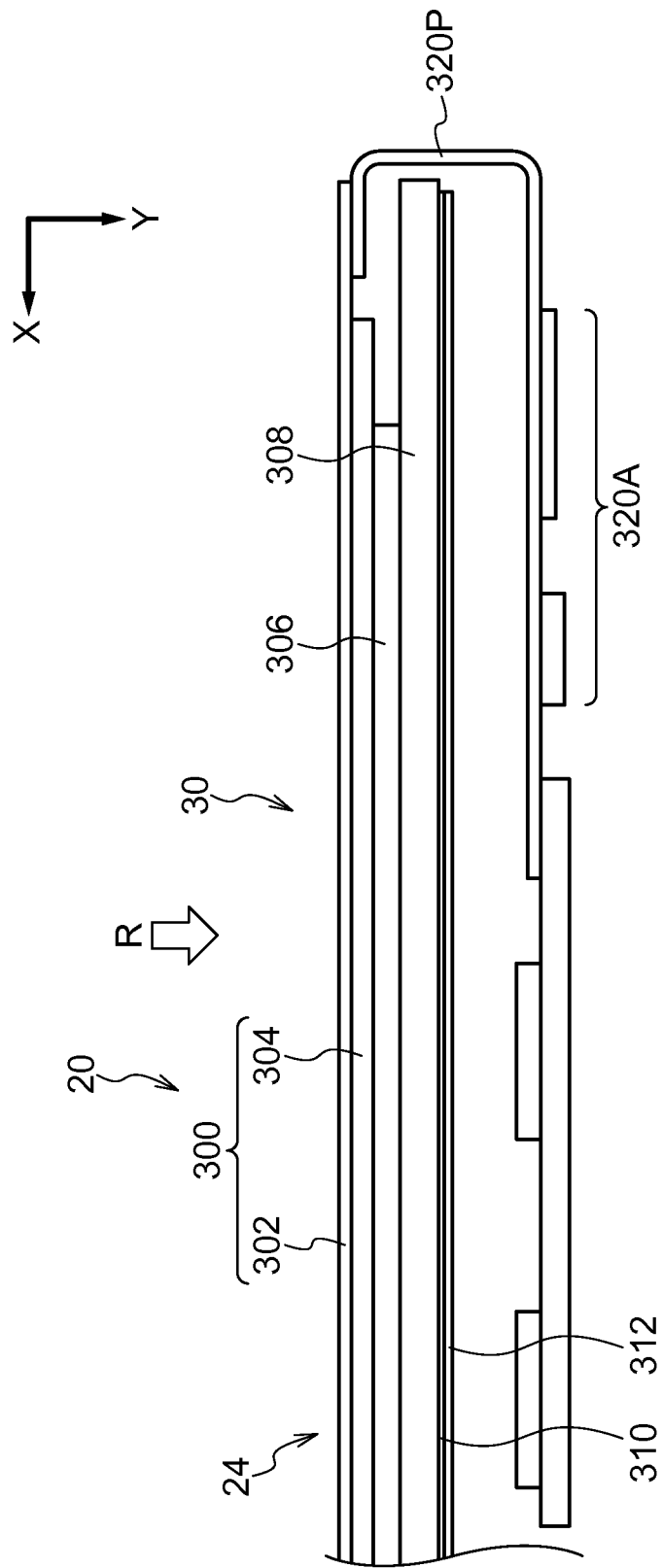
FIG. 6 is an enlarged cross-sectional view of main portions of the radiographic imaging device shown in FIG. 4 (an enlarged sectional view cut along cutting plane line A-A shown in FIG. 4)
Figure 7:
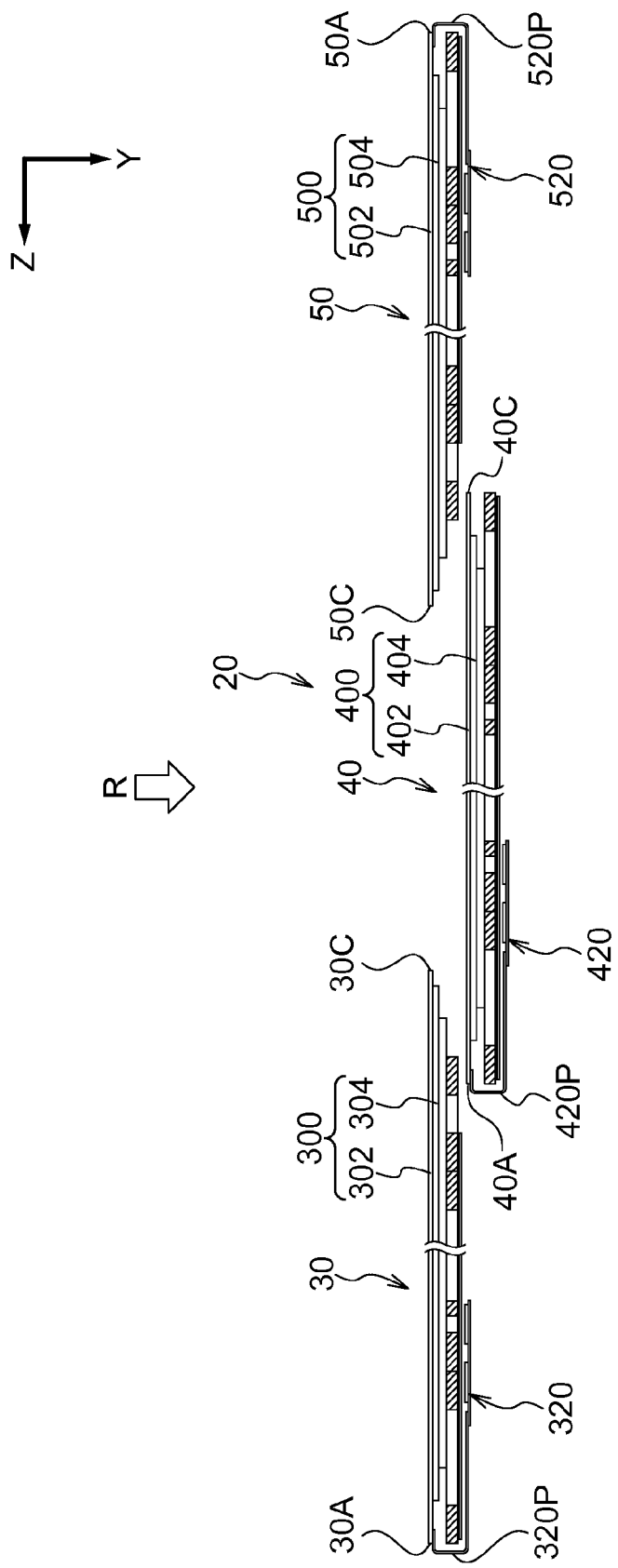
FIG. 7 is a side view in which radiation detection panels of the radiographic imaging device shown in FIG. 4 and FIG. 5 are seen from the side.
Figure 8:
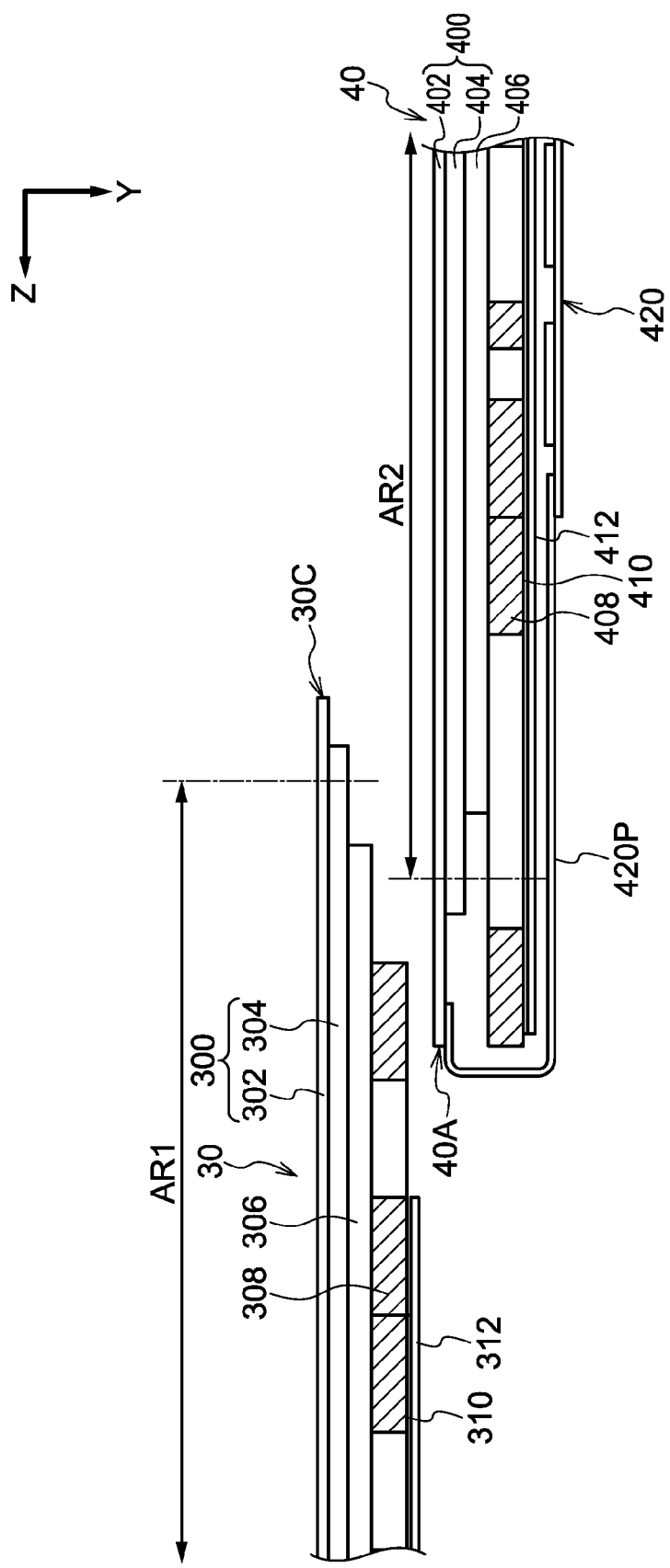
FIG. 8 is an enlarged side view of a place of connection of the radiation detection panels shown in FIG. 7.

As shown in FIG. 2, the first radiation detection panel 30 has a sensor unit 300 that detects the radiation R, and a first circuit unit 320 and a second circuit unit 322 that are connected to the sensor unit 300. The sensor unit 300 has a phosphor layer (scintillator) 304 that converts the radiation R into light and that is shown in FIG. 6 through FIG. 8, and a photoelectric conversion panel 302 that converts the light, that has been converted by the phosphor layer 304, into electric signals. Moreover, the first radiation detection panel 30 has a power source circuit unit 326.

As shown in FIG. 2, the photoelectric conversion panel 302 has plural output lines 302A, that extend in an output line extension direction, e.g., the lateral direction, and are arrayed in a scan line extension direction, e.g., the vertical direction, and plural scan lines 302B that extend in the scan line extension direction and are arrayed in the output line extension direction. Detection elements 302C are provided at the places where the output lines 302A and the scan lines 302B intersect. In a case in which light, that has been obtained by conversion by the phosphor layer 304 on which the radiation R is incident, is incident on the detection element 302C, the detection element 302C generates a charge signal from the incident radiation R. The plural detection elements 302C are arrayed respectively along the output line extension direction and the scan line extension direction, and the arrangement layout of the detection elements 302C is a two-dimensional matrix form (a two-dimensional matrix structure). The detection element 302C has a photoelectric conversion element 302D that converts light into a charge signal, and a switching element 302E that controls the energizing/non-energizing between the output line 302A and the photoelectric conversion element 302D by the scan line 302B. The photoelectric conversion element 302D and the switching element 302E are connected in series. The photoelectric conversion element 302D is structured of, for example, gadolinium oxide sulfur (GOS). The switching element 302E is structured by, for example, a thin-film transistor (TFT).

Figure 3:
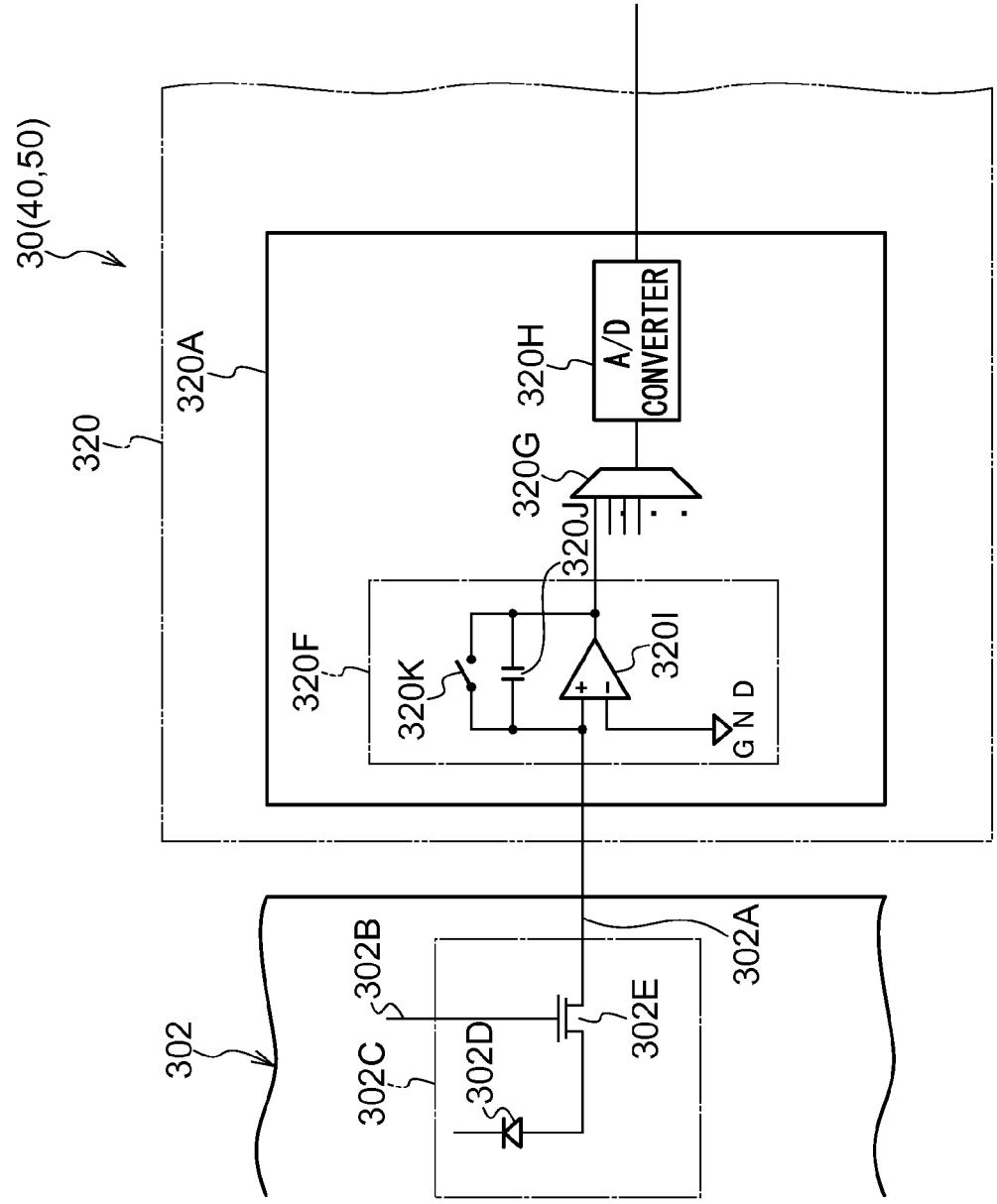
FIG. 3 is a block circuit drawing of main portions of the radiographic imaging device shown in FIG. 1.

At the first circuit unit 320, signal processing of the radiological image information read-out from the detection elements 302C is carried out. In detail, the first circuit unit 320 has a circuit section 320A that is connected to the output lines 302A of the first radiation detection panel 30 and that converts the charge signals, that that were obtained by conversion by the photoelectric converting elements 302D of the detection elements 302C, into voltage signals. As shown in FIG. 3, the circuit section 320A has a charge amplifier circuit 320F that functions also as a sample and hold circuit, a multiplexer 320G, and an analog/digital (A/D) converter 320H.

The charge amplifier circuit 320F is provided for each of the output lines 302A, and has an operational amplifier 320I, a capacitor 320J and a switch 320K. The capacitor 320J and the switch 320K are both electrically connected in parallel between the input and output of the operational amplifier 320I. The charge signal, that has been transferred from the detection element 302C through the output line 302A, is held at the charge amplifier circuit 320F. The charge amplifier circuit 320F converts the charge signal into an analog signal (a voltage signal) by the operational amplifier 320I and the capacitor 320J. The switch 320K of the charge amplifier circuit 320F is used as a resetting circuit that carries out discharging of the charge signal accumulated in the capacitor 320J. The analog signal obtained by conversion at the charge amplifier circuit 320F is inputted to the multiplexer 320G. The multiplexer 320G outputs the analog signal to the analog/digital converter 320H. At the analog/digital converter 320H, the analog signal is converted into a digital signal.

As shown in FIG. 2, in the present embodiment, the first circuit unit 320 further has a signal processing section 320B, a detector control section 320C, an image memory 320D, and a communication section 320E. At the signal processing section 320B, image processing is carried out on the digital signals that have been obtained by conversion through the circuit section 320A, and radiological image information is generated. The signal processing section 320B is connected to the image memory 320D, and the radiological image information generated at the signal processing section 320B are stored serially in the image memory 320D. The image memory 320D has a storage capacity that can store the radiological image information of a predetermined number of images. The radiological image information that has been obtained by image capturing is successively stored in the image memory 320D each time capturing of a radiological image is carried out.

The detector control section 320C is connected respectively to the second circuit unit 322, the signal processing section 320B, the image memory 320D, the communication section 320E and the power source circuit unit 326, and governs the control of these. The detector control section 320C has a microcomputer. The microcomputer is structured to include a CPU (Central Processing Unit), memories such as a RAM (Random Access Memory) and a ROM (Read Only Memory) and the like, and a storage section such as a hard disk or the like.

The communication section 320E carries out the transmitting and receiving of various types of information to and from external devices, on the basis of control from the detector control section 320C. The communication section 320E in the present embodiment is a wired communication section or a wireless communication section corresponding to wireless LAN (Local Area Network) standards exemplified by IEEE (Institute of Electrical and Electronics Engineers) 802.11a/ b/g or the like, although the present invention is not limited to such a type. In detail, the communication section 320E carries out, between the detector control section 320C and the console 80, transmitting and receiving of various types of information that carry out control relating to the capturing of radiological images. Further, the communication section 320E carries out transmitting and receiving of radiological image information from the detector control section 320C to the console 80, and the like.

The power source circuit unit 326 supplies electric power to the respective circuits of the first circuit unit 320 and the like, and to the second circuit unit 322. Note that the first circuit unit 320 may be structured by the circuit section 320A, and the circuits such as the signal processing section 320B and the like may be structured as another circuit unit.

The second circuit unit 322 is a gate driving section, and the reading-out of radiological image information from the detection elements 302C is carried out at the second circuit unit 322. In detail, the second circuit unit 322 is connected to the scan lines 302B of the photoelectric conversion panel 302. Via the scan lines 302B, the second circuit unit 322 controls the energizing and non-energizing of the switching elements 302E of the detection elements 302C.

The second radiation detection panel 40 and the third radiation detection panel 50 both have the same structure as that of the first radiation detection panel 30. As shown in FIG. 7 and FIG. 8, the second radiation detection panel 40 has a sensor unit 400 that is the same as the sensor unit 300, a first circuit unit 420 that is the same as the first circuit unit 320, and a second circuit unit 422 that is the same as the second circuit unit 322. The sensor unit 400 has a phosphor layer 404 that is the same as the phosphor layer 304, and a photoelectric conversion panel 402 that is the same as the photoelectric conversion panel 302. As shown in FIG. 7, the third radiation detection panel 50 has a sensor unit 500 that is the same as the sensor unit 300, a first circuit unit 520 that is the same as the first circuit unit 320, and a second circuit unit 522 that is the same as the second circuit unit 322. The sensor unit 500 has a phosphor layer 504 that is the same as the phosphor layer 304, and a photoelectric conversion panel 502 that is the same as the photoelectric conversion panel 302.

3. Circuit Structure of Console

Returning to FIG. 2, the console 80 is structured as a computer, and has a display portion 80A and an operation portion 80C. The display portion 80A is a monitor that displays operation menus of the radiographic imaging device 10, radiological images that have been captured, and the like. The operation portion 80C has plural operation keys, switches and the like, and the input of various types of information and operational instructions can be carried out thereat. The console 80 has a CPU 80E, a ROM 80F, a RAM 80G, a hard disk drive (HDD) 80H, a display driving section 80B, an operational input detection section 80D, and a communication section 82.

(Detailed Structure of Radiographic Imaging Device)

1. Structure of Panel Case

Figure 4:
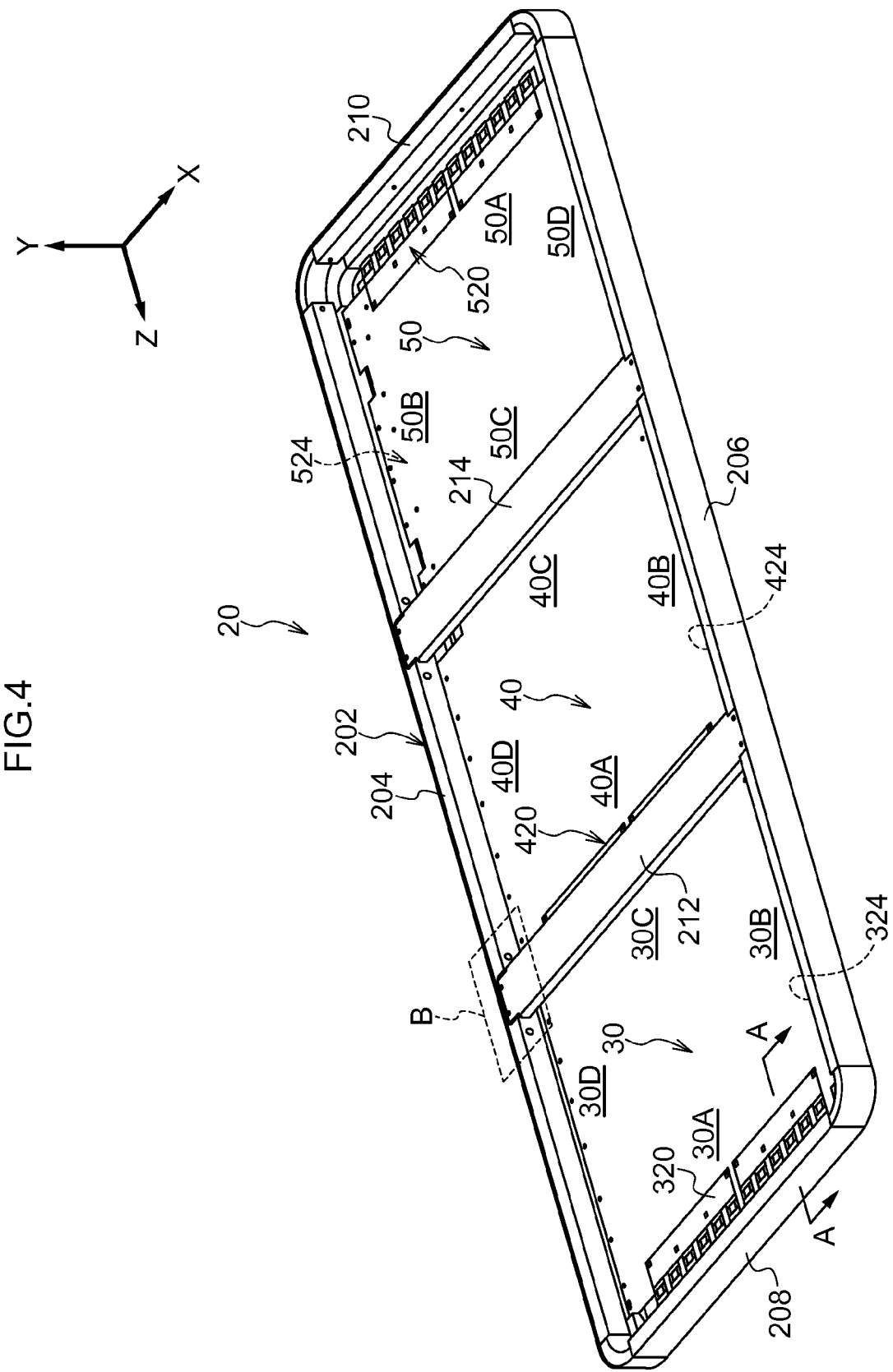
FIG. 4 is a perspective view in which the structures of main portions of the radiographic imaging device shown in FIG. 1 are seen from the side opposite the radiation irradiating section side.
Figure 5:
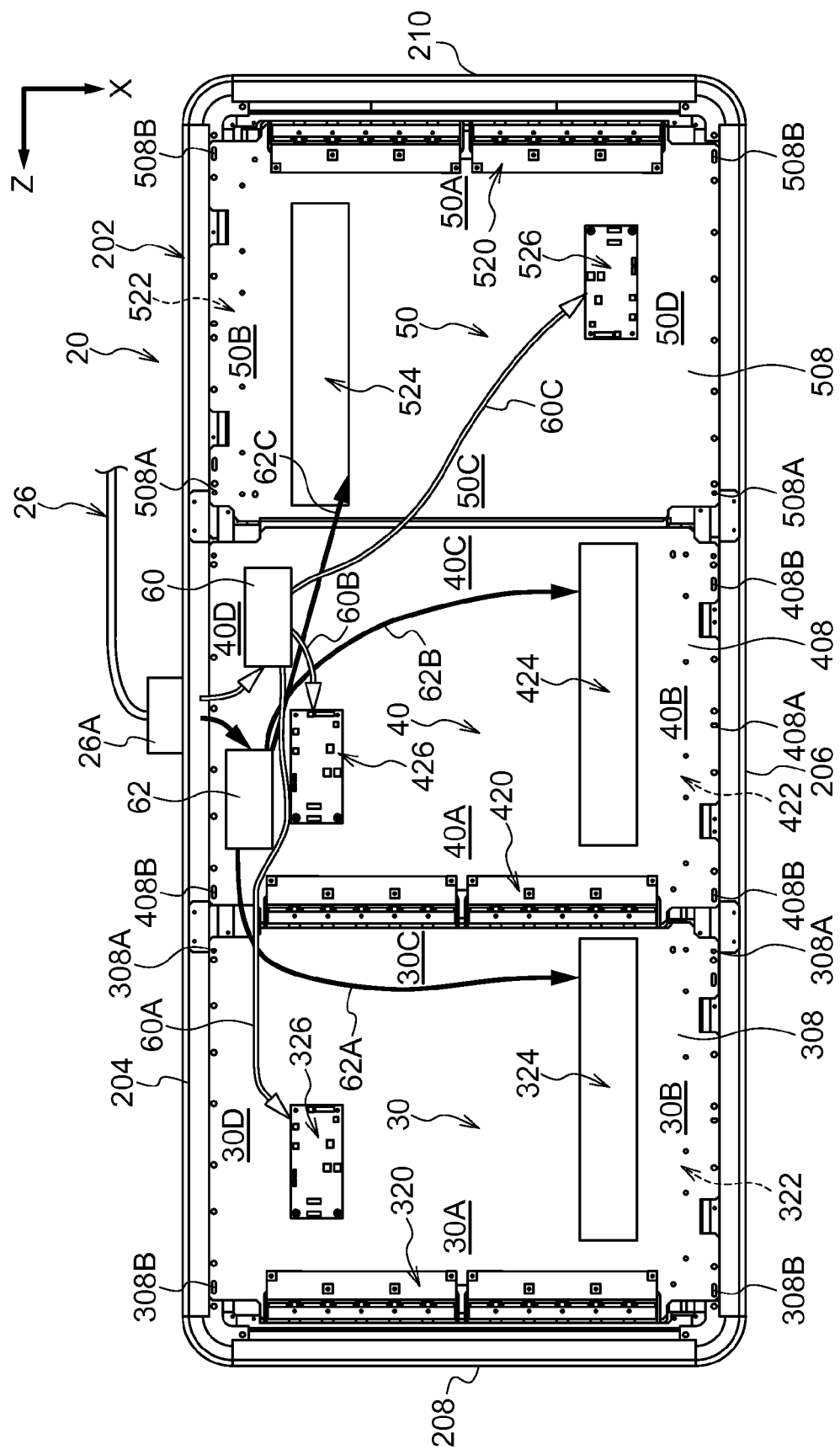
FIG. 5 is a rear view in which the structures of main portions of the radiographic imaging device shown in FIG. 4 are seen from the side opposite the radiation irradiating section side.

As shown in FIG. 4 through FIG. 6, the panel case 20 is structured by the frame main body 202 that is rectangular frame shaped and whose radiation irradiating section 70 side and side opposite the radiation irradiating section 70 side are open. The frame main body 202 is structured by a first frame 204 and a second frame 206 that are a pair, and a third frame 208 and a fourth frame 210 that are a pair, being assembled together. The first frame 204 and the second frame 206 that are a pair are provided parallel to one another with the length directions thereof being the arrow Z direction. The first frame 204 and the second frame 206 are set to lengths that can accommodate the three radiation detection panels that are the first radiation detection panel 30, the second radiation detection panel 40 and the third radiation detection panel 50 that are in a state of being lined-up. The third frame 208 and the fourth frame 210 that are a pair are provided parallel to one another with the length directions thereof being the arrow X direction, and are set to lengths that are shorter than those of the first frame 204 and the second frame 206. The third frame 208 and the fourth frame 210 are set to lengths that can accommodate one radiation detection panel, e.g., the first radiation detection panel 30. The connected region of the first frame 204 and the third frame 208 is a circular arc shape that protrudes toward the outer side. Similarly, the connected region of the third frame 208 and the second frame 206, and the connected region of the second frame 206 and the fourth frame 210, and the connected region of the fourth frame 210 and the first frame 204 are respectively made to be circular arc shapes.

The frame main body 202 is formed from a material that is light-weight and has excellent workability, such as, for example, a light metal material, a light alloy material, or a carbon fiber reinforced plastic. For example, aluminum is suitable for the light metal material. Further, for example, aluminum alloys or magnesium alloys are suitable as light alloy materials.

Note that, although not illustrated, a back surface plate, that is shaped as a rectangular flat plate and that closes the interior, is provided at the reverse surface, that is at the side opposite the radiation irradiating section 70 side, of the panel case 20. The back surface plate is formed of, for example, the same material as the frame main body 202 or a carbon fiber reinforced plastic.

As shown in FIG. 4, a first frame reinforcing member 212 and a second frame reinforcing member 214 that are shaped as elongated plates are provided at the side opposite the radiation irradiating section 70 side, at length direction intermediate portions of the frame main body 202. Further, although not denoted by reference numerals, flanges, that are formed by folding the transverse direction both end portions over toward the radiation irradiating section 70 side, are provided at the first frame reinforcing member 212 and the second frame reinforcing member 214. The rigidities of the first frame reinforcing member 212 and the second frame reinforcing member 214 are increased by the flanges.

One end side of the first frame reinforcing member 212 is connected to the first frame 204, and the other end side is provided along the arrow X direction and is connected to the second frame 206. The first frame reinforcing member 212 is provided at a position that is approximately at one-third of the length of the first frame 204 and the second frame 206, with the position of the third frame 208 being the reference. This position corresponds to the connected region of the first radiation detection panel 30 and the second radiation detection panel 40. The second frame reinforcing member 214 is provided at a position that is approximately at two-thirds of the length of the first frame 204 and the second frame 206, with the position of the third frame 208 being the reference. This position corresponds to the connected region of the second radiation detection panel 40 and the third radiation detection panel 50. The first frame reinforcing member 212 and the second frame reinforcing member 214 cover the connected regions, and are formed of a material having higher mechanical strength than the frame main body 202. Due thereto, the rigidity of the frame main body 202 is increased. The first frame reinforcing member 212 and the second frame reinforcing member 214 are formed of, for example, an inexpensive steel material.

Figure 12:
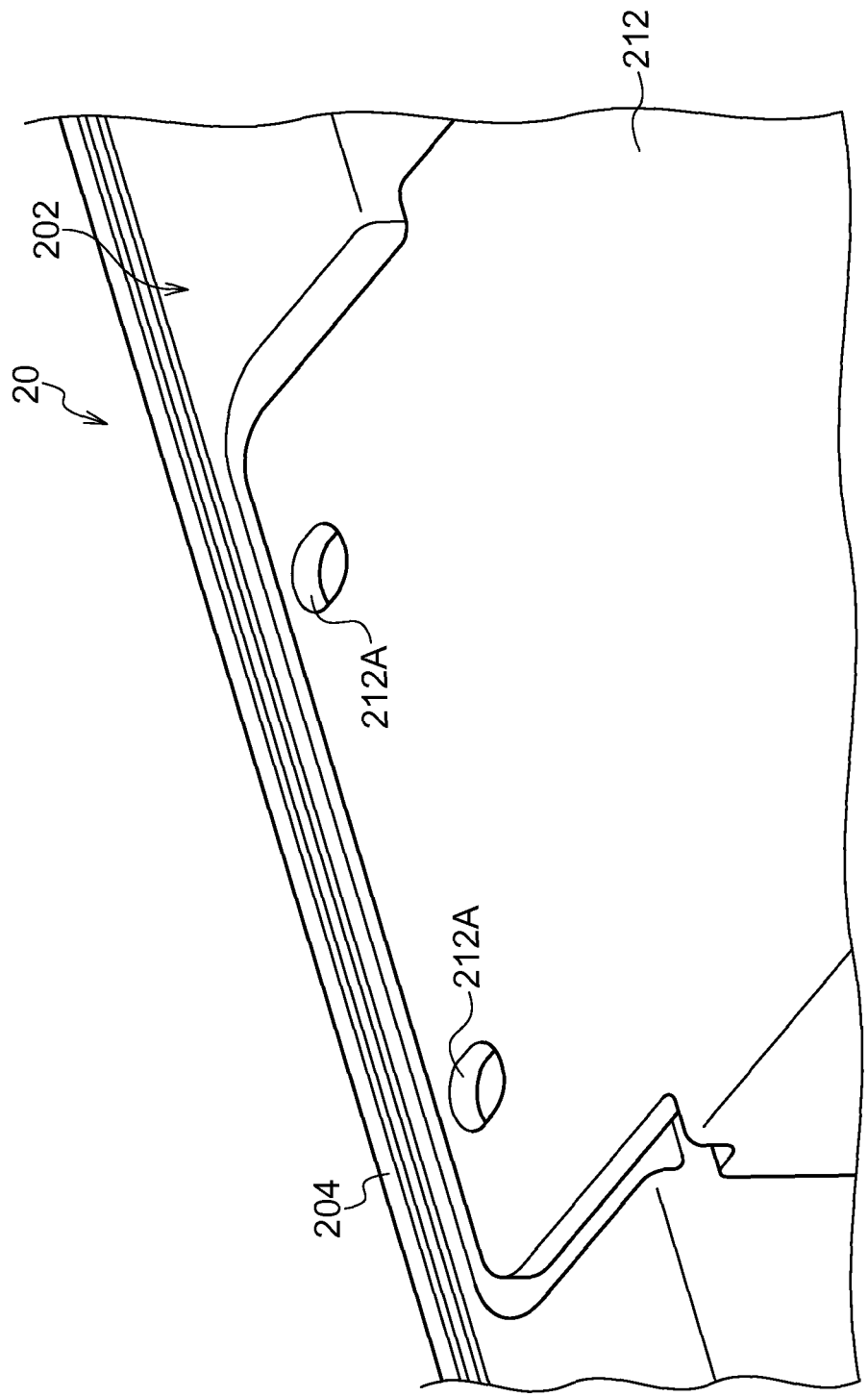
FIG. 12 is a an enlarged perspective view of main portions of a panel case of the radiographic imaging device shown in FIG. 4 (an enlarged perspective view of the place surrounded by the dashed line marked B shown in FIG. 4)

As shown in FIG. 12, mounting long holes 212A, whose long axis directions are the length direction of the first frame reinforcing member 212 and that pass-through the first frame reinforcing member 212, are provided in one end side of the first frame reinforcing member 212. The first frame reinforcing member 212 is fixed to the first frame 204 by fastening members such as unillustrated screws or the like that are passed-through the mounting long holes 212A. Similarly, mounting long holes are provided also at the other end side of the first frame reinforcing member 212, and at the one end side and the other end side of the second frame reinforcing member 214. By using the mounting long holes, the other end side of the first frame reinforcing member 212 is fixed to the second frame 206, the one end side of the second frame reinforcing member 214 is fixed to the first frame 204, and further, the other end of the second frame reinforcing member 214 is fixed to the second frame 206. The mounting long holes are structures that can absorb stress that arises due to the differences in the linear expansion coefficients of the frame main body 202, and the first frame reinforcing member 212 and the second frame reinforcing member 214.

2. Structure of Radiation Detection Panel

The structures of the three radiation detection panels, that are the first radiation detection panel 30, the second radiation detection panel 40 and the third radiation detection panel 50 that are accommodated within the panel case 20, are shown in FIG. 6 through FIG. 11. First, as shown in FIG. 6 through FIG. 8 in particular, the first radiation detection panel 30 is structured such that a chassis 312, a blocking plate 310, a reinforcing member 308, a spacer 306, and the sensor unit 300 are layered successively from the side opposite the radiation irradiating section 70 side toward the radiation irradiating section 70 side. In the present embodiment, at the sensor unit 300, the photoelectric conversion panel 302 is disposed at the radiation irradiating section 70 side, and the phosphor layer 304 is disposed at the side opposite the radiation irradiating section 70 side. Namely, the ISS that, from the radiation irradiating section 70 side of the phosphor layer 304, collects the light that is captured information expressing the radiological image onto the photoelectric conversion panel 302, is used at the sensor unit 300.

Figure 9:
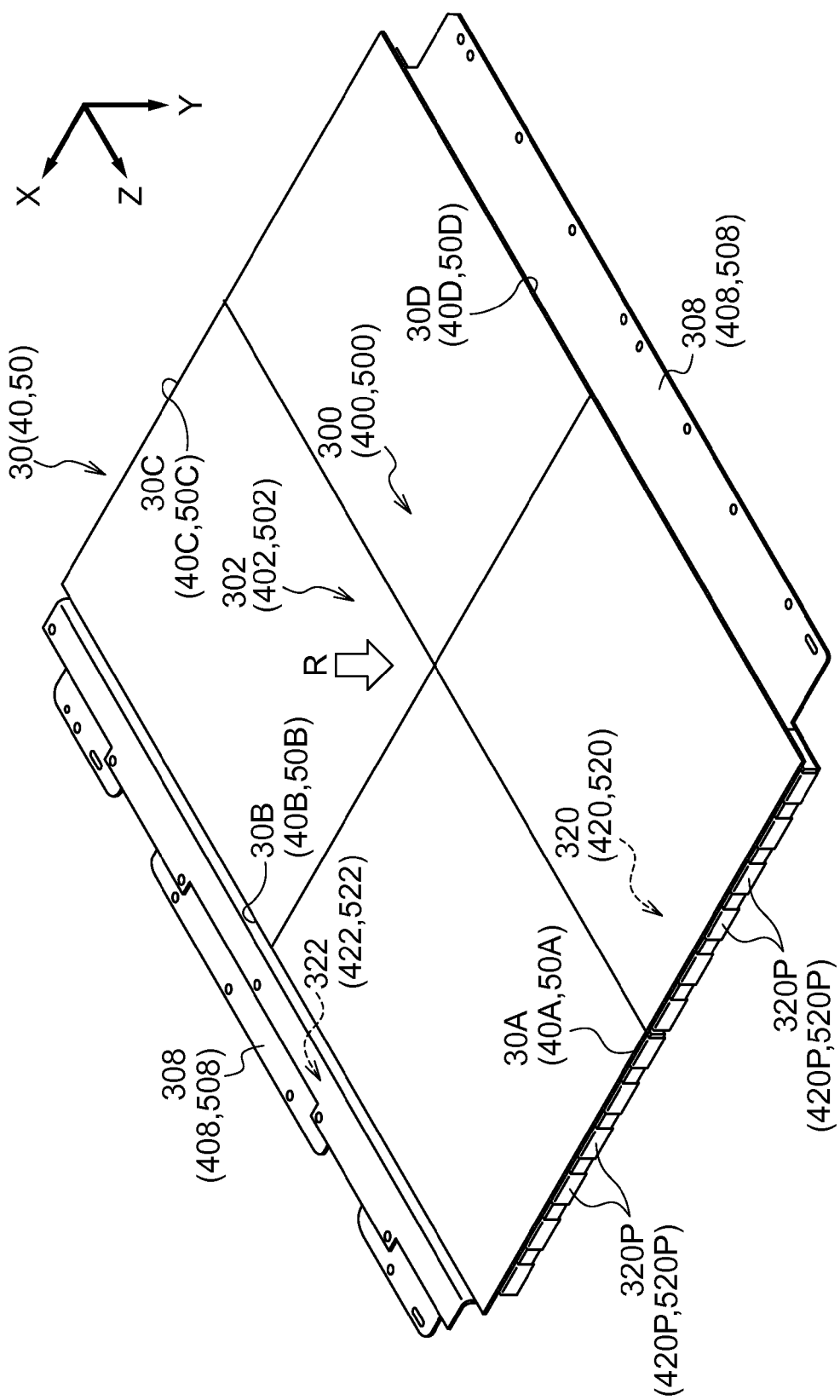
FIG. 9 is a perspective view in which the radiation detection panel shown in FIG. 7 is seen from the radiation irradiating section side.

As shown in FIG. 9, the photoelectric conversion panel 302 of the sensor unit 300 is rectangular flat plate shaped. Here, rectangular is used to mean including at least rectangular and square. As shown in above-described FIG. 2, at the photoelectric conversion panel 302, there is a structure in which the photoelectric conversion elements 302D and the switching elements 302E of the detection elements 302C are disposed at the places where the output lines 302A and the scan lines 302B intersect. The photoelectric conversion panel 302 is formed with, for example, a quartz glass substrate being the base thereof. The phosphor layer 304 is, in the same way as the photoelectric conversion panel 302, rectangular flat plate shaped, and is formed to be a planar size that is slightly smaller than the planar size of the photoelectric conversion panel 302.

Here, at the first radiation detection panel 30 in the present embodiment, as shown in FIG. 4, FIG. 5, and FIG. 9 through FIG. 11, the side positioned at the arrow Z direction upper end of the sensor unit 300 is a first side 30A, and one side that is adjacent to the first side 30A is a second side 30B. At the first radiation detection panel 30, the first circuit unit 320 is disposed along the first side 30A, and the second circuit unit 322 is disposed along the second side 30B (refer to FIG. 2). Further, the side, that faces the first side 30A, of the sensor unit 300 is a third side 30C, and the side, that faces the second side 30B, is a fourth side 30D. The first circuit unit 320 and the second circuit unit 322 are not disposed along the third side 30C and the fourth side 30D.

As shown in FIG. 6, the reinforcing member 308 is provided at the side opposite the radiation irradiating section 70 side of the sensor unit 300, with the spacer 306 interposed therebetween. In detail, the reinforcing member 308 is structured so as to be disposed between the sensor unit 300 and the first circuit unit 320 (and the second circuit unit 322). The reinforcing member 308 is rectangular flat plate shaped, and as shown in FIG. 9 in particular, projects-out further in the arrow X direction than the sensor unit 300. In other words, the reinforcing member 308 projects-out further toward the outer sides than the second side 30B and the fourth side 30D, that faces the second side 30B, of the sensor unit 300. The regions that project-out are used as region that fix the reinforcing member 308 to the frame main body 202. As shown in FIG. 5, at the regions that project-out, positioning holes 308A that are formed by circular through-holes are provided at the central portion sides in the length direction (the arrow Z direction) of the panel case 20. Fixing means such as screws or the like for example are provided at the positioning holes 308A. By the fixing means, positioning of the first radiation detection panel 30 with respect to the frame main body 202 is carried out, and the first radiation detection panel 30 is fixed to the frame main body 202. Further, at the regions that project-out, mounting long holes 308B, that are formed by through-holes whose long axis directions are the length direction of the panel case 20, are provided in the length direction end portion sides of the panel case 20. Fixing means such as screws or the like for example are provided at the mounting long holes 308B. The first radiation detection panel 30 is fixed to the frame main body 202 by the fixing means. The mounting long holes 308B are structured so as to be able to absorb stress that arises due to the difference in the linear expansion coefficients of the frame main body 202 and the first radiation detection panel 30.

As described above, the reinforcing member 308 is used as a mounting member that mounts the first radiation detection panel 30 to the frame main body 202, and has the function of increasing the overall rigidity of the first radiation detection panel 30. The reinforcing member 308 is formed of, for example, a carbon fiber reinforced plastic material that has high rigidity and is very light-weight. The reinforcing member 308 is formed to be thicker than the photoelectric conversion panel 302 and the phosphor layer 304 of the sensor unit 300, and the spacer 306, respectively.

On the other hand, the spacer 306 shown in FIG. 6 is shaped as a rectangular flat plate, except for the regions of connection of the sensor unit 300 and the first circuit unit 320 or the second circuit unit 322 (the regions of connection of the sensor unit 300 and flexible substrates 320P, 322P). The spacer 306 has the function of separating the reinforcing member 308 from the sensor unit 300. The spacer 306 is formed of, for example, a carbon fiber reinforced plastic material. Note that, because rigidity that is similar to that of the reinforcing member 308 is not required of the spacer 306, the spacer 306 may be formed of a material that is thinner than or that is less expensive than the reinforcing member 308.

Figure 10:
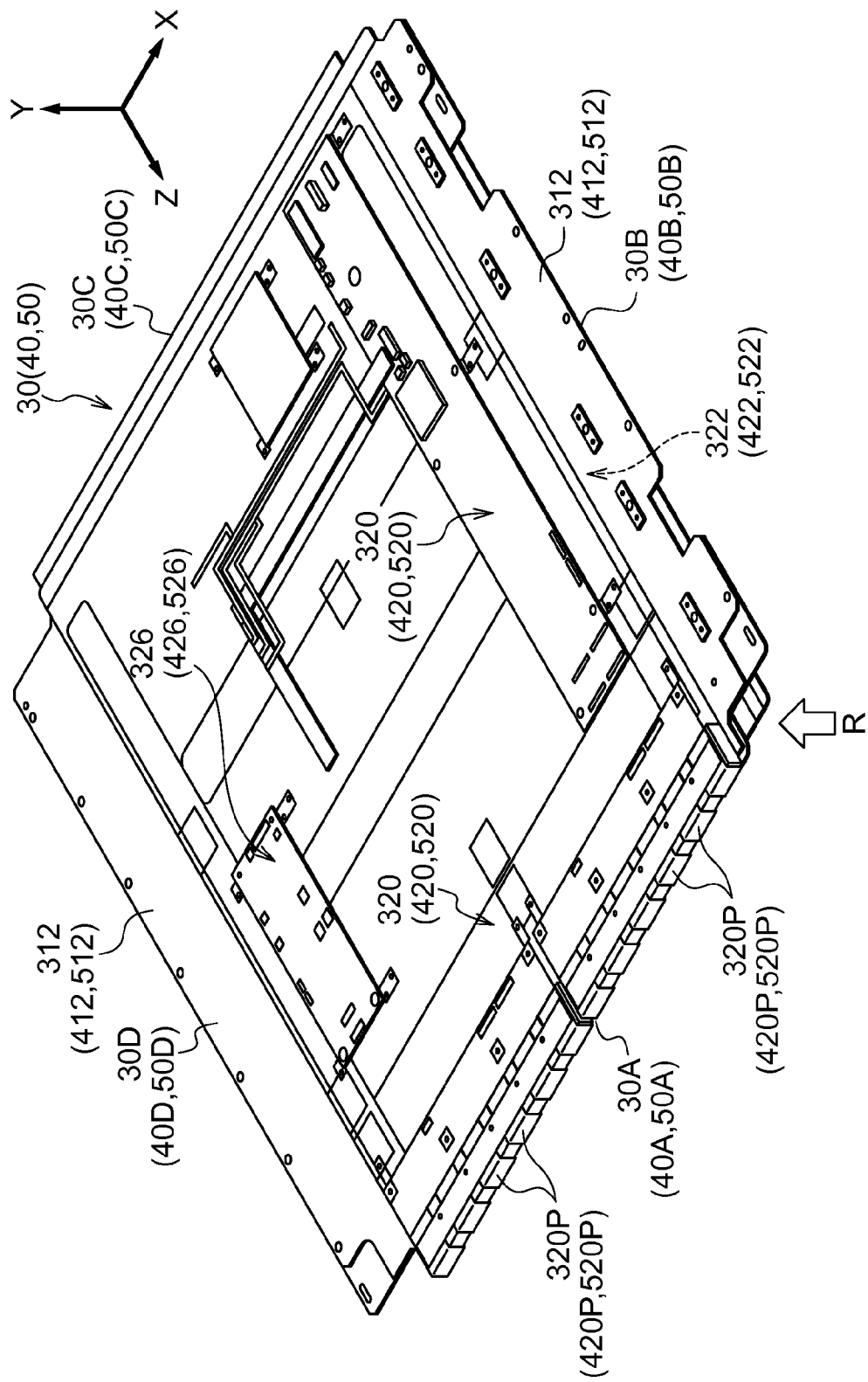
FIG. 10 is a perspective view in which the radiation detection panel shown in FIG. 9 is seen from the side opposite the radiation irradiating section side.
Figure 11:
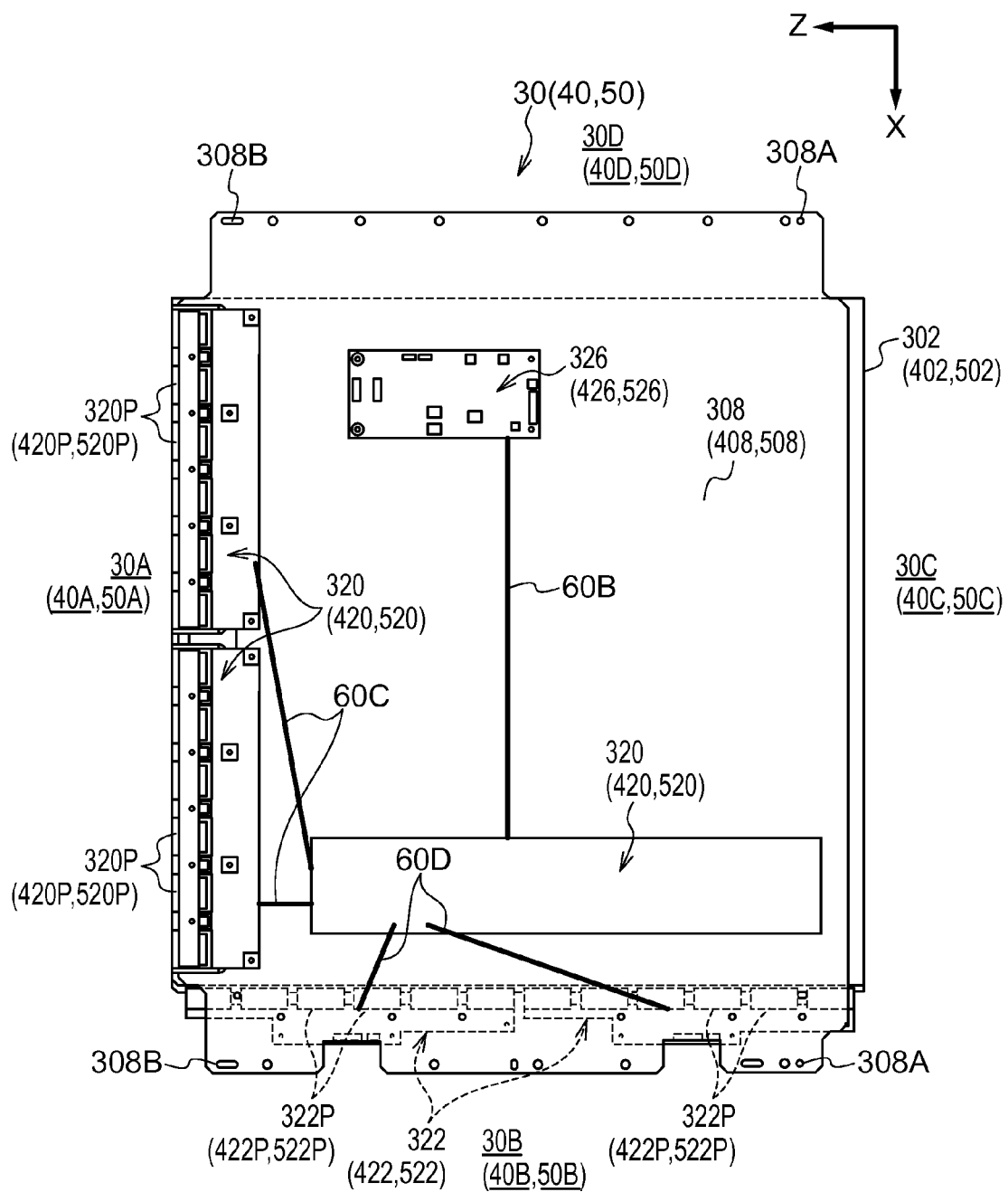
FIG. 11 is a rear view in which the radiation detection panel shown in FIG. 9 is seen from the side opposite the radiation irradiating section side.

As shown in FIG. 6, FIG. 10 and FIG. 11, the chassis 312 is a rectangular flat plate shape that is close to the shape of the reinforcing member 308, and functions as the base substrate of the first radiation detection panel 30. The chassis 312 is formed of, for example, a light metal material such as aluminum or the like, or a light alloy material such as an aluminum alloy or the like. At the first radiation detection panel 30, the reinforcing member 308 is provided between the sensor unit 300 and the chassis 312, and the overall rigidity is increased. Therefore, because there is no need for the chassis 312 to have all of the rigidity, the chassis 312 can be set to be thinner than, for example, the reinforcing member 308. The chassis 312 and the above-described reinforcing member 308 are fixed to the frame main body 202.

As shown in FIG. 6 and FIG. 8, the blocking plate 310 is rectangular flat plate shaped, and is provided between the sensor unit 300 and the first circuit unit 320 and the second circuit 322, and, in detail, is provided between the reinforcing member 308 and the chassis 312. The blocking plate 310 functions to suppress or prevent erroneous operation of the first circuit unit 320 in particular due to scattering of the radiation R that has been transmitted through sensor unit 300. The blocking plate 310 is formed from, for example, a metal material through which it is difficult for the radiation R to be transmitted, and in particular, from a copper material having excellent thermal conductivity.

As shown in FIG. 4 through FIG. 11, the first circuit unit 320 is disposed at the side of the chassis 312 opposite the radiation irradiating section 70 side thereof, along the adjacent first side 30A and second side 30B of the sensor unit 300. Namely, the first circuit unit 320 is disposed so as to overlap the first radiation detection panel 30, at the back surface side of the radiation detection panel 30. In the present embodiment, the circuit section 320A and the signal processing section 320B that are shown in FIG. 2 and FIG. 3 are provided at the region, that runs along the first side 30A, of the first circuit unit 320. Further, the detector control section 320C, the image memory 320D and the communication section 320E that are shown in FIG. 2 are provided at the region, that runs along the second side 30B, of the first circuit unit 320. Although detailed description thereof is omitted, the circuit section 320A and the like are all structured as electronic parts such as ICs (Integrated Circuits), LSI (Large Scale Integration), or the like. These electronic parts are mounted to a circuit board such as a PCB (Printed Circuit Board) or the like, and the circuit board is mounted to the chassis 312.

As shown in FIG. 6 through FIG. 11, the region (here, the circuit section 320A and the signal processing section 320B), that runs along the first side 30A, of the first circuit unit 320 is connected to the photoelectric conversion panel 302 of the sensor unit 300 via the flexible substrates 320P. The flexible substrates 320P are wiring boards at which, for example, copper wires are provided on polyimide resin substrates that are flexible. Moreover, in the present embodiment, COB (Chip On Board) structures are used, and the circuit section 320A is mounted to the length direction intermediate portions of the flexible substrates 320P. As shown in FIG. 6 in particular, one end sides of the flexible substrate 320P are connected, via anisotropic conductive films for example, to the unillustrated output lines 302A of the photoelectric conversion panel 302. The other end sides of the flexible substrates 320P are led along the side surface of the first radiation detection panel 30 and the back surface, that is at the side opposite the radiation irradiating section 70 side, of the chassis 312, and are connected, via anisotropic conductive films for example, to terminals of the first circuit unit 320. Note that the plural flexible substrates 320P are arrayed along the first side 30A. Further, in the present embodiment, the circuit section 320A that is mounted to the flexible substrates 320P is disposed at the side, that is opposite the radiation irradiating section 70 side, of the chassis 312.

As shown in FIG. 11, the second circuit unit 322 is disposed along the second side 30B of the sensor unit 300 at the side, that is opposite the radiation irradiating section 70 side, of the chassis 312. In the same way as the first circuit unit 320, the second circuit unit 322 is disposed so as to overlap the first radiation detection panel 30 at the back surface side of the first radiation detection panel 30. The second circuit unit 322 is structured as an electronic part. The electronic part is mounted to a circuit board, and the circuit board is mounted to the chassis 312.

In the same way as the first circuit unit 320, the second circuit unit 322 is connected to the photoelectric conversion panel 302 of the sensor unit 300 via the flexible substrates 322P. One end sides of the flexible substrates 322P are connected, via anisotropic conductive films for example, to the unillustrated scan lines 302B of the photoelectric conversion panel 302. The other end sides of the flexible substrates 322P are led along the side surface of the first radiation detection panel 30 and the back surface, that is at the side opposite the radiation irradiating section 70 side, of the chassis 312, and are connected, via anisotropic conductive films for example, to terminals of the second circuit unit 322. The plural flexible substrates 322P are arrayed along the second side 30B.

As shown in FIG. 5, FIG. 10 and FIG. 11, the power source circuit unit 326 is disposed along the fourth side 30D of the sensor unit 300 at the side, that is opposite the radiation irradiating section 70 side, of the chassis 312. The power source circuit unit 326 is structure as an electronic part. The electronic part is mounted to a circuit board, and the circuit board is mounted to the chassis 312.

The second radiation detection panel 40 is structured the same as the first radiation detection panel 30. In detail, as shown in FIG. 7 through FIG. 11 in particular, the second radiation detection panel 40 is structured such that a chassis 412, a blocking plate 410, a reinforcing plate 408, a spacer 406, and the sensor unit 400 are layered successively from the side opposite the radiation irradiating section 70 side toward the radiation irradiating section 70 side. The sensor unit 400 is structured from the photoelectric conversion panel 402 and the phosphor layer 404. The structures of the sensor unit 400 and the like correspond to the structures of the sensor unit 300 and the like of the first radiation detection panel 30.

At the second radiation detection panel 40, the first circuit unit 420 is disposed at the chassis 412 along adjacent first side 40A and second side 40B of the sensor unit 400. The first circuit unit 420 and the photoelectric conversion panel 402 are connected via flexible substrates 420P. The second circuit unit 422 is disposed at the chassis 412 along the second side 40B of the sensor unit 400. The second circuit unit 422 and the photoelectric conversion panel 402 are connected via flexible substrates 422P. The first circuit unit 420 and the second circuit unit 422 are not disposed at a third side 40C and a fourth side 40D of the sensor unit 400. Further, a power source circuit unit 426 is mounted to the chassis 412.

The third radiation detection panel 50 is structured the same as the first radiation detection panel 30. In detail, as shown in FIG. 7 and FIG. 9 through FIG. 11 in particular, the third radiation detection panel 50 is structured such that a chassis 512, a blocking plate, a reinforcing plate 508, a spacer, and the sensor unit 500 are layered successively from the side opposite the radiation irradiating section 70 side toward the radiation irradiating section 70 side. The sensor unit 500 is structured from the photoelectric conversion panel 502 and the phosphor layer 504. The structures of the sensor unit 500 and the like correspond to the structures of the sensor unit 300 and the like of the first radiation detection panel 30.

At the third radiation detection panel 50, the first circuit unit 520 is disposed at the chassis 512 along adjacent first side 50A and second side 50B of the sensor unit 500. The first circuit unit 520 and the photoelectric conversion panel 502 are connected via flexible substrates 520P. The second circuit unit 522 is disposed at the chassis 512 along the second side 50B of the sensor unit 500. The second circuit unit 522 and the photoelectric conversion panel 502 are connected via flexible substrates 522P. The first circuit unit 520 and the second circuit unit 522 are not disposed at a third side 50C and a fourth side 50D of the sensor unit 500. Further, a power source circuit unit 526 is mounted to the chassis 512.

3. Method of Connecting Radiation Detection Panels

As shown in FIG. 4, FIG. 5, FIG. 7, FIG. 8 and FIG. 13A, the three radiation detection panels, that are the first radiation detection panel 30, the second radiation detection panel 40 and the third radiation detection panel 50 that have the same structures, are accommodated at the interior of the panel case 20 by using the following connecting method. In detail, the first radiation detection panel 30 and the third radiation detection panel 50 are disposed such that the third side 30C of the sensor unit 300, at which the first circuit unit 320 and the second circuit unit 322 are not disposed, and the third side 50C of the sensor unit 500, at which the first circuit unit 520 and the second circuit unit 522 are not disposed, face one another and are apart from one another. Namely, the third radiation detection panel 50 is disposed, with respect to the first radiation detection panel 30, in an orientation of having been rotated by 180° around an axis of rotation that is orthogonal to the sensor unit 500.

Further, the second radiation detection panel 40 is disposed between the first radiation detection panel 30 and the third radiation detection panel 50 so as to be set apart, slightly and in the thickness direction that is the arrow Y direction, at the side opposite the radiation irradiating section 70 side of the first radiation detection panel 30 and the third radiation detection panel 50. In a case in which the minimum separated distance between the sensor unit 300 and the sensor unit 500 and the sensor unit 400 is 2 mm for example, this set-apart amount is preferably set to be greater than or equal to this minimum value of 2 mm and less than or equal to 5.6 mm. In detail, the breakdown of this set-apart amount of 5.6 mm is calculated as, in addition to the aforementioned 2 mm, the thickness of the spacer 306 being 0.2 mm to 0.3 mm, and the thickness of the reinforcing member 308 being 1.4 mm to 1.5 mm, and the clearance being 1.2 mm to 1.3 mm. The clearance is set in consideration of bending of the first radiation detection panel 30, the second radiation detection panel 40 and the third radiation detection panel 50 that is due to impacts that arise during the setting of, the transporting of, and the like of the radiographic imaging device 10, and load or the like that has arisen at the top plate 24. Note that these numerical values can be changed appropriately by changing the materials of the spacer 306, the reinforcing member 308 and the like, or the like.

Figure 13A:
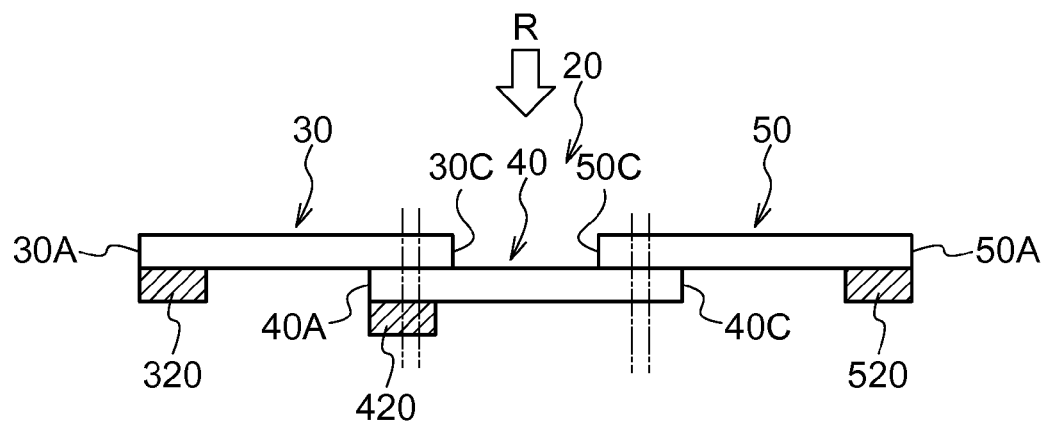
FIG. 13A is a schematic side view that explains a connected state of the radiation detection panels of the radiographic imaging device relating to the first embodiment.

As shown in FIG. 7, FIG. 8 and FIG. 13A in particular, at the second radiation detection panel 40, a portion of the first side 40A of the sensor unit 400 and a portion of the third side 30C of the sensor unit 300 of the first radiation detection panel 30 are overlapped. Here, the overlapping of portions is used to mean causing a portion of an effective imaging region AR1 of the sensor unit 300 at which radiological image capturing is possible, and a portion of an effective imaging region AR2 of the sensor unit 400 at which radiological image capturing similarly is possible, to overlap. In the present embodiment, this includes a case in which the end-most portion of the effective imaging region AR1 (the final end positions of the detection elements 302C that are positioned at the end-most portion) and the end-most portion of the effective imaging region AR2 (the final end positions of the detection elements 302C that are similarly positioned at the end-most portion) coincide. In practice, an overlap of, for example, 5 mm to 30 mm is needed in order to correct for the step caused by the overlapping of the first radiation detection panel 30 and the second radiation detection panel 40, and an overlap of, for example, 1 mm to 8 mm is needed in order to correct for oblique incidence of the radiation R. Accordingly, an overlap that is a total of 6 mm to 38 mm is needed. The radiographic imaging device 10 relating to the present embodiment is structured such that an overlap of 40 mm is possible.

Further, as shown in FIG. 7 and FIG. 13A in particular, at the second radiation detection panel 40, a portion of the third side 40C of the sensor unit 400 and a portion of the third side 50C of the sensor unit 500 of the third radiation detection panel 50 are overlapped. The meaning of overlapping and the practical overlapping amount are the same as the meaning of overlapping and the practical overlapping amount of the above-described effective imaging region AR1 and effective imaging region AR2. Accordingly, the second radiation detection panel 40 is disposed in the same orientation as the first radiation detection panel 30.

In a case in which the radiation detection panels are disposed so as to be connected in this way, as shown in FIG. 7, FIG. 8 and FIG. 13A, a portion of the third side 30C of the sensor unit 300 of the first radiation detection panel 30 and a portion of the first side 40A of the sensor unit 400 of the second radiation detection panel 40 are superposed directly without the first circuit unit 320 and the first circuit unit 420 being interposed therebetween. Similarly, as shown in FIG. 7 and FIG. 13A, a portion of the third side 40C of the sensor unit 400 of the second radiation detection panel 40 and a portion of the third side 50C of the sensor unit 500 of the third radiation detection panel 50 are superposed directly without the first circuit unit 420 and the first circuit unit 520 being interposed therebetween.

Figure 13B:
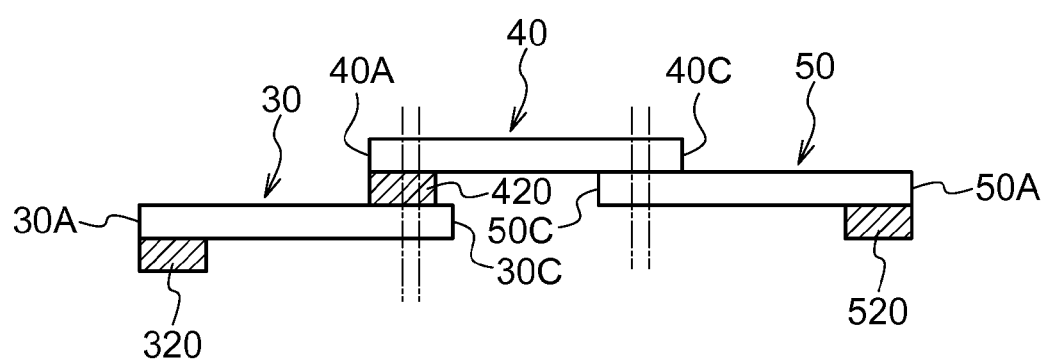
FIG. 13B is a schematic side view of the radiation detection panels in Comparative Example 1 corresponding to FIG. 13A.

The connected state of radiation detection panels relating to Comparative Example 1 is shown in FIG. 13B. In Comparative Example 1, the order of the arraying of the first radiation detection panel 30 and the like that are shown in FIG. 13A is the same, but the second radiation detection panel 40 is disposed at the radiation irradiating section 70 side of the first radiation detection panel 30 and the third radiation detection panel 50. Therefore, a portion of the third side 30C of the first radiation detection panel 30 and a portion of the first side 40A of the second radiation detection panel 40 are superposed with the first circuit unit 420 being interposed therebetween.

Figure 13C:
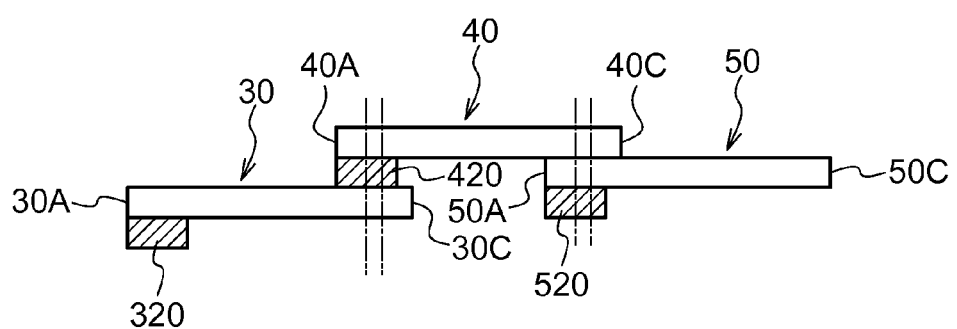
FIG. 13C is a schematic side view of the radiation detection panels in Comparative Example 2 corresponding to FIG. 13A.

Further, the connected state of radiation detection panels relating to Comparative Example 2 is shown in FIG. 13C. In Comparative Example 1, the order of the arraying of the first radiation detection panel 30 and the like that are shown in FIG. 13A is the same. However, in Comparative Example 2, the second radiation detection panel 40 is disposed at the radiation irradiating section 70 side of the first radiation detection panel 30 and the third radiation detection panel 50, and the third radiation detection panel 50 is disposed so as to be oriented in the same direction as the first radiation detection panel 30 and the second radiation detection panel 40. In Comparative Example 2 as well, in the same way as in Comparative Example 1, a portion of the third side 30C of the first radiation detection panel 30 and a portion of the first side 40A of the second radiation detection panel 40 are superposed with the first circuit unit 420 being interposed therebetween.

Figure 13D:
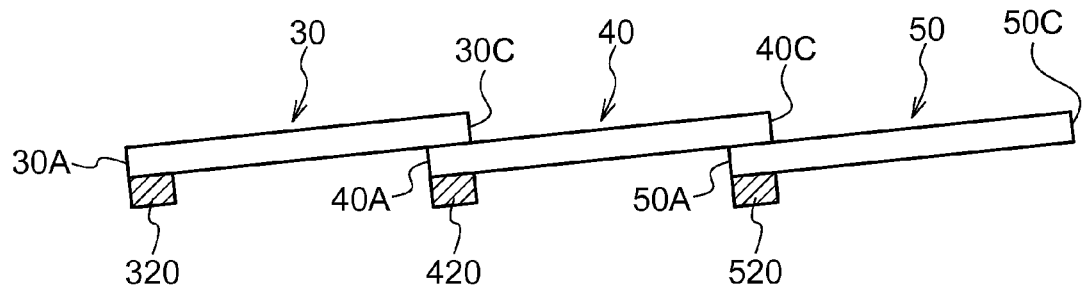
FIG. 13D is a schematic side view, corresponding to FIG. 13A, of the radiation detection panels relating to a first modified example of the first embodiment.

Here, the connected state of the radiographic imaging device 10 relating to Modified Example 1 is shown in FIG. 13D. In the radiographic imaging device 10 relating to Modified Example 1, the first radiation detection panel 30, the second radiation detection panel 40 and the third radiation detection panel 50 are all disposed so as to be oriented in the same direction. Further, the second radiation detection panel 40 is disposed at the side opposite the radiation irradiating section 70 side of the first radiation detection panel 30, and the third radiation detection panel 50 is disposed at the side opposite the radiation irradiating section 70 side of the second radiation detection panel 40.

In detail, a portion of the third side 30C of the first radiation detection panel 30 and a portion of the first side 40A of the second radiation detection panel 40 overlap. Further, a portion of the third side 40C of the second radiation detection panel 40 and a portion of the first side 50A of the third radiation detection panel 50 overlap. In the radiographic imaging device 10 relating to Modified Example 1, the first radiation detection panel 30 and the second radiation detection panel 40 are superposed without the first circuit unit 420 being interposed therebetween, and the second radiation detection panel 40 and the third radiation detection panel 50 are superposed without the first circuit unit 520 being interposed therebetween.

4. Wiring Layout of Panel Case Interior

As shown in a simplified manner in FIG. 5, a power relay section 60 and a signal relay section 62 are provided within the panel case 20 in a vicinity of the connector 26A of the external connection cable 26 that is connected to the side surface of the length direction central portion of the panel case 20. The electric power, that is supplied to the panel case 20 from an unillustrated power line of the external connection cable 26, is supplied once to the power relay section 60. Electric power is distributed from the power relay section 60 to the power source circuit unit 326 through a power line 60A that is led from the power relay section 60 to the power source circuit unit 326 of the first radiation detection panel 30. Similarly, electric power is distributed from the power relay section 60 to the power source circuit unit 426 through a power line 60B that is led from the power relay section 60 to the power source circuit unit 426 of the second radiation detection panel 40. Electric power is distributed from the power relay section 60 to the power source circuit unit 526 through a power line 60C that is led from the power relay section 60 to the power source circuit unit 526.

On the other hand, an unillustrated signal line of the external connection cable 26 is connected once to the signal relay section 62. The signal relay section 62 and the first circuit unit 320 of the first radiation detection panel 30 are connected through a signal line 62A, and signals are transferred between the both. Similarly, the signal relay section 62 and the first circuit unit 420 of the second radiation detection panel 40 are connected through a signal line 62B, and signals are transferred between the both. The signal relay section 62 and the first circuit unit 520 of the third radiation detection panel 50 are connected through a signal line 62C, and signals are transferred between the both.

(Operation and Effects of First Embodiment)

As described above, the radiographic imaging device 10 relating to the present embodiment has the three radiation detection panels that are the first radiation detection panel 30, the second radiation detection panel 40 and the third radiation detection panel 50, as shown in FIG. 4, FIG. 5, FIG. 7, FIG. 8 and FIG. 13A. The sensor units 300, 400, 500 and the first circuit units 320, 420, 520 are provided at the first radiation detection panel 30, the second radiation detection panel 40 and the third radiation detection panel 50, respectively. The sensor units 300, 400, 500 are disposed at the radiation irradiating section 70 side, and detect the radiation R. The sensor units 300, 400, 500 are formed in rectangular flat plate shapes. The first circuit units 320, 420, 520 are disposed along the first sides 30A, 40A, 50A and the second sides 30B, 40B, 50B, that are adjacent to one another, of the sensor units 300, 400, 500. The first circuit units 320, 420, 520 are not disposed along the third sides 30C, 40C, 50C and the fourth sides 30D, 40D, 50D of the sensor units 300, 400, 500.

Here, the first radiation detection panel 30 and the third radiation detection panel 50 are disposed such that the third sides 30C, 50C of the sensor units thereof, at which the first circuit units 320, 520 are not disposed, face one another. Further, at the second radiation detection panel 40, a portion of the effective imaging region AR2 at the first side 40A of the sensor unit 400 of the second radiation detection panel 40 is disposed so as to overlap, in the radiation irradiating direction, with a portion of the effective imaging region AR1 at the third side 30C of the sensor unit 300 of the first radiation detection panel 30. Moreover, at the second radiation detection panel 40, a portion of the effective imaging region AR2 at the third side 40C of the sensor unit 400 of the second radiation detection panel 40 is disposed so as to overlap, in the radiation irradiating direction, a portion of the effective imaging region at the third side 50C of the sensor unit 500 of the third radiation detection panel 50. Further, the second radiation detection panel 40 is disposed at the side opposite the radiation irradiating section 70 side of the first radiation detection panel 30 and the third radiation detection panel 50. Therefore, a portion of the effective imaging region AR2 of the sensor unit 400 of the second radiation detection panel 40 overlaps a portion of the effective imaging region AR1 of the sensor unit 300 of the first radiation detection panel 30, and the first circuit units 320, 420 are not interposed at this place of overlapping. Similarly, a portion of the effective imaging region AR2 of the sensor unit 400 of the second radiation detection panel 40 overlaps a portion of the effective imaging region of the sensor unit 500 of the third radiation detection panel 50, and the first circuit units 420, 520 are not interposed at this place of overlapping. Accordingly, the three radiation detection panels that are the first radiation detection panel 30, the second radiation detection panel 40 and the third radiation detection panel 50 are connected in one direction (e.g., the arrow Z direction in FIG. 7), and the radiation R is not blocked by the first circuit units 320, 420, 520 at the places of connection.

In accordance with the radiographic imaging device 10 relating to the foregoing present embodiment, long-length image capturing of a radiological image is made possible by connecting the three radiation detection panels that are the first radiation detection panel 30, the second radiation detection panel 40 and the third radiation detection panel 50, and the image quality of the radiological image at the places of connection can be improved.

Further, in the radiographic imaging device 10 relating to the present embodiment, as shown in FIG. 6 through FIG. 11 in particular, the sensor units 300, 400, 500 and the first circuit units 320, 420, 520 are connected via the flexible substrates 320P, 420P, 520P. Therefore, the degrees of freedom in the arrangement layout of the first circuit units 320, 420, 520 or portions of the first circuit units 320, 420, 520 (e.g., the circuit section 320A) can be improved. For example, the first circuit units 320, 420, 520 can be disposed at places that are not affected by the radiation R. In addition, in the radiographic imaging device 10 relating to the present embodiment, the sensor units 300, 400, 500 and the second circuit units 322, 422, 522 are connected via the flexible substrates 322P, 422P, 522P, and therefore, similar operation and effects are obtained.

Moreover, in the radiographic imaging device 10 relating to the present embodiment, as shown in FIG. 7, FIG. 8, FIG. 10, FIG. 11 and FIG. 13A in particular, the first circuit units 320, 420, 520 are disposed at the side opposite the radiation irradiating section 70 side of the first radiation detection panel 30, the second radiation detection panel 40 or the third radiation detection panel 50. Therefore, at the effective imaging region AR1 and the like, the radiation R is not blocked by the first circuit units 320, 420, 520. Further, due to the first circuit units 320, 420, 520 being disposed at the side opposite the radiation irradiating section 70 side, the surface area, in the imaging plane direction, that is occupied by the first circuit unit 320, 420, 520 is superposed with the surface area that is occupied by the first radiation detection panel 30 or the like, and compactness of the radiation image capturing device 10 in the imaging plane direction can be realized. In addition, in the radiographic imaging device 10 relating to the present embodiment, because the second circuit units 322, 422, 522 are disposed at the side opposite the radiation irradiating section 70 side of the first radiation detection panel 30, the second radiation detection panel 40 or the third radiation detection panel 50, operation and effects that are similar are obtained.

Further, in the radiographic imaging device 10 relating to the present embodiment, as shown in FIG. 6 and FIG. 8, the blocking plates 310, 410 are provided between the sensor units 300, 400 and the first circuit units 320, 420. Although not illustrated, a blocking plate is similarly provided also between the sensor unit 500 and the first circuit unit 520. Therefore, the radiation R that is irradiated toward the first circuit units 320, 420, 520 is blocked by the blocking plates 310, 410 and the like. In particular, scattered radiation of the radiation that is incident from the side opposite the radiation irradiating section 70 side can be blocked at the blocking plates 310, 410 and the like. Therefore, erroneous operation, that is due to the irradiating of radiation, of the first circuit units 320, 420, 520 can be effectively suppressed or prevented. In addition, in the radiographic imaging device 10 relating to the present embodiment, because the blocking plates 310, 410 and the like are provided between the sensor units 300, 400, 500 and the second circuit units 322, 422, 522, operation and effects that are similar are obtained.

Moreover, in the radiographic imaging device 10 relating to the present embodiment, the above-described blocking plates 310, 410 and the like are structured of a metal material. Because metal materials have excellent thermal conductivity, the ability to dissipate the heat that is generated by circuit operation of the first circuit units 320, 420, 520 and the second circuit units 322, 422, 522 can be improved.

Further, at the radiographic imaging device 10 relating to the present embodiment, as shown in FIG. 1, FIG. 4 and FIG. 5, the first radiation detection panel 30, the second radiation detection panel 40 and the third radiation detection panel 50 are accommodated within the single panel case 20. Therefore, shared regions are optimized as compared with a case in which the radiation detection panels are accommodated individually in panel cases. For example, partitioning regions between the radiation detection panels are omitted. Therefore, compactness of the radiographic imaging device 10 can be realized.

In addition, at the radiographic imaging device 10 relating to the present embodiment, there is a structure in which the three radiation detection panels that are the first radiation detection panel 30, the second radiation detection panel 40 and the third radiation detection panel 50 are accommodated in the panel case 20, and are covered by the top plate 24 that is rectangular flat plate shaped. Therefore, the surface of the top plate 24 is flattened. For example, an uncomfortable sensation at the time in a case in which the subject H touches the top plate 24 is eliminated.

Moreover, in the radiographic imaging device 10 relating to the present embodiment, the three radiation detection panels that are the first radiation detection panel 30, the second radiation detection panel 40 and the third radiation detection panel 50 have the same structure. For example, even if trouble arises at one of the radiation detection panels, the radiation detection panel at which trouble has arisen can be easily replaced. Therefore, the entire radiographic imaging device 10 is not repaired, and only a portion thereof is repaired, and therefore, repair costs and maintenance costs can be reduced.

Further, in the radiographic imaging device 10 relating to the present embodiment, as shown in FIG. 6 and FIG. 8 through FIG. 11, the reinforcing members 308, 408, 508 are provided between the sensor units 300, 400, 500 and the first circuit units 320, 420, 520. Therefore, the sensor units 300, 400, 500 are reinforced. In addition, as shown in FIG. 9 and FIG. 10, the regions, that are fixed to the frame main body 202 of the panel case 20, are provided at the reinforcing members 308, 408, 508. Therefore, the workability of mounting the sensor units 300, 400, 500 and the first circuit units 320, 420, 520 to the panel case 20 can be improved. Note that, because the reinforcing members 308, 408, 508 are also provided between the sensor units 300, 400, 500 and the second circuit units 322, 422, 522, operation and effects that are similar are obtained.

Moreover, at the radiographic imaging device 10 relating to the present embodiment, the sensor unit 300 is provided with the phosphor layer 304 and the photoelectric conversion panel 302. The same holds for the sensor units 400, 500 as well. Because the phosphor layer 304 and the photoelectric conversion panel 302 are layered on the reinforcing member 308, the phosphor layer 304 and the photoelectric conversion panel 302 are reinforced by the reinforcing member 308. Therefore, for example, in the work of assembling the radiographic imaging device 10, the phosphor layer 304 and the photoelectric conversion panel 302 can be handled without damage such as breakage or the like arising, and therefore, the handling ability can be improved. In addition, because the radiographic imaging device 10 has the reinforcing member 308, the rigidity of the panel case 20 also can be improved.

Further, in the radiographic imaging device 10 relating to the present embodiment, the reinforcing members 308, 408, 508 are formed of a material that is light-weight and is high-strength, such as a carbon fiber reinforced plastic or the like for example. Therefore, the handling ability can be improved even more.

Moreover, in the radiographic imaging device 10 relating to the present embodiment, as shown in FIG. 6 through FIG. 8, the ISS, in which the photoelectric conversion panel 302 is disposed at the radiation irradiating section 70 side and the phosphor layer 304 is disposed at the side opposite the radiation irradiating section 70 side and light is collected from the radiation irradiating section 70 side of the phosphor layer 304, is used at the sensor unit 300. A similar ISS is used at the sensor units 400, 500 as well. Therefore, the distance until the light, that has been converted from the radiation R, reaches the photoelectric conversion elements 302D (see FIG. 2) can be shortened. Therefore, the photoelectric conversion efficiency is improved, and the image quality of the radiological image can be improved.

Further, in the radiographic imaging device 10 relating to the present embodiment, as shown in FIG. 1 and FIG. 5, the connector 26A of the external connection cable 26 can be connected to the side surface of the panel case 20 at an intermediate region in the direction of arraying of the first radiation detection panel 30 and the like. Therefore, the signal transfer path lengths (the signal lines 62A through 62C) and the power supply path lengths (the power lines 60A through 60C) from the external connection cable 26 to the first radiation detection panel 30, the second radiation detection panel 40 and the third radiation detection panel 50 are made uniform, and the transfer path lengths and the supply path lengths are short. Accordingly, effects of noise at the transfer paths of the signals and the supply paths of electric power can be reduced.

Note that, in the radiographic imaging device 10 relating to the above-described embodiment, the first radiation detection panel 30, the second radiation detection panel 40, and the third radiation detection panel 50 are successively connected from the upper side toward the lower side in the arrow Z direction that is shown in FIG. 7 for example. In the present embodiment, this order of connection may be reversed. In detail, at the radiographic imaging device 10, the first radiation detection panel 30, the second radiation detection panel 40 and the third radiation detection panel 50 may be connected successively from the lower side toward the upper side in the arrow Z direction.

Further, in the radiographic imaging device 10 relating to the present embodiment, referring to FIG. 4, FIG. 5 and FIG. 7 for example, the fourth side 30D of the sensor unit 300 of the first radiation detection panel 30 and the fourth side 50D of the sensor unit 500 of the third radiation detection panel 50 may be disposed so as to face one another and be apart from one another. The first circuit unit 320 and the second circuit unit 322 are not disposed along the fourth side 30D. Similarly, the first circuit unit 520 and the second circuit unit 522 are not disposed along the fourth side 50D. A portion of the second side 40B of the sensor unit 400 of the second radiation detection panel 40 is overlapped with a portion of the fourth side 30D of the sensor unit 300 of the first radiation detection panel 30, and the second radiation detection panel 40 is disposed at the side opposite the radiation irradiating section 70 side of the first radiation detection panel 30. A portion of the fourth side 40D of the sensor unit 400 of the second radiation detection panel 40 is overlapped with a portion of the fourth side 50D of the sensor unit 500 of the third radiation detection panel 50, and the second radiation detection panel 40 is disposed at the side opposite the radiation irradiating section 70 side of the third radiation detection panel 50. Due thereto, the first radiation detection panel 30 and the second radiation detection panel 40 are superposed directly without the second circuit unit 322 and the second circuit unit 422 being interposed therebetween. Similarly, the second radiation detection panel 40 and the third radiation detection panel 50 are superposed without the second circuit unit 422 and the second circuit unit 522 being interposed therebetween.

MODIFIED EXAMPLE 2

Modified Example 2 through Modified Example 5 describe examples in which, in the radiographic imaging device 10 relating to the first embodiment, the arranged position of the first circuit unit 320 or of the circuit section 320A, that is a portion thereof, is changed. Note that, although the first radiation detection panel 30 is described in Modified Example 2 through Modified Example 5, the second radiation detection panel 40 and the third radiation detection panel 50 have the same structure as the first radiation detection panel 30, and therefore, description thereof is omitted here. Further, Modified Example 2 through Modified Example 5 are not limited to the first circuit unit 320, and may be applied to the second circuit unit 322.

Figure 15:
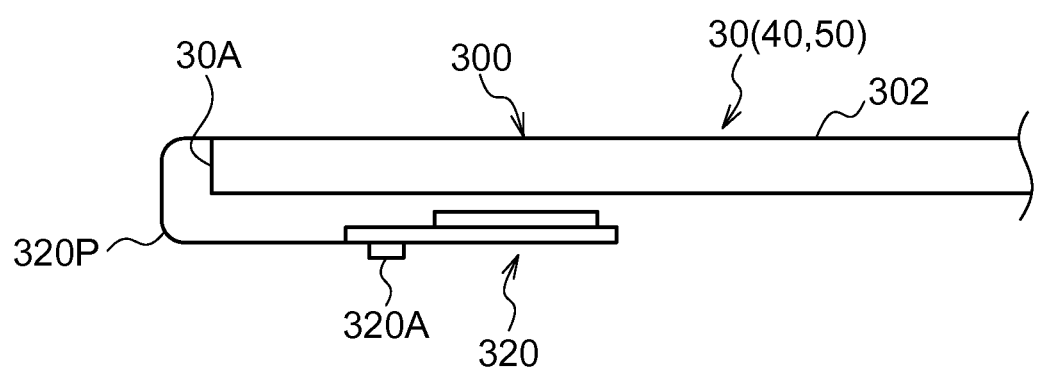
FIG. 15 is a schematic enlarged side view of the radiation detection panel shown in FIG. 14.

In the radiographic imaging device 10 relating to Modified Example 2 that is shown in FIG. 14 and FIG. 15, the circuit section 320A, that is a portion of the first circuit unit 320 of the first radiation detection panel 30, is mounted to the circuit board at which the detector control section 320C and the like (see FIG. 2) are mounted. Namely, the circuit section 320A is not mounted to the flexible substrates 320P.

In accordance with the radiographic imaging device 10 relating to Modified Example 2, operation and effects that are similar to the operation and effects obtained by the radiographic imaging device 10 relating to the above-described first embodiment are obtained.

MODIFIED EXAMPLE 3

Figure 16:
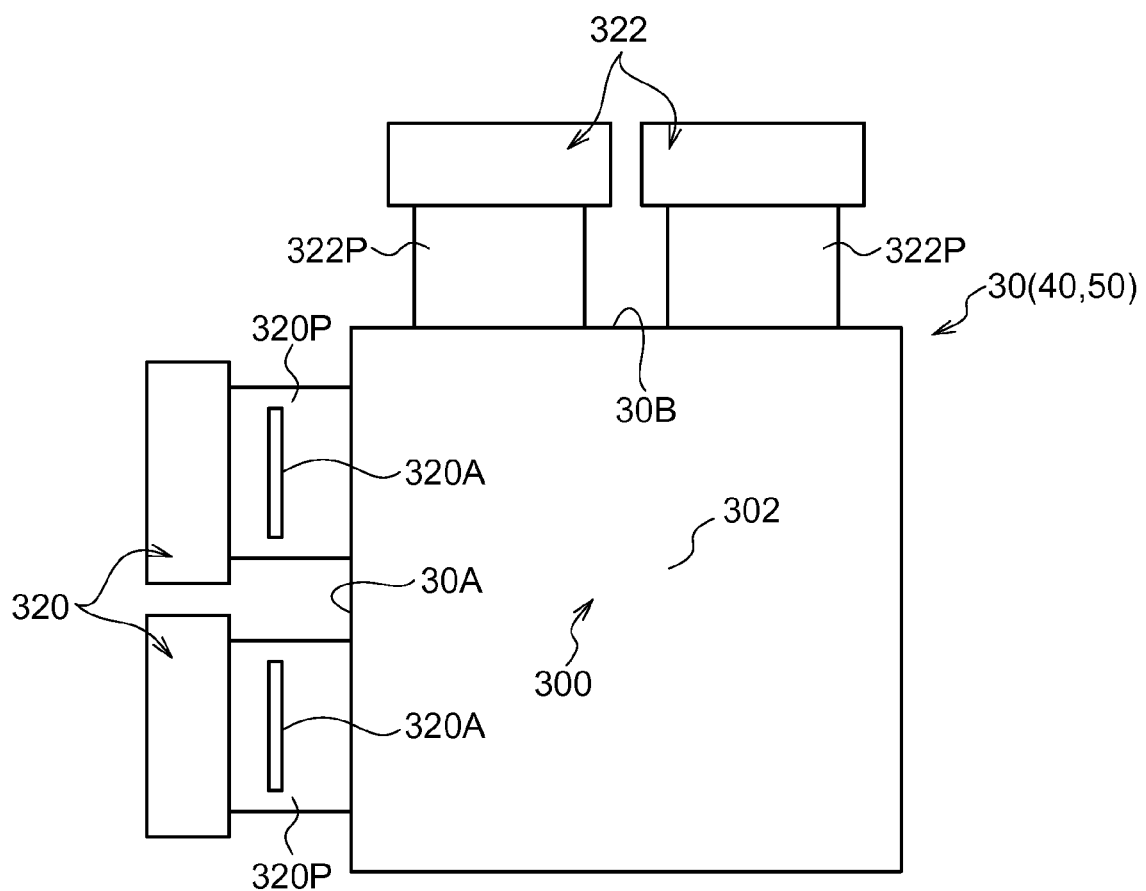
FIG. 16 is a schematic plan view of the radiation detection panel of the radiographic imaging device relating to a third modified example of the first embodiment.
Figure 17:
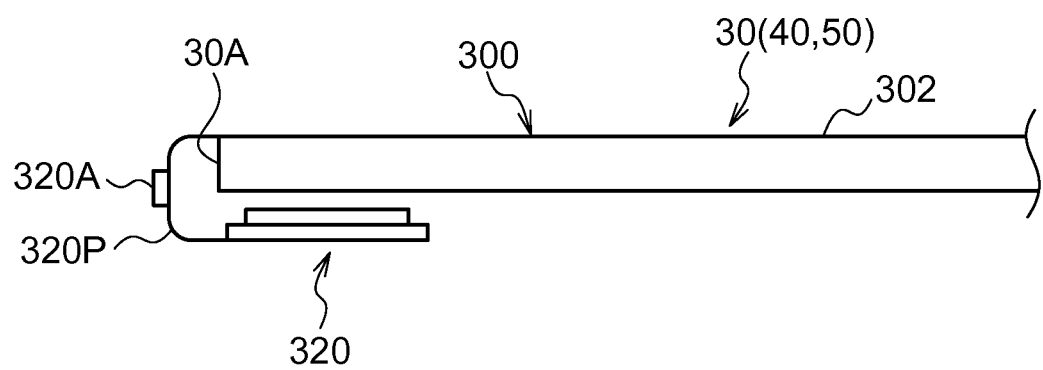
FIG. 17 is a schematic enlarged side view of the radiation detection panel shown in FIG. 16.

In the radiographic imaging device 10 relating to Modified Example 3, the circuit section 320A is mounted to the flexible substrate 320P as shown in FIG. 16, but, as shown in FIG. 17, the circuit section 320A is disposed along the side surface of the first radiation detection panel 30. In detail, the flexible substrate 320P is led from the sensor unit 300 along the side surface of the first radiation detection panel 30 toward the first circuit unit 320, and the circuit section 320A is mounted to the region that runs along the side surface.

In accordance with the radiographic imaging device 10 relating to Modified Example 3, because the circuit section 320A of the first circuit unit 320 is disposed along the side surface of the first radiation detection panel 30, the circuit section 320A is disposed along the radiation irradiating direction. Because the surface (not shown), at which a circuit is provided in actuality, of the circuit section 320A is rotated by 90° in the arrow Y direction with respect to the top plate 24, effects on circuit operation of the circuit section 320A due to irradiating of radiation can be reduced.

MODIFIED EXAMPLE 4

Figure 18:
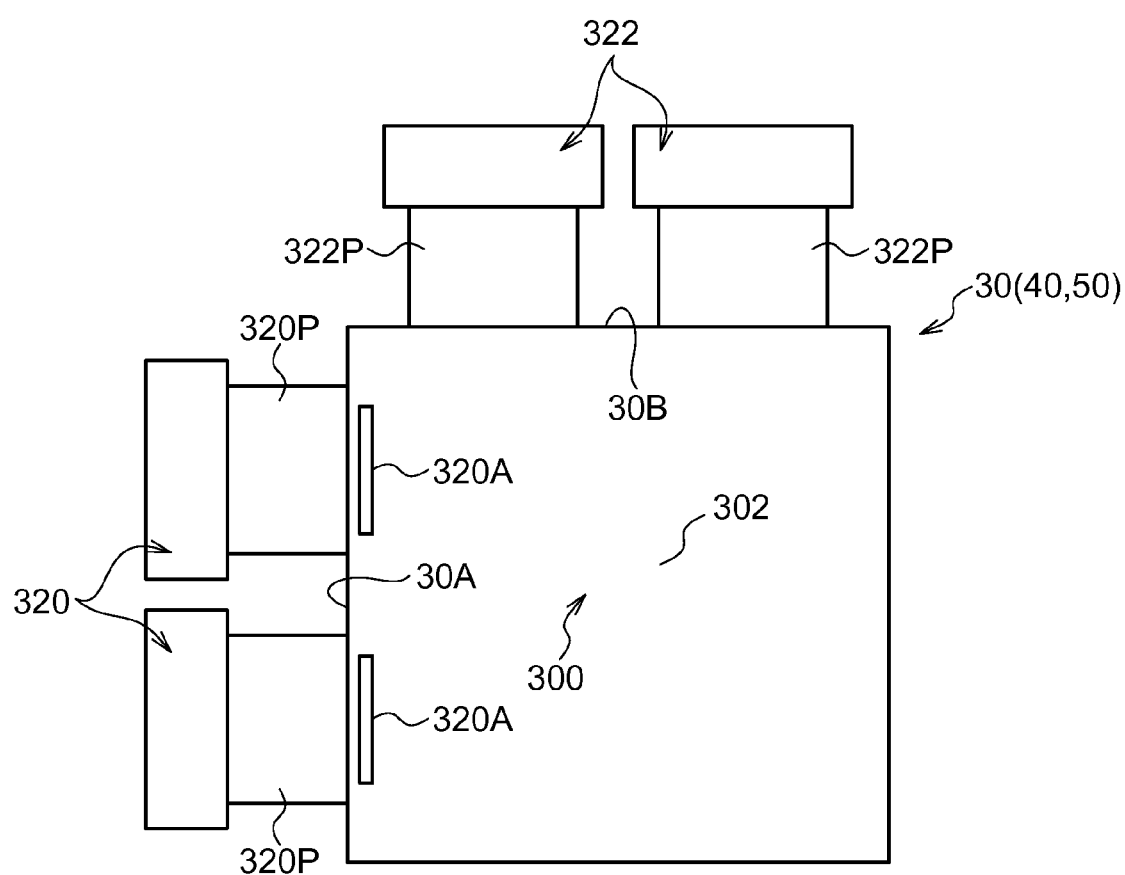
FIG. 18 is a schematic plan view of the radiation detection panel of the radiographic imaging device relating to a fourth modified example of the first embodiment.

In the radiographic imaging device 10 relating to Modified Example 4, as shown in FIG. 18, the circuit section 320A of the first circuit unit 320 of the first radiation detection panel 30 is disposed at the peripheral portion of the sensor unit 300. In detail, the circuit section 320A is disposed at the peripheral portion of the photoelectric conversion panel 302 of the sensor unit 300.

In accordance with the radiographic imaging device 10 relating to Modified Example 4, the length of the signal transfer path between the output line 302A of the sensor unit 300 and the circuit section 320A is short, and therefore, effects of noise on the captured information that expresses the radiological image can be reduced.

MODIFIED EXAMPLE 5

Figure 19:
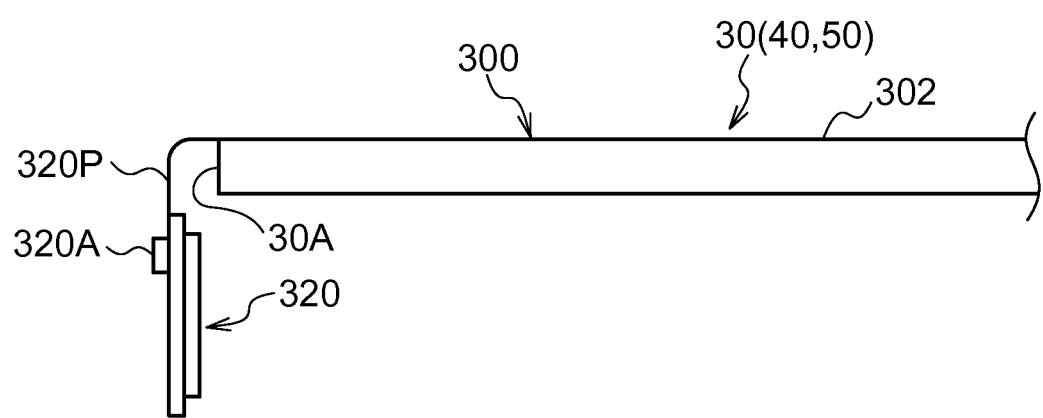
FIG. 19 is a schematic enlarged side view of the radiation detection panel of the radiographic imaging device relating to a fifth modified example of the first embodiment.

In the radiographic imaging device 10 relating to Modified Example 5, as shown in FIG. 19, the entire first circuit unit 320 is disposed along the side surface of the first radiation detection panel 30 in the radiation irradiating direction.

In accordance with the radiographic imaging device 10 relating to Modified Example 5, because the first circuit unit 320 is disposed along the side surface of the first radiation detection panel 30, the first circuit unit 320 is disposed along the radiation irradiating direction. Because the surface (not shown), at which the circuit is provided in actuality, of the first circuit unit 320 is rotated by 90° in the arrow Y direction with respect to the top plate 24, erroneous operation of the first circuit unit 320 due to irradiating of radiation can be effectively suppressed or prevented.

Second Embodiment

Figure 20:
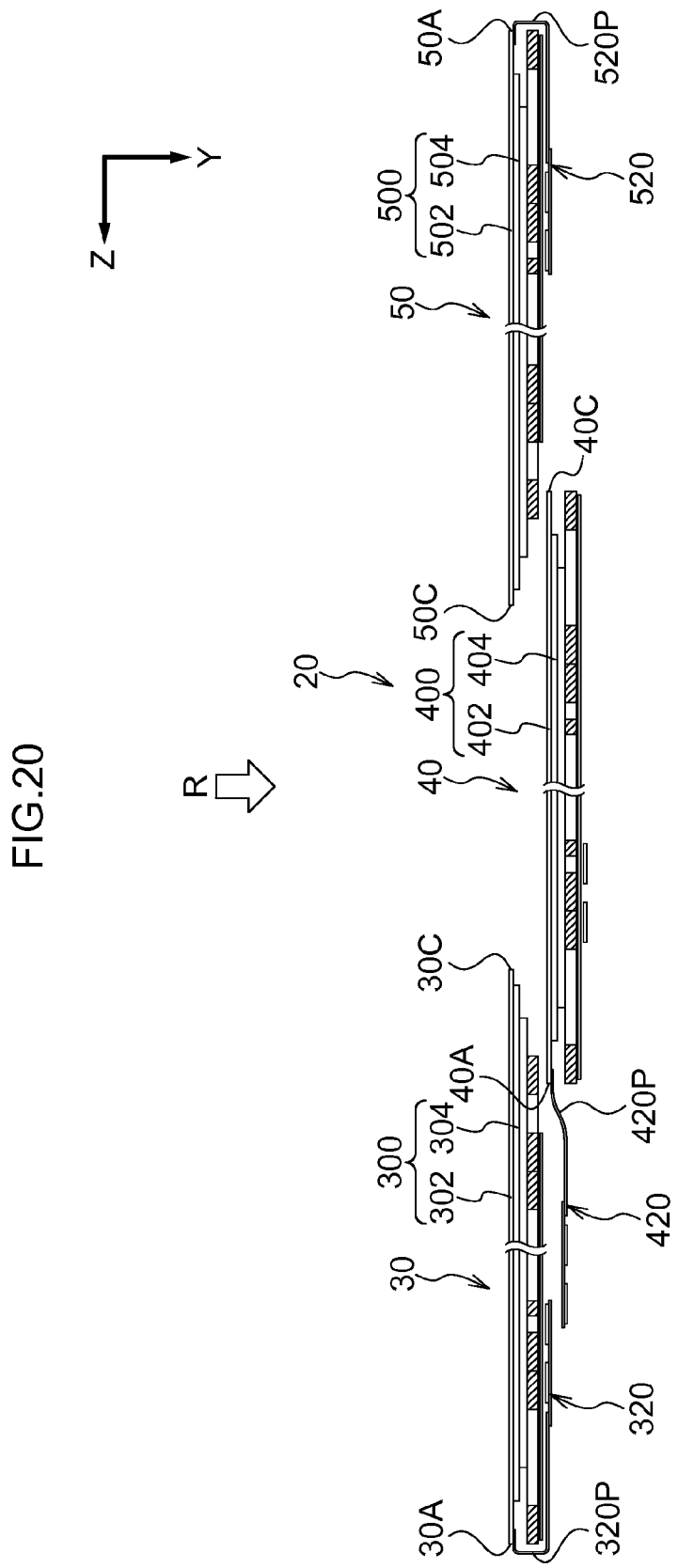
FIG. 20 is a side view, corresponding to FIG. 7, of the radiation detection panels of a radiographic imaging device relating to a second embodiment of the present invention.

A radiographic imaging device 10 relating to a second embodiment of the present invention is described by using FIG. 20.

(Structure of Radiation Detection Panel)

As shown in FIG. 20, the radiographic imaging device 10 relating to the present embodiment has basically the same structure as the radiographic imaging device 10 relating to the first embodiment, but the first circuit unit 420 of the second radiation detection panel 40 is disposed at the side (see FIG. 1), that is opposite the radiation irradiating section 70 side, of the first radiation detection panel 30. In detail, at the first radiation detection panel 30, the first circuit unit 320 is disposed so as to overlap the side opposite the radiation irradiating section 70 side of the sensor unit 300, and, at the third radiation detection panel 50, the first circuit unit 520 is disposed so as to overlap the side opposite the radiation irradiating section 70 side of the sensor unit 500. In contrast, at the second radiation detection panel 40, the flexible substrates 420P are led to the side opposite the radiation irradiating section 70 side of the first radiation detection panel 300 without being bent-back, and the first circuit unit 420 is moved to the back surface side of the first radiation detection panel 30.

(Operation and Effects of Second Embodiment)

In the radiographic imaging device 10 relating to the present embodiment, the first circuit unit 420 of the second radiation detection panel 40 is disposed at the side opposite the radiation irradiating section 70 side of the first radiation detection panel 30. Therefore, in the radiation irradiating direction, the thickness of the first circuit unit 420 is incorporated within the thickness of the second radiation detection panel 40. Therefore, making the radiographic imaging device 10 thin can be realized.

Further, operation and effects, other than the above-described operation and effects, of the radiographic imaging device 10 relating to the present embodiment are similar to the operation and effects of the radiographic imaging device 10 relating to the first embodiment.

Third Embodiment

Figure 21:
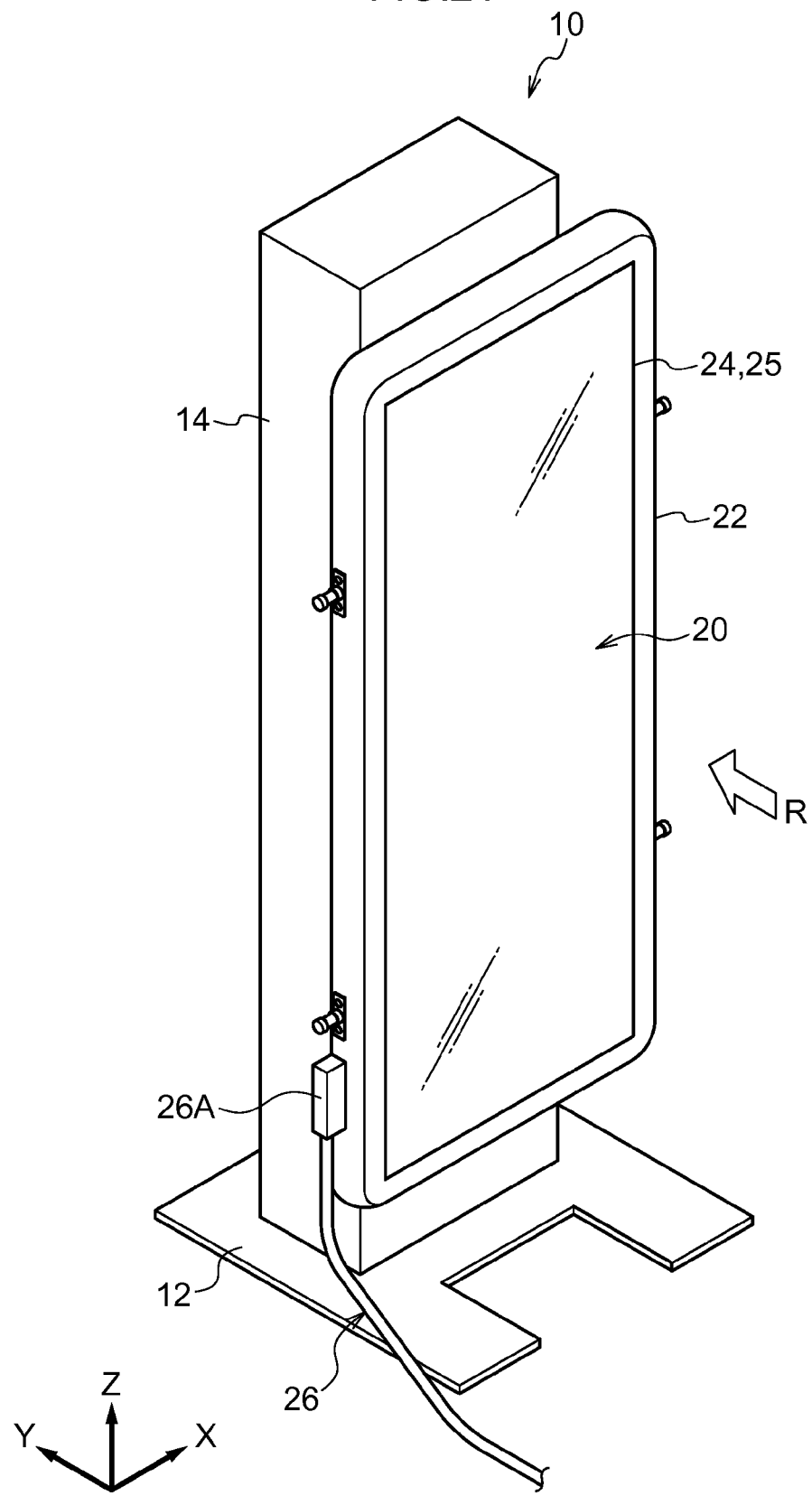
FIG. 21 is a perspective view, corresponding to FIG. 1, of a radiographic imaging device relating to a third embodiment of the present invention.

The radiographic imaging device 10 relating to a third embodiment of the present invention is described by using FIG. 21. The present embodiment and the fourth embodiment that is described hereafter describe examples in which the place of connection of the external connection cable 26 to the panel case 20 is changed as compared with that in the radiographic imaging device 10 relating to the first embodiment.

(Structure of Radiographic Imaging Device)

At the radiographic imaging device 10 relating to the present embodiment, as shown in FIG. 21, the external connection cable 26 is provided, via the connector 26A, at the side surface of the panel case 20 at one end portion in the direction of arraying of the first radiation detection panel 30, the second radiation detection panel 40 and the third radiation detection panel 50. In detail, in FIG. 21, the external connection cable 26 is provided so as to be able to be connected to the lower end portion in the arrow Z direction. Although not illustrated, the power relay section 60 and the signal relay section 62 that are shown in FIG. 5 are provided at the interior of the panel case 20 in a vicinity of the connector 26A.

(Operation and Effects of Third Embodiment)

In accordance with the radiographic imaging device 10 relating to the present embodiment, the external connection cable 26 can be connected to the side surface of the panel case 20 at one end portion in the direction of the arraying of the first radiation detection panel 30 and the like. At the one end portion in the arraying direction, the attachment and removal of the external connection cable 26 do not get in the way, and therefore, the usability can be improved. This improvement in usability includes, for example, the usability of the operation of rotating the panel case 20, the operation of removing the panel case 20, and the like that were described in relation to the radiographic imaging device 10 relating to the first embodiment.

Further, operation and effects, other than the above-described operation and effects, of the radiographic imaging device 10 relating to the present embodiment are similar to the operation and effects of the radiographic imaging device 10 relating to the first embodiment.

Fourth Embodiment

Figure 22:
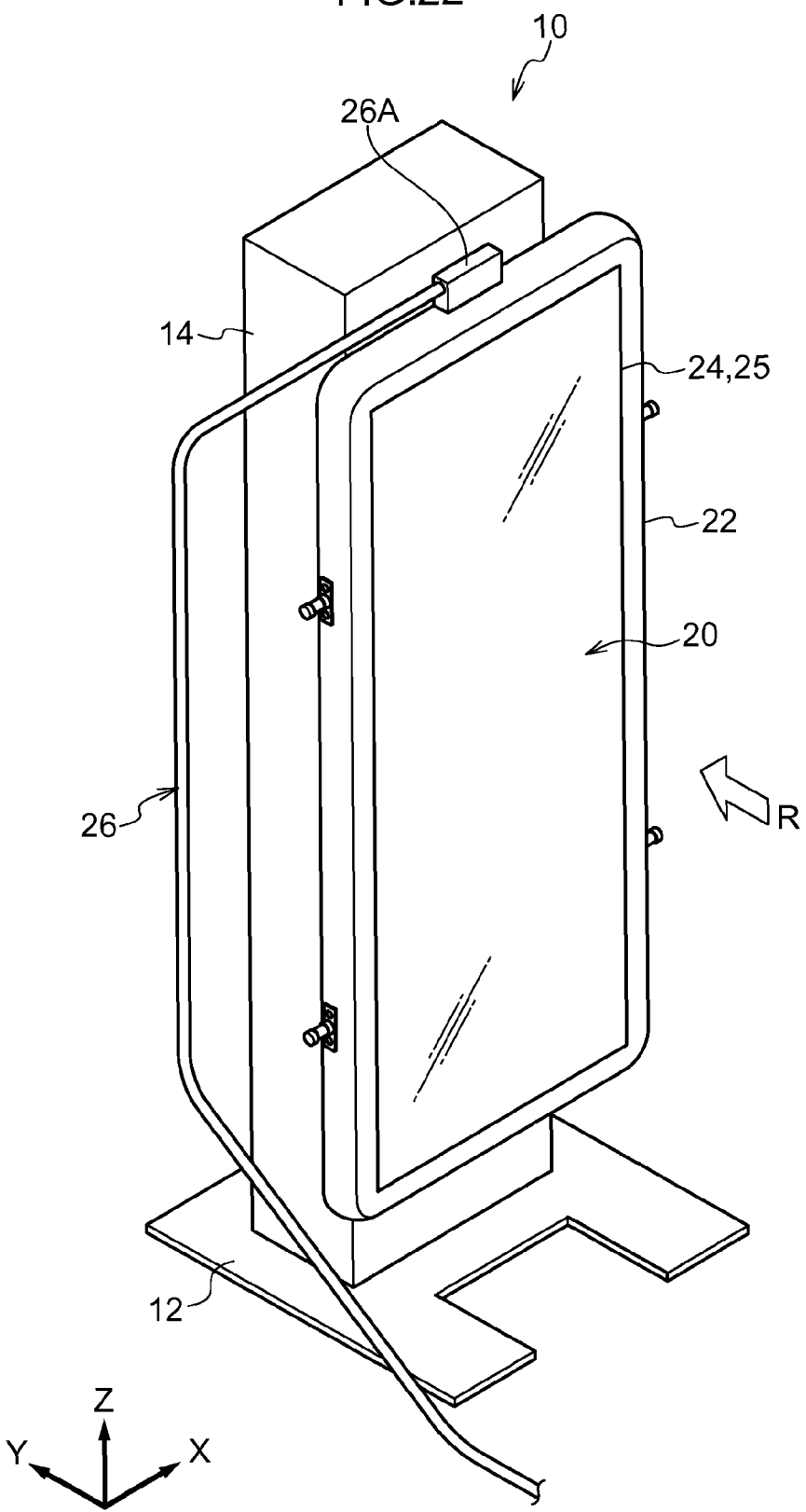
FIG. 22 is a perspective view, corresponding to FIG. 1, of a radiographic imaging device relating to a fourth embodiment of the present invention.

The radiographic imaging device 10 relating to a fourth embodiment of the present invention is described by using FIG. 22.

(Structure of Radiographic Imaging Device)

At the radiographic imaging device 10 relating to the present embodiment, as shown in FIG. 22, the external connection cable 26 is provided, via the connector 26A, at the upper side surface (or the lower side surface) of the panel case 20 in the array width direction of the first radiation detection panel 30, the second radiation detection panel 40 and the third radiation detection panel 50. In detail, in FIG. 22, the external connection cable 26 is provided so as to be able to be connected to an intermediate portion in the arrow X direction. Although not illustrated, the power relay section 60 and the signal relay section 62 that are shown in FIG. 5 are provided at the interior of the panel case 20 in a vicinity of the connector 26A.

(Operation and Effects of Fourth Embodiment)

In accordance with the radiographic imaging device 10 relating to the present embodiment, the external connection cable 26 is made to be able to be connected to a side surface of the panel case 20 in the array width direction of the first radiation detection panel 30 and the like. At the side surface in the array width direction, the attachment and removal of the external connection cable 26 do not get in the way, and therefore, the usability can be improved. This improvement in usability includes the meaning described in relation to the radiographic imaging device 10 relating to the third embodiment.

Further, operation and effects, other than the above-described operation and effects, of the radiographic imaging device 10 relating to the present embodiment are similar to the operation and effects of the radiographic imaging device 10 relating to the first embodiment.

Fifth Embodiment

In the present embodiment, the panel case 20 differs from the panel case 20 of the above-described first embodiment through fourth embodiment. Therefore, the panel case 20 of the present embodiment is described in detail.

In the radiographic imaging devices 10 relating to the above-described respective embodiments, the sensor units 300, 400, 500 are disposed such that the end portions of the respective effective imaging regions thereof are overlapped, from the standpoints of preventing omission of image information and appropriately carrying out step correction and oblique incidence correction of the radiation R. Concretely, in the radiographic imaging devices 10 relating to the above-described respective embodiments, a portion of the effective imaging region AR1 of the sensor unit 300 and a portion of the effective imaging region AR2 of the sensor unit 400 are overlapped. Further, similarly, at the radiographic imaging devices 10, a portion of the effective imaging region AR2 of the sensor unit 400 and a portion of the effective imaging region (not shown) of the sensor unit 500 are overlapped.

At the overlapping portions of the sensor units 300, 400, 500, there are cases in which artifacts arise in the captured radiation due to difference in the absorptances due to the fluorescent bodies (304, 404, 504) being disposed in two layers. Artifacts that are generated are, for example, artifacts such as steps in density, lateral stripes that arise due to a decrease in the radiation dose at the overlapping portion of a sensor unit that is further from the radiation irradiating section 70, black bands or white bands that are caused by the wrapping-around of scattered radiation, and the like.

Therefore, there are cases in which it is preferable to carry out capturing of a radiological image while avoiding the overlapping portions at the sensor units 300, 400, 500. For example, it is preferable to not capture a radiological image corresponding to an overlapping portion at the region of interest of the subject H (the region that the user, such as a doctor or the like, wishes to observe or examine).

Thus, in the radiographic imaging device 10 of the present embodiment, assisting lines, that correspond to an example of marks and that assist in image capturing in order to capture a radiological image of the subject H appropriately, are provided at an imaging surface 25 of the top plate 24 and side surfaces of the frame main body 202.

Concretely, as an example of the assisting lines of the present embodiment, there are assisting lines that assist in avoiding the overlapping portions. Further, in general, in a case in which positioning the subject H, there are cases in which positioning is carried out by using the central portion of the effective imaging region as a standard. In a case in which carrying out image capturing while avoiding the overlapping portions, the central portions of the effective imaging regions excepting the overlapping portions are at positions that differ from the central portions of the effective imaging regions (AR1, AR2 and the like) of the respective sensor units 300, 400, 500 themselves. Therefore, an example is assisting lines, that are for assisting in the positioning of the subject H, being provided at positions corresponding to the central portions of the effective imaging regions excepting the overlapping portions.

Assisting lines, that are provided at the imaging surface 25 of the top plate 24 and at the side surfaces of the frame main body 202, are described in detail hereinafter in respective Examples. Note that illustration of the connector 26A is omitted in the drawings of the radiographic imaging devices 10 that are shown in the following Examples.

EXAMPLE 1-1

Figure 23:
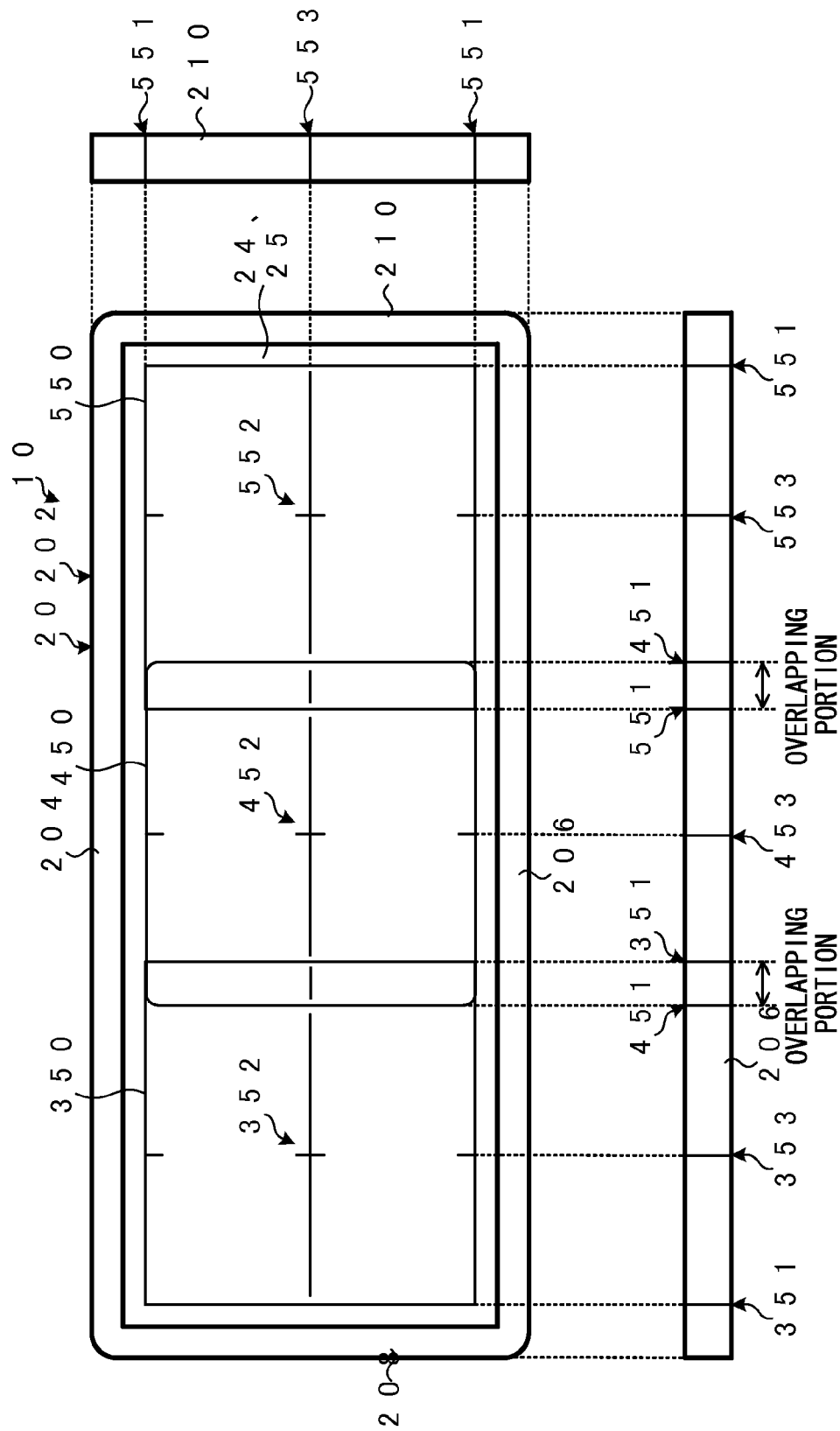
FIG. 23 is a schematic plan view and side views that are viewed from the radiation irradiating section side of a radiographic imaging device relating to Example 1-1 of a fifth embodiment of the present invention.

A concrete example of assisting lines, that are provided at the imaging surface 25 of the top plate 24 and at the side surfaces of the frame main body 202 of the radiographic imaging device 10 relating to the present Example, is shown in FIG. 23.

In the radiographic imaging device 10 of the present Example, assisting lines are provided at positions of the imaging surface 25 of the top plate 24, which positions correspond to the effective imaging region AR1 of the sensor unit 300, the effective imaging region AR2 of the sensor unit 400, and the effective imaging region of the sensor unit 500.

Imaging surface assisting lines 350, 450, 550 and imaging surface assisting lines 352, 452, 552 are provided at the imaging surface 25 of the top plate 24.

The imaging surface assisting line 350 is provided at a position corresponding to the effective imaging region AR1 of the sensor unit 300. Further, the imaging surface assisting line 352 is provided at a position that corresponds to the center of a region obtained by removing, from the effective imaging region AR1 of the sensor unit 300, the portion that overlaps with the effective imaging region AR2 of the sensor unit 400. Similarly, the imaging surface assisting line 450 is provided at a position corresponding to the effective imaging region AR2 of the sensor unit 400. Further, the imaging surface assisting line 452 is provided at a position that corresponds to the center of a region obtained by removing, from the effective imaging region AR2 of the sensor unit 400, the portion that overlaps with the effective imaging region AR1 of the sensor unit 300 and the portion that overlaps with the effective imaging region of the sensor unit 500. Further, similarly, the imaging surface assisting line 550 is provided at a position corresponding to the effective imaging region of the sensor unit 500. Further, the imaging surface assisting line 552 is provided at a position that corresponds to the center of a region obtained by removing, from the effective imaging region of the sensor unit 500, the portion that overlaps with the effective imaging region AR2 of the sensor unit 400.

In accordance with the radiographic imaging device 10 of the present Example, the imaging surface assisting lines 350, 450, 550 are provided at the imaging surface 25 of the top plate 24. Therefore, the positions of the overlapping portions can be recognized from the exterior of the panel case 20. Thus, in accordance with the radiographic imaging device 10 of the present Example, assistance can be provided for imaging the subject H while avoiding the positions of the overlapping portions can be carried out.

In this way, in accordance with the radiographic imaging device 10 of the present Example, assistance for imaging the subject H while avoiding the positions of the overlapping portions can be provided.

Moreover, in accordance with the radiographic imaging device 10 of the present Example, because the imaging surface assisting lines 352, 452, 552 that correspond to the positions of the centers are provided at the imaging surface 25 of the top plate 24, positioning of the subject H can be assisted.

On the other hand, side surface assisting lines 351, 451, 551 and side surface assisting lines 353, 453, 553 are provided at the side surfaces of the frame main body 202.

The side surface assisting lines 351 are provided at positions corresponding to the imaging surface assisting line 350. Further, the side surface assisting line 353 is provided at a position corresponding to the imaging surface assisting line 352. Similarly, the side surface assisting lines 451 are provided at positions corresponding to the imaging surface assisting line 450. Further, the side surface assisting line 453 is provided at a position corresponding to the imaging surface assisting line 452. Moreover, similarly, the side surface assisting lines 551 are provided at positions corresponding to the imaging surface assisting line 550. Further, the side surface assisting lines 553 are provided at a position corresponding to the imaging surface assisting line 552.

In this way, in accordance with the radiographic imaging device 10 of the present Example, because the side surface assisting lines 351, 451, 551 are provided at the side surfaces of the frame main body 202, the positions of the overlapping portions can be recognized from the exterior of the panel case 20. In particular, the positions of the overlapping portions can be recognized from the exterior of the panel case 20 even in cases in which the imaging surface assisting lines 350, 450, 550 that are marked on the imaging surface 25 are difficult to see due to, for example, the subject H being disposed (positioned) on the imaging surface 25 of the top plate 24, or the like.

Moreover, in accordance with the radiographic imaging device 10 of the present Example, positioning of the subject H can be assisted because the imaging surface assisting lines 353, 453, 553 that correspond to the positions of the centers are provided at the side surfaces of the frame main body 202.

EXAMPLE 1-2

Figure 24:
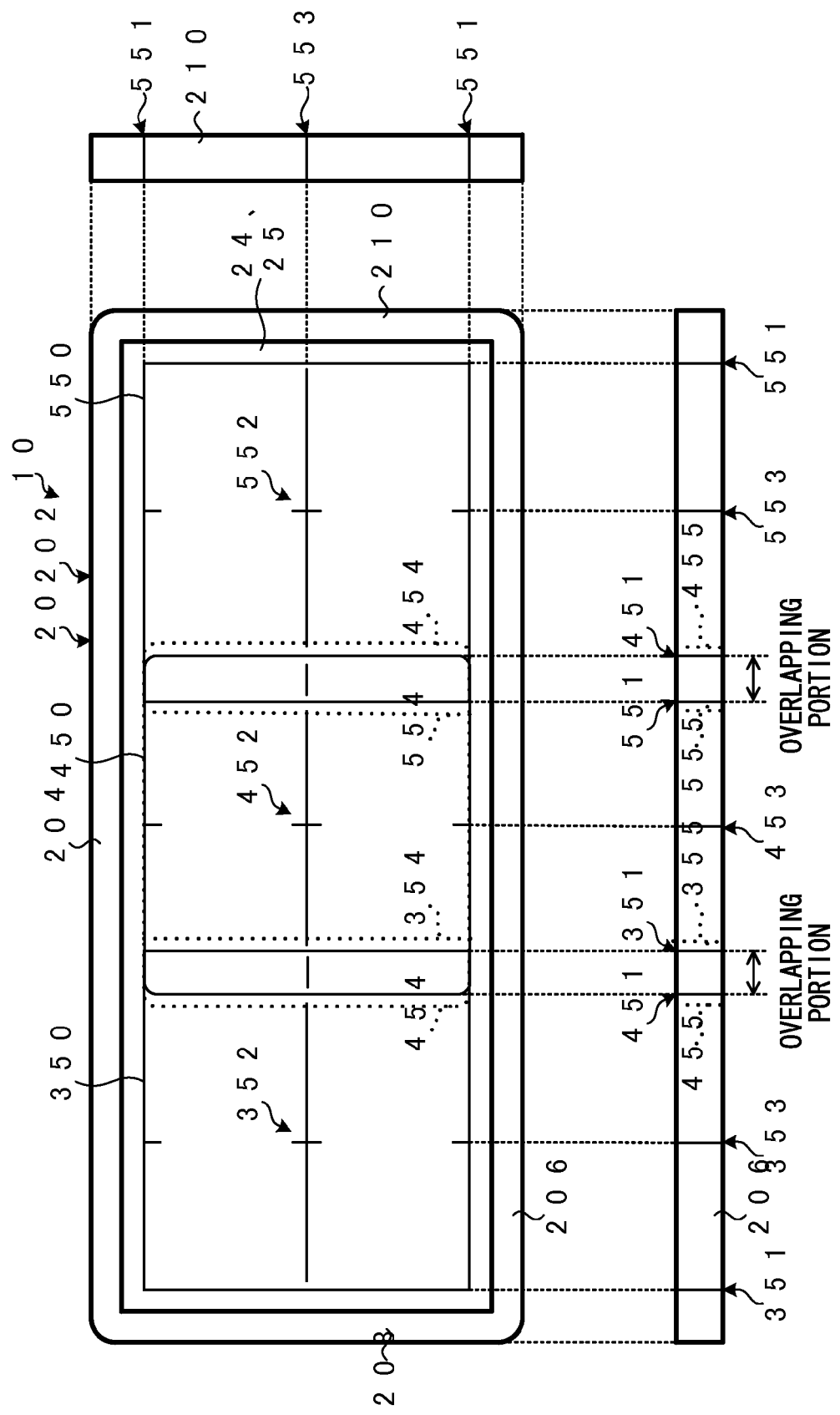
FIG. 24 is a schematic plan view and side views that are viewed from the radiation irradiating section side of a radiographic imaging device relating to Example 1-2 of the fifth embodiment of the present invention.

FIG. 24 shows a concrete example of assisting lines that are provided on the imaging surface 25 of the top plate 24 and on the side surfaces of the frame main body 202 of the radiographic imaging device 10 of the present Example.

There are cases in which the radiation R that is irradiated from the radiation irradiating section 70 is incident obliquely onto the top plate 24 (the imaging surface 25) of the panel case 20. In a case in which the angle of oblique incidence (angle of incidence) of the radiation R changes, the position on the top plate 24 that is projected onto a panel overlapping portion changes. In the radiographic imaging device 10 of the present Example, detailed description is given of a case in which assisting lines, that take oblique incidence of the radiation R into consideration, are provided on the imaging surface 25 of the top plate 24 and the side surfaces of the frame main body 202.

Assisting lines, that are provided in consideration of oblique incidence of the radiation R in cases in which the angle of oblique incidence changes with respect to the length direction and the position on the top plate 24 that is projected onto a panel overlapping portion changes in the length direction of the panel case 20, are marked on the radiographic imaging device 10 shown in FIG. 24.

In addition to the imaging surface assisting lines 350, 352, 450, 452, 550, 552 that were shown in Example 1-1, image surface assisting lines 354, 454, 554, that indicate the overlapping portions in a case in which the angle of oblique incidence in the length direction is a maximum, are provided on the imaging surface 25 of the top plate 24 of the radiographic imaging device 10. Further, similarly, in addition to the side surface assisting lines 351, 353, 451, 453, 551, 553 that were shown in Example 1-1, side surface assisting lines 355, 455, 555, that indicate the overlapping portions in a case in which the angle of oblique incidence is a maximum, are provided at the side surface of the frame main body 202 of the radiographic imaging device 10.

Note that the imaging surface assisting lines 350, 450, 550 and the side surface assisting lines 351, 451, 551 that are shown in FIG. 23 correspond to a case in which the radiation R is incident perpendicularly with respect to the panel case 20.

The angle of oblique incidence that is a maximum differs in accordance with the radiological image capturing system or the like at which the radiographic imaging device 10 is provided. However, in a case of capturing a static image, 40° is a concrete example of the angle of oblique incidence that is a maximum. Note that the offset in an overlapping portion between the case in which the radiation R is incident perpendicularly and the case in which the angle of oblique incidence is a maximum can be computed as offset amount=Dtanθ, wherein the distance between the imaging surface 25 of the top plate 24 and the surface, at the radiation irradiating section 70 side, of the sensor unit 300, 400, 500 is expressed by D, and the angle of oblique incidence is expressed by θ.

In this way, in accordance with the radiographic imaging device 10 of the present Example, the imaging surface assisting lines 354, 454, 554 are further provided at the imaging surface 25 of the top plate 24, and the side surface assisting lines 355, 455, 555 are further provided at the side surface of the frame main body 202. Therefore, the positions of the overlapping portions, that correspond to the angle of oblique incidence of the radiation R, can be recognized from the exterior of the panel case 20.

Note that the radiographic imaging device 10 of the present Example is not limited to being provided with both the imaging surface assisting lines 350, 450, 550 and the side surface assisting lines 351, 451, 551 in the case in which the radiation R is incident perpendicularly, and the imaging surface assisting lines 354, 454, 554 and the side surface assisting lines 355, 455, 555 in the case in which the angle of oblique incidence is a maximum. For example, the imaging surface assisting lines 354, 454, 554 and the side surface assisting lines 355, 455, 555 in the case in which the angle of oblique incidence is a maximum only may be provided at the radiographic imaging device 10.

Figure 25:
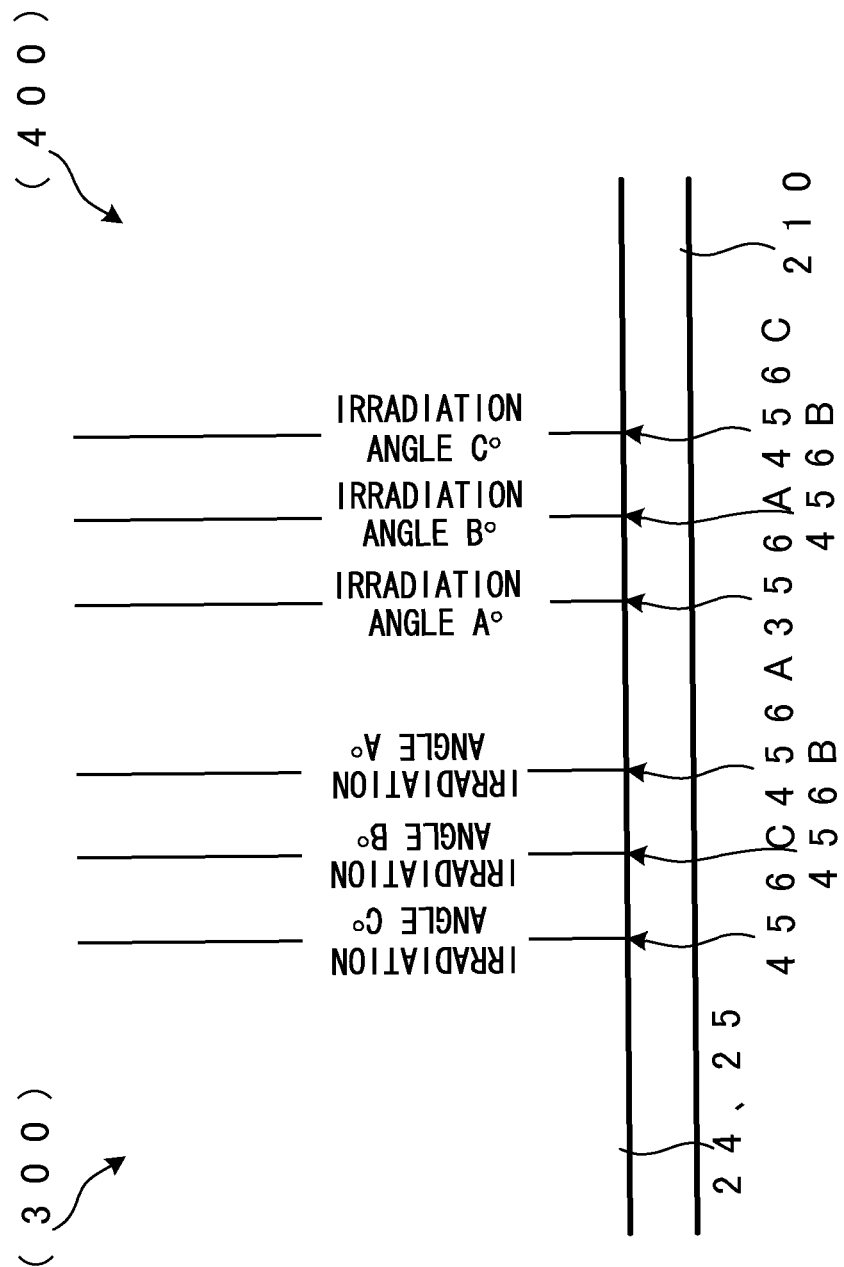
FIG. 25 is a schematic plan view and a side view that are viewed from the radiation irradiating section side in a case in which imaging surface assisting lines and side surface assisting lines are provided in accordance with plural angles of oblique incidence, at the radiographic imaging device relating to Example 1-2 of the fifth embodiment of the present invention.

Further, imaging surface assisting lines and side surface assisting lines may be provided in accordance with plural angles of oblique incidence. An explanatory drawing for explaining a concrete example in this case is shown in FIG. 25. An enlarged view of the overlapping portion of the effective imaging region AR1 of the sensor unit 300 and the effective imaging region AR2 of the sensor unit 400 at the imaging surface 25 of the top plate 24, is shown schematically in FIG. 25. FIG. 25 shows a case in which imaging surface assisting lines 356A, 356B, 356C, 456A, 456B, 456C, that are for cases in which there are three types of angles of oblique incidence that are A, B, C, are provided on the imaging surface 25 of the top plate 24.

Note that, in a case in which plural types of assisting lines are provided as in the radiographic imaging device 10 of the present Example, there are cases in which it becomes complex in a case in which all of the assisting lines are provided at the side surface of the frame main body 202. Because the connector 26A and various types of switches and the like are provided at the side surface of the frame main body 202 for example, it becomes complex in a case in which plural types of assisting lines are provided at such a side surface, and there are cases in which it becomes difficult to see the assisting lines. Therefore, for example, the side surface assisting lines 355, 455, 555 in the case in which the angle of oblique incidence is a maximum only may be provided at the radiographic imaging device 10, without providing all of the plural types of assisting lines at the side surface of the frame main body 202.

Further, in the present Example, a case is described in which the angle of oblique incidence of the radiation R changes in the length direction of the panel case 20. However, the present Example is not limited to this, and assisting lines for cases in which the angle of oblique incidence of the radiation R changes in the short direction of the panel case 20 and the position on the top plate 24 that is projected onto a panel overlapping portion changes in the short direction, may be provided. In the case of capturing a still image, 30° is a concrete example of the angle of oblique incidence that is a maximum in the short direction.

EXAMPLE 1-3

Figure 26:
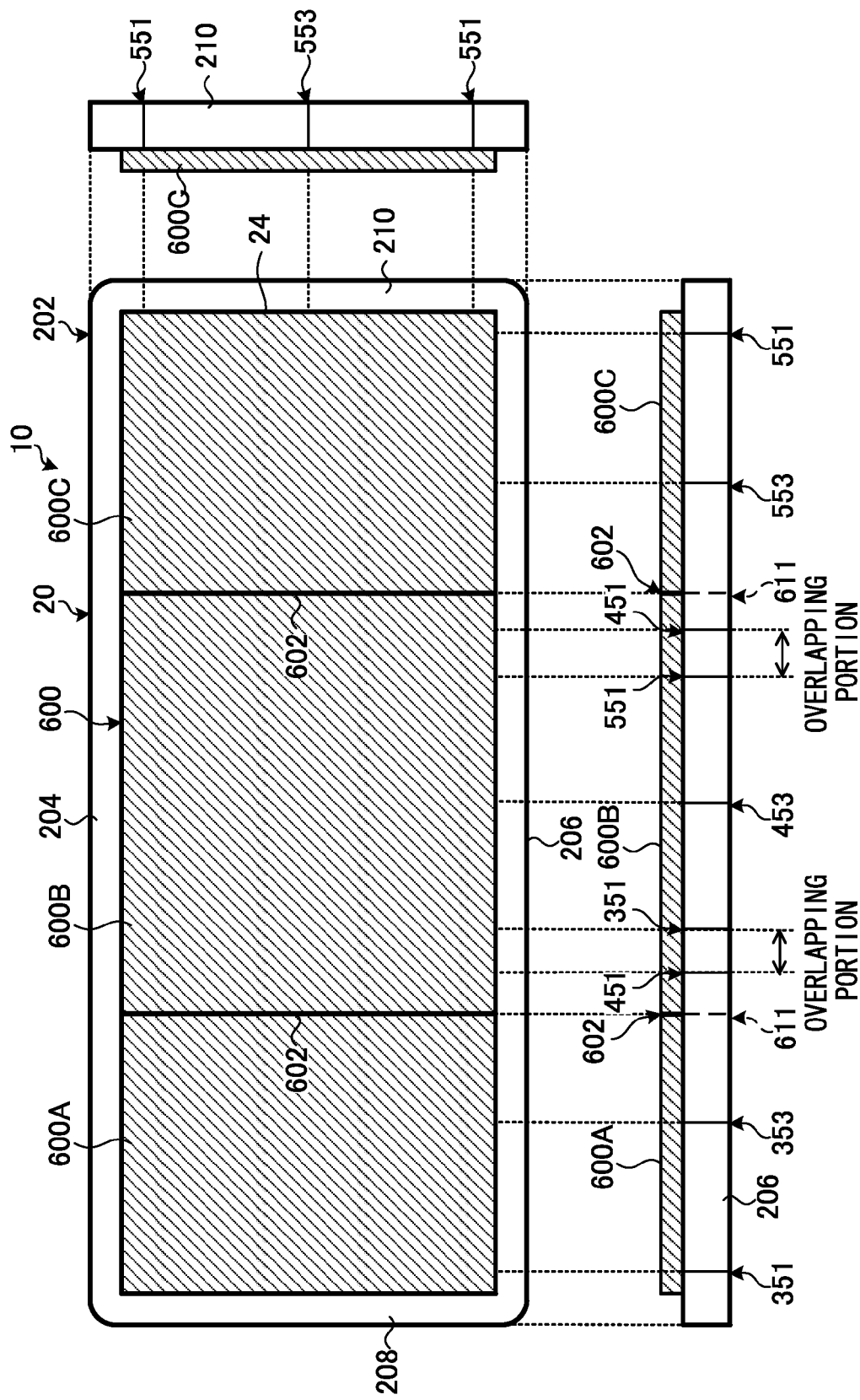
FIG. 26 is a schematic plan view and side views that are viewed from the radiation irradiating section side of a radiographic imaging device relating to Example 1-3 of the fifth embodiment of the present invention.
Figure 27:
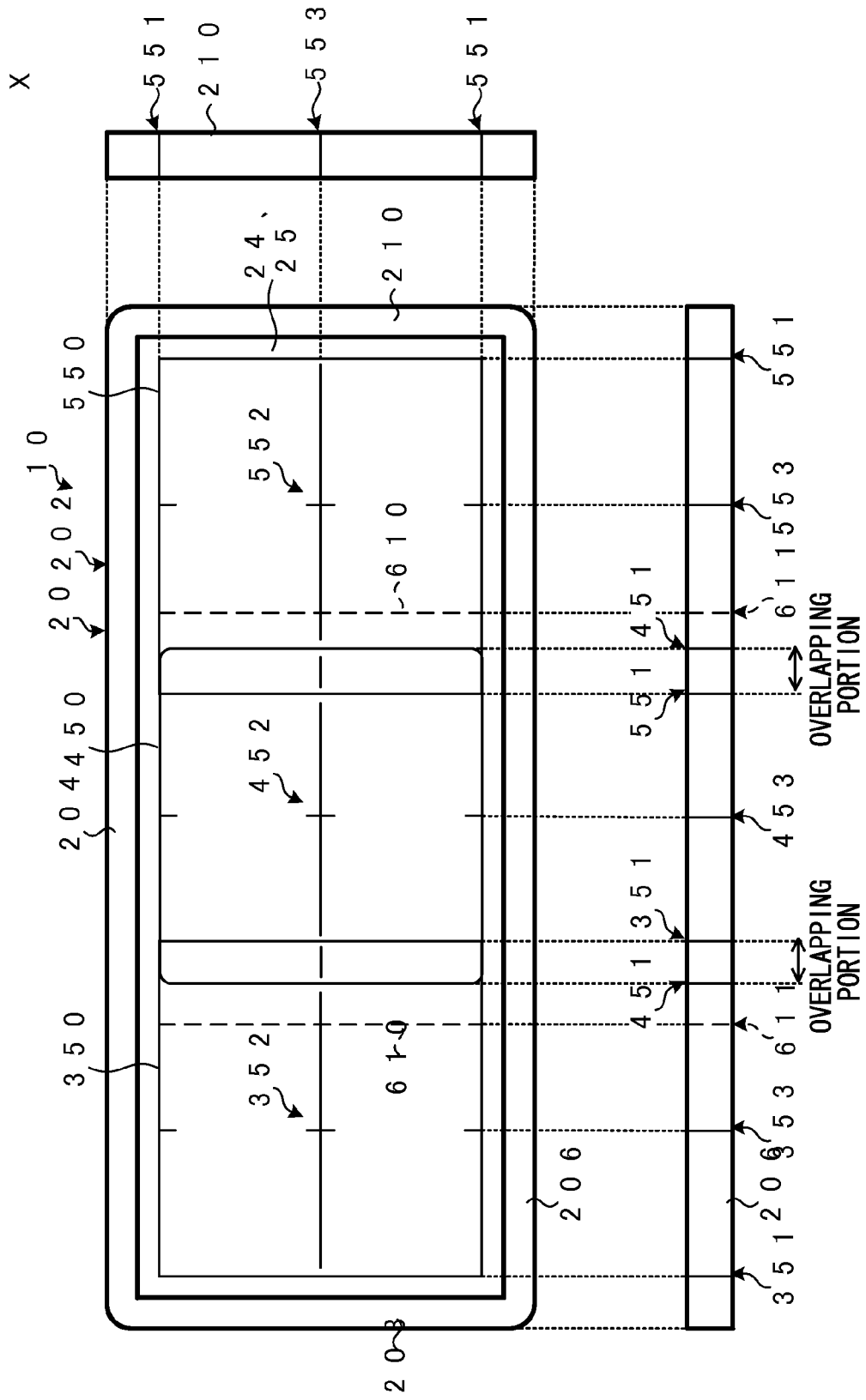
FIG. 27 is a schematic plan view and side views that are viewed from the radiation irradiating section side of the radiographic imaging device relating to Example 1-3 of the fifth embodiment of the present invention.

Concrete examples of assisting lines, that are provided at the imaging surface 25 of the top plate 24 and the side surfaces of the frame main body 202 of the radiographic imaging device 10 of the present Example, are shown in FIG. 26 and FIG. 27. Note that FIG. 26 shows a state in which a grid portion 600 is disposed on the radiographic imaging device 10. In the present Example, in addition to the assisting lines that are provided at the radiographic imaging device 10 of Example 1-1, imaging surface assisting lines 602 and side surface assisting lines 611 are provided at positions corresponding to seams 602 of the grid portion 600.

In a case in which carrying out capturing of a radiological image, there are cases in which a grid, that removes scattered radiation that is included in the radiation R that has been transmitted through the subject H, is provided between the subject H and the sensor unit. The radiographic imaging devices 10 of the above-described respective embodiments have the plural sensor units (the sensor units 300, 400, 500), and, because the effective imaging region of the entire radiographic imaging device 10 is large, the size (the surface area) of the grid also is large in accordance with the size (the surface area) of the imaging surface 25. Thus, in image capturing by the radiographic imaging device 10, there are cases in which imaging is carried out by using one large grid portion in which plural grids are joined together. FIG. 26 shows a concrete example of the radiographic imaging device 10 that is provided with the grid portion 600. As shown in FIG. 26, at the radiographic imaging device 10 of the present Example, the grid portion 600 is disposed on the radiographic imaging device 10, i.e., between the subject H and the radiographic imaging device 10. Further, at the grid portion 600 of the present Example, three grids (600A, 600B, 600C) are joined together by the seams 602.

In a case in which the plural grids (600A, 600B, 600C) are joined together in this way, in the captured radiological image, the phases of the mountains and the valleys of the grid differ across the seams. Therefore, even after removal processing that removes grid irregularity is carried out on the radiological image, there are cases in which a striped pattern corresponding to the intervals of the respective grids remains. A striped pattern, that extends in the length direction of the panel case 20 in vicinities of positions corresponding to the seams 602 of the grid, is a concrete example of such a striped pattern that is caused by the seams 602 of the grid. There is the concern that, in a case in which a striped pattern arises in this way, the image quality of the radiological image will deteriorate at the places where the striped pattern arises. Thus, it is preferable to capture (position) the subject H, and the region of interest in particular, at a position that avoids the seams 602 of the grid portion.

Thus, at the radiographic imaging device 10 of the present Example, imaging surface assisting lines 610 are provided at positions of the imaging surface 25 of the top plate 24, which positions correspond to the seams 602 of the grid portion 600. Further, at the radiographic imaging device 10, the side surface assisting lines 611 are provided at positions of the side surface of the frame main body 202, which positions correspond to the seams 602 of the grid portion 600.

In this way, in accordance with the radiographic imaging device 10 of the present Example, the imaging surface assisting lines 610 are further provided at the imaging surface 25 of the top plate 24, and the side surface assisting lines 611 are provided at the side surface of the frame main body 202. Thus, the positions of the seams 602 of the grid portion 600 can be recognized from the exterior of the panel case 20.

Note that the positions of the seams 602 of the grid portion 600 of the present Example also change due to the angle of oblique incidence of the radiation R, in the same way as the positions of the overlapping portions that were described in Example 1-2. Therefore, plural types of assisting lines, that corresponds to angles of oblique incidence of the radiation R, may be provided.

Further, in a case in which a top plate (not illustrated) is provided on the grid portion 600 between the grid portion 600 and the subject H, assisting lines may be provided on the provided top plate, in the same way as on the imaging surface 25 of the top plate 24. In this case, all of the above-described plural types of assisting lines may be provided on the top plate that is on the grid portion 600, or some of the assisting lines may be provided.

EXAMPLE 1-4

Figure 28:
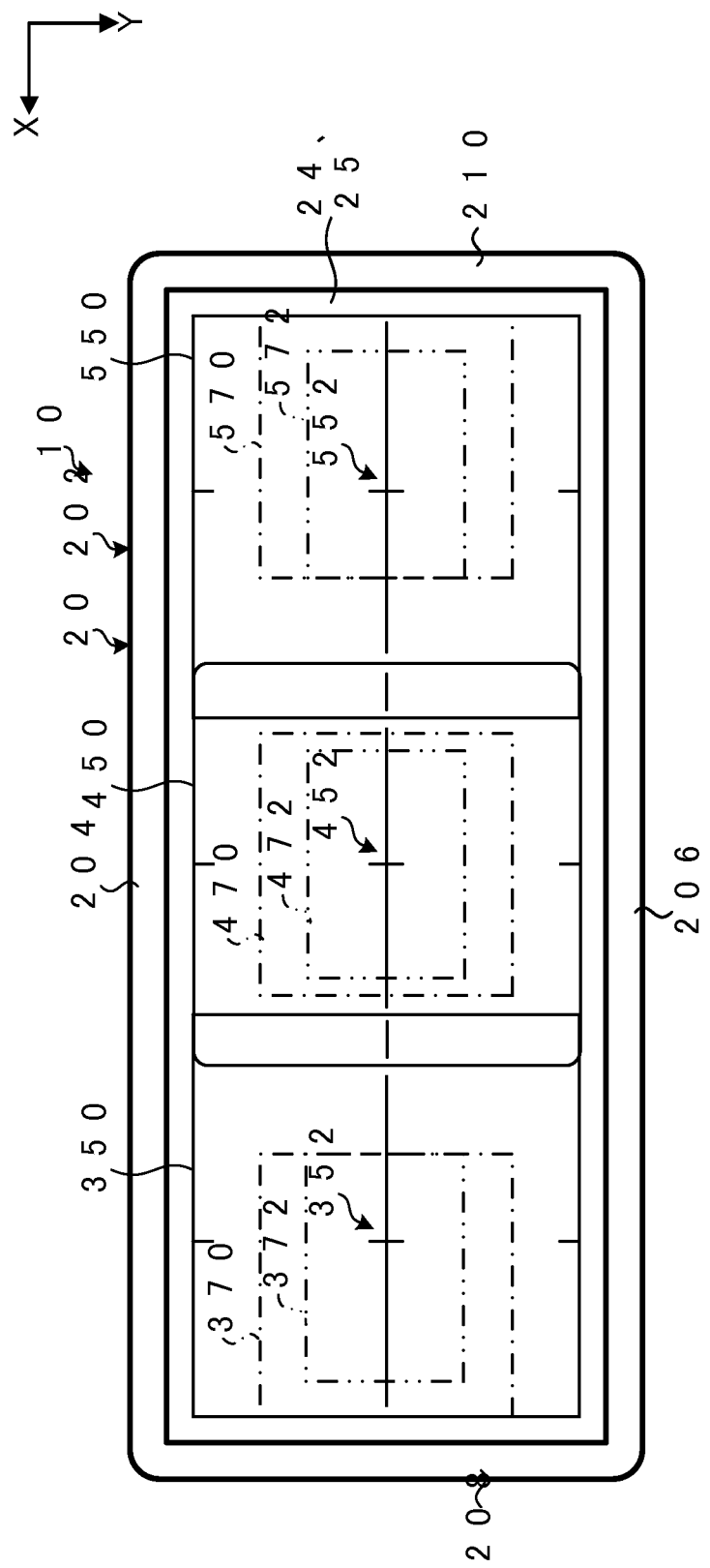
FIG. 28 is a schematic plan view that is viewed from the radiation irradiating section side of a radiographic imaging device relating to Example 1-4 of the fifth embodiment of the present invention.

A concrete example of assisting lines that are provided on the imaging surface 25 of the top plate 24 of the radiographic imaging device 10 of the present Example is shown in FIG. 28. In the present Example, in addition to the assisting lines that are provided at the radiographic imaging device 10 of Example 1-1, imaging surface assisting lines 370, 372, 470, 472, 570, 572, that correspond to desired sizes of radiological images, are provided.

For example, there are cases in which it is desired to trim a radiological image to a region that is smaller than one of the sensor units 300, 400, 500 (i.e., to a one-quarter cut size or the like). In preparation for such a case, at the radiographic imaging device 10 of the present Example, the imaging surface assisting lines 370, 372, 470, 472, 570, 572 are provided at positions that indicate regions to which trimming is desired (regions that are smaller than the respective effective imaging regions (AR1, AR2 and the like) of the sensor units 300, 400, 500). For example, the imaging surface assisting lines 370, 470, 570 are one-quarter cut size, and the imaging surface assisting lines 372, 472, 572 indicate the one-sixth cut size.

In this way, in accordance with the radiographic imaging device 10 of the present Example, because the imaging surface assisting lines 370, 372, 470, 472, 570, 572 are provided, positioning of the subject H can be carried out easily in a case in which a radiological image of a desired size is shaped into a desired size.

As described above, in the radiographic imaging device 10 of the present embodiment, assisting lines that are for assisting the capturing of a radiological image are provided at the imaging surface 25 of the top plate 24 and at the side surface(s) of the frame main body 202. In particular, because the imaging surface assisting lines 350, 450, 452 and the side surface assisting lines 351, 451, 551 are provided, the respective overlapping regions of the effective imaging region AR1 of the sensor unit 300, the effective imaging region AR2 of the sensor unit 400, and the effective imaging region of the sensor unit 500 can be recognized from the outer side of the panel case 20. Therefore, positioning of the subject H can be facilitated. Further, in the radiographic imaging device 10 of the present embodiment, the image quality of the radiological image can be improved. Due thereto, for example, the need to retake a radiological image of the subject H can be suppressed.

Further, in the radiographic imaging device 10 of the present embodiment, the assisting lines are provided at the side surface(s) of the frame main body 202, in addition to at the imaging surface 25 of the top plate 24. Therefore, even in a case in which the subject H or the grid portion 600 or another top plate or the like is disposed on the imaging surface 25 of the top plate 24, the overlapping portions can be recognized from the outer side of the panel case 20.

Note that the above-described respective Examples may, of course, be combined together. Further, in a case in which the above-described respective Examples are combined together or the like, in a case in which plural types of assisting lines are marked on the imaging surface 25 of the top plate 24 or the side surface of the frame main body 202, the ways of marking the assisting lines may be made to differ per type or the like. For example, the type (dotted line, solid line, or the like), the type of the color, the density of the color, or the like of the lines that are marked may made to differ, or, as shown in FIG. 25, information (writing or the like), that relates to what is expressed by the marked assisting lines, may be marked together with the assisting lines.

Further, the plural types of assisting lines that are shown in the above-described respective Examples are not limited to being marked by paint, and LEDs or linear lights or the like may be lit. In such cases, for example, control may be carried out to light the light and turn off the light in accordance with, for example, the case of irradiating the radiation R and another case such as the case of carrying out positioning or the like. Further, for example, in a case in which image capturing is carried out with the radiation R being incident obliquely with respect to the imaging surface 25, by carrying out control so as to selectively light or flash or the like the assisting lines that are particularly useful, the convenience of use of the radiographic imaging device 10 in image capturing is improved more.

Further, the above-described respective types of assisting lines may be marked by convex and concave portions, such as notches or the like.

Figure 29:
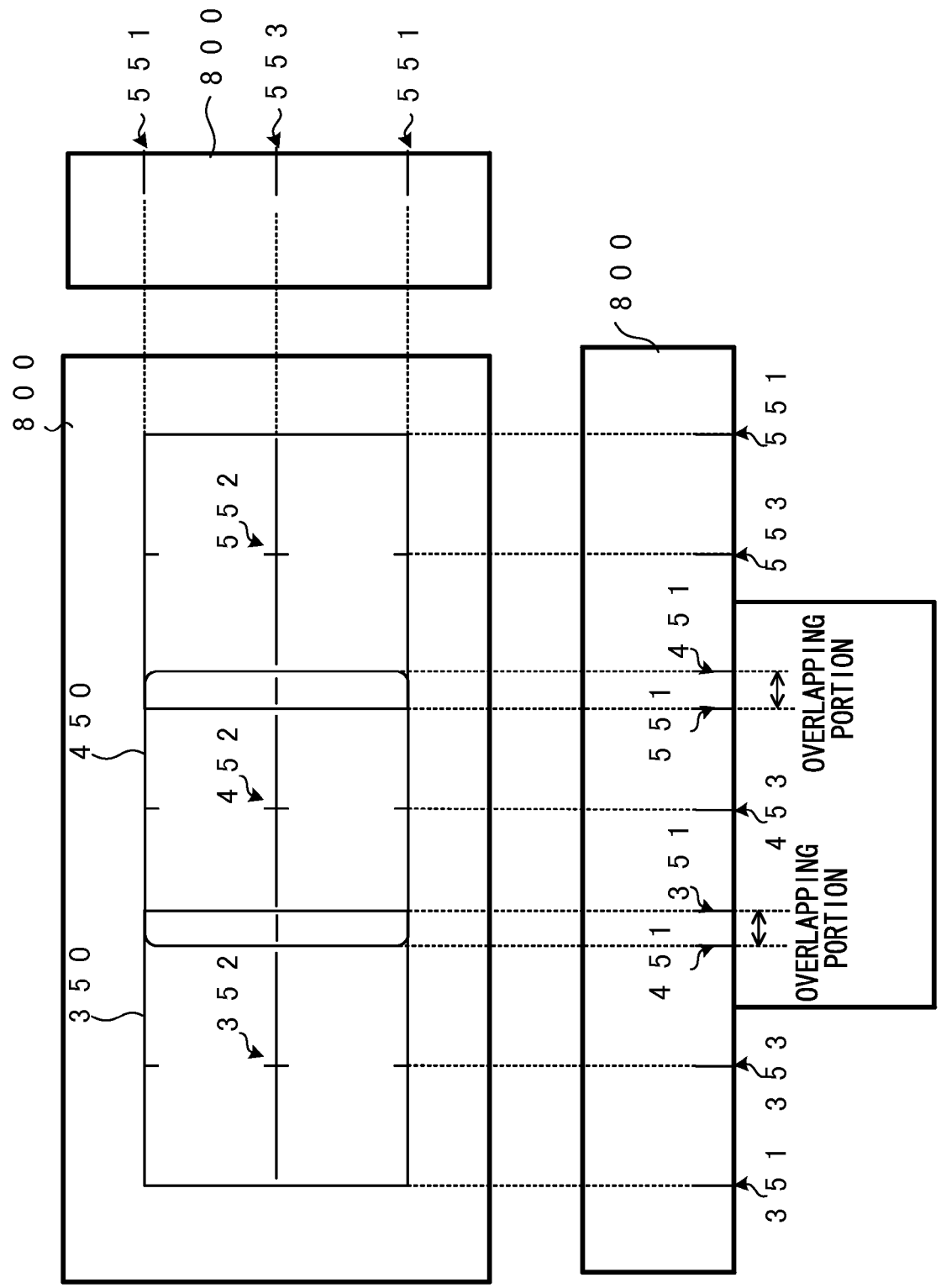
FIG. 29 is a schematic plan view and side views that are viewed from the radiation irradiating section side of an imaging stand in a case in which the assisting lines relating to the fifth embodiment of the present invention are provided.

Note that the various types of assisting lines that are shown in the above-described respective Examples may, other than being provided at the radiographic imaging device 10, also be provided at an imaging stand. FIG. 29 shows a case in which assisting lines corresponding to Example 1-1 are provided at an imaging stand 800 at which image capturing is carried out with the radiographic imaging device 10 being placed thereon in a case in which carrying out image capturing in a supine state. At the imaging stand 800 shown in FIG. 29, the imaging surface assisting lines 350, 352, 450, 452, 550, 552 are marked as assisting lines on the surface at the side (the upper side) where the radiographic imaging device 10 is disposed, and side surface assisting lines 351, 355, 451, 453, 551, 553 are marked on the side surfaces.

Figure 30:
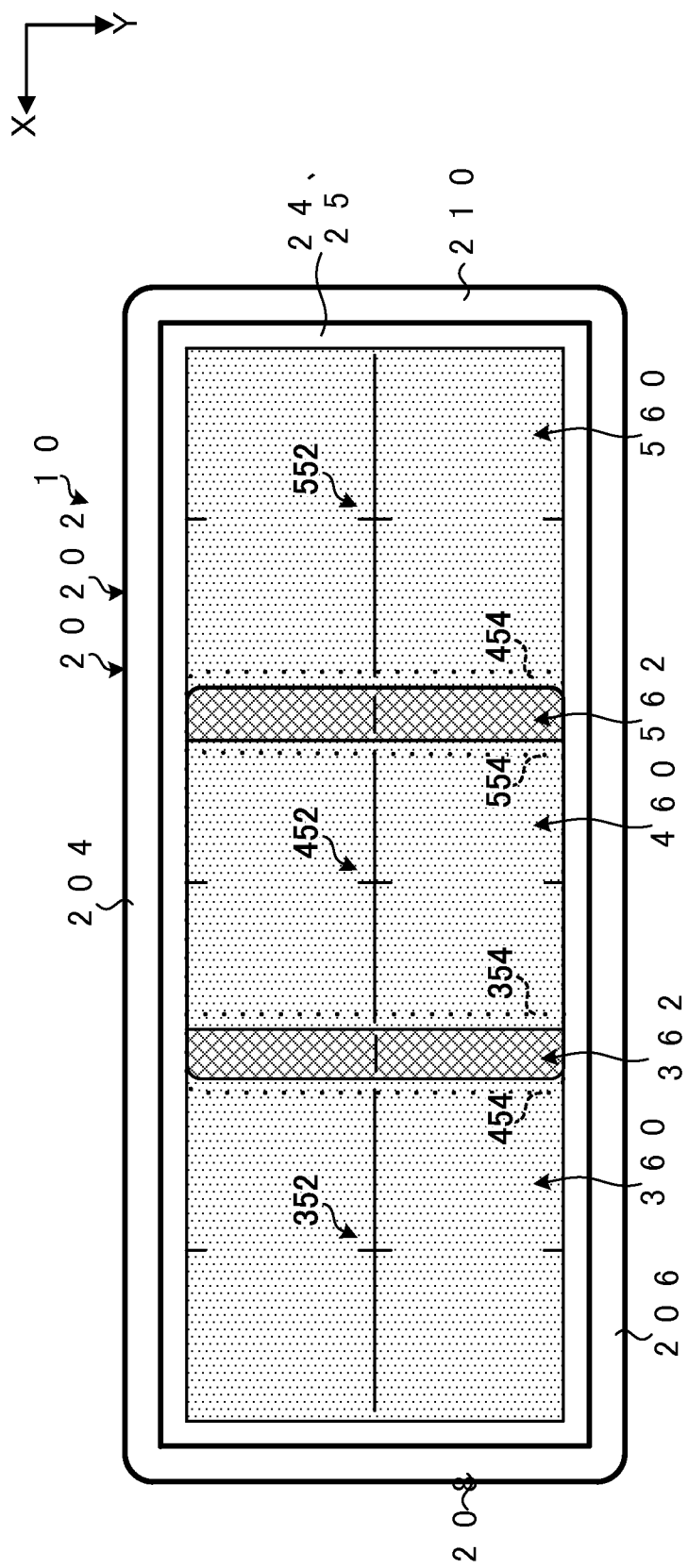
FIG. 30 is a concrete example in a case in which surface treatments of an imaging surface of a top plate are made to differ, in order to indicate respective positions of overlapping portions and respective effective imaging regions, relating to a sixth embodiment of the present invention.

Further, in the above-described respective Examples, the border portions between the effective imaging regions are indicated by the various types of assisting lines as the positions of the overlapping portions, the effective imaging region AR1 of the sensor unit 300, the effective imaging region AR2 of the sensor unit 400, and the effective imaging region of the sensor unit 500 respectively. However, the way of marking that indicates these positions on the imaging surface 25 of the top plate 24 is not limited to those of the above-described respective Examples. For example, in order to discriminate the regions of the imaging surface 25 of the top plate 24, that correspond to the overlapping portions, from the other regions, the surface treatment of the regions of the top plate 24 that correspond to the entire regions that correspond to the overlapping portions may be made to differ. Moreover, also in order to discriminate the effective imaging region AR1 of the sensor unit 300, the effective imaging region AR2 of the sensor unit 400 and the effective imaging region of the sensor unit 500 from other regions, the surface treatment of the regions of the top plate 24 that correspond to the respective regions may be made to differ. FIG. 30 shows a concrete example of a case in which the surface treatment of the imaging surface 25 of the top plate 24 is made to differ, in order to indicate the respective positions of the overlapping portions, the effective imaging region AR1 of the sensor unit 300, the effective imaging region AR2 of the sensor unit 400 and the effective imaging region of the sensor unit 500. A region 360 corresponding to the effective imaging region AR1 of the sensor unit 300, a region 460 corresponding to the effective imaging region AR2 of the sensor unit 400, and a region 560 corresponding to the effective imaging region of the sensor unit 500 are marked on the top plate 24 of the radiographic imaging device 10 shown in FIG. 30. Further, a region 362 corresponding to the overlapping portion of the sensor unit 300 and the sensor unit 400, and a region 562 corresponding to the overlapping portion of the sensor unit 400 and the sensor unit 500 are marked on the top plate 24 of the radiographic imaging device 10 shown in FIG. 30. The surface treatment of the top plate 24 is made to differ at the regions 360, 460, 560, and the regions 362, 562. The way of making the surface treatments differ is not particularly limited, and, for example, the pattern (design) may be made to differ, or the surface roughness may be made to differ, or the color may be made to differ, or the like.

Sixth Embodiment

In the present embodiment, the panel case 20 differs from the panel case 20 of the above-described first embodiment through fifth embodiment. Therefore, the panel case 20 of the present embodiment is described in detail.

The radiographic imaging devices 10 relating to the above-described respective embodiments have the three sensor units 300, 400, 500. In the radiographic imaging device 10 that has plural sensor units in this way, the dimensions of the device on the whole are enlarged and the weight is increased, as compared with a radiographic imaging device that has one sensor unit. Thus, at the radiographic imaging device 10 of the present embodiment, wheels for facilitating moving in a case in which the user moves the radiographic imaging device 10 are provided at the frame main body 202 of the radiographic imaging device 10. Moving can be facilitated due to the wheels rolling in accordance with the direction of moving.

Moving portions that are provided at the radiographic imaging device 10 are described in detail hereinafter through respective Examples. Note that illustration of the connector 26A is omitted in the drawings of the radiographic imaging devices 10 that are shown in the following Examples.

EXAMPLE 2-1

Figure 31:
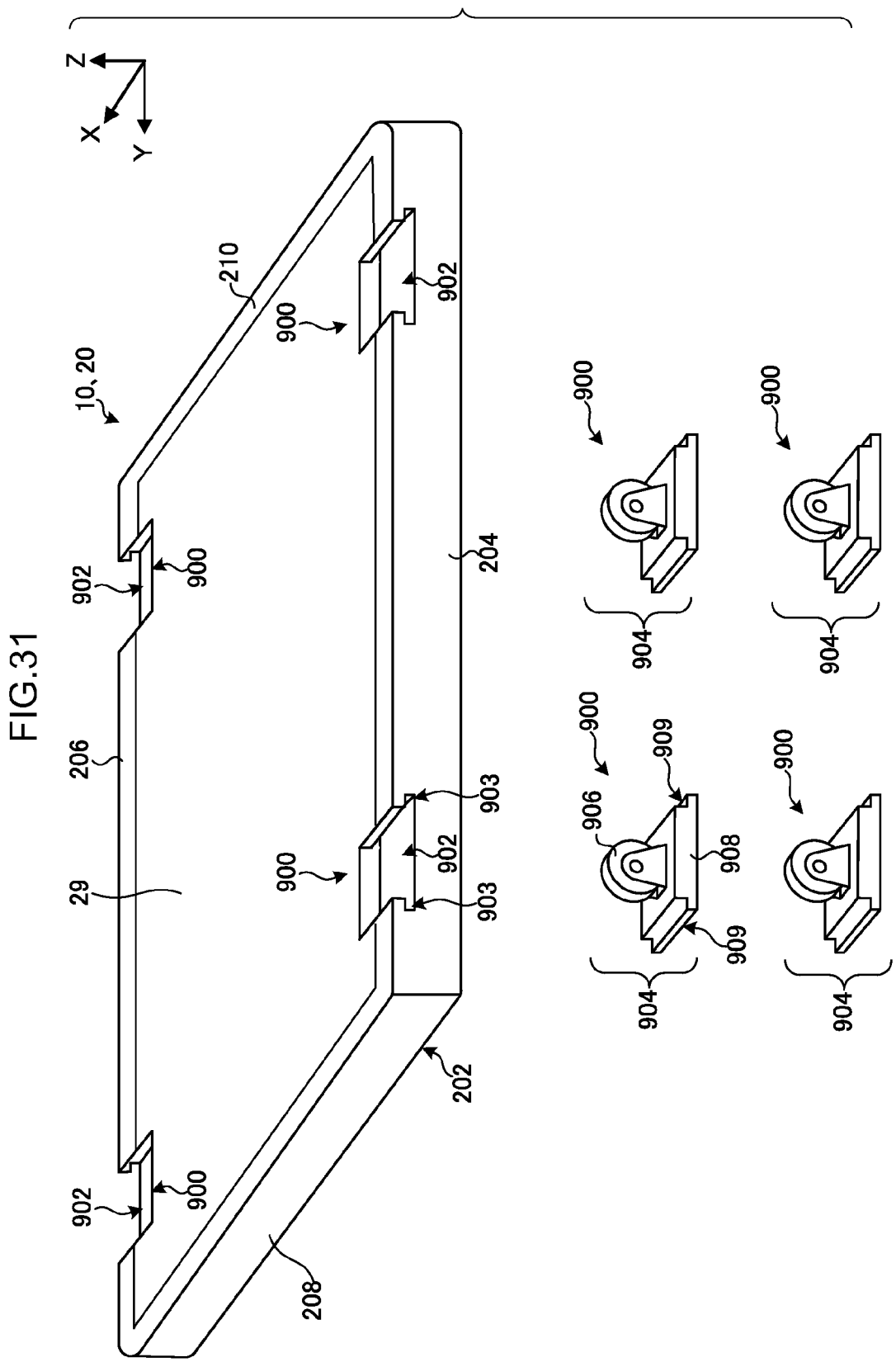
FIG. 31 is a concrete example of a case in which moving portions are provided at a back surface plate of a radiographic imaging device of Example 2-1 of the sixth embodiment of the present invention.

A concrete example of a case in which moving portions are provided at the back surface plate of the radiographic imaging device 10 of the present Example is shown in FIG. 31. A case is shown in which, at the radiographic imaging device 10 of the present Example, four wheels 906 are provided at a back surface plate 29 and the frame main body 202 of the panel case 20 that is provided so as to face the top plate 24.

Moving portions 900 of the present Example have four casters 904 that are removable from the panel case 20, and four mounting portions 902 for mounting the casters 904 to the panel case 20 respectively.

Two of the mounting portions 902 are provided at each of the first frame 204 side and the second frame 206 side of the panel case 20. As shown in FIG. 31, groove portions 903, into which bases 908 of the casters 904 are inserted, are provided at the top plate 24 sides of the mounting portions 902.

The casters 904 have the wheels 906 and the bases 908. The wheels 906 are mounted to the bases 908 so as to be able to roll in the moving direction of the radiographic imaging device 10. Projecting portions 909 are provided at the sides of the bases 908, which sides are opposite the sides at which the wheels 906 are mounted, for insertion into the mounting portions 902 of the radiographic imaging device 10.

Note that, in the present Example, the four mounting portions 902 have the same structure, and further, the four casters 904 have the same structure.

Figure 32:
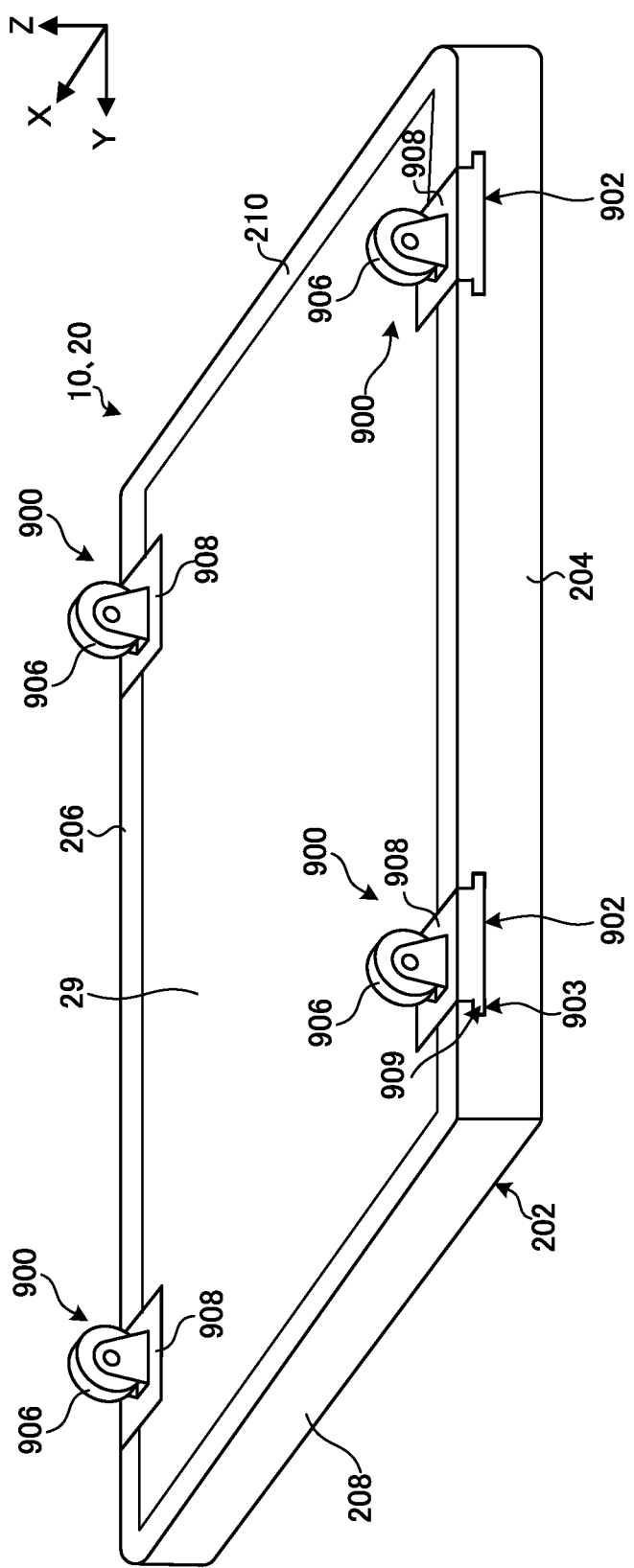
FIG. 32 is a drawing showing a state in which casters are mounted to mounting portions, in the radiographic imaging device of Example 2-1 of the sixth embodiment of the present invention.

The state in which the casters 904 are mounted to the mounting portions 902 at the radiographic imaging device 10 of the present Example is shown in FIG. 32.

The casters 904 are mounted to the panel case 20 due to the projecting portions 909 of the bases 908 of the casters 904 being inserted into the groove portions 903 of the mounting portions 902 of the panel case 20.

Note that, although not illustrated in FIGS. 31 and 32, fixing portions, for fixing the bases 908 of the casters 904 that are mounted, are provided within the mounting portions 902. The fixing portions are not particularly limited provided that they have the functions of, in a case in which the radiographic imaging device 10 is moved, fixing the bases 908 of the mounted casters 904 to the mounting portions 902, and, after moving, releasing the fixing of the bases 908 in accordance with the user's desires (e.g., the pushing of a releasing switch or the like by the user).

In this way, at the radiographic imaging device 10 of the present Example, the wheels 906 are provided at the back surface plate 29 and the frame main body 202 of the panel case 20. In a case in which the radiographic imaging device 10 is to be moved, the casters 904 are mounted to the mounting portions 902 of the panel case 20, the back surface plate 29 is set to be the lower (e.g., the floor) side, and the wheels 906 are made to contact the floor surface or the like and are moved. Due thereto, the user can easily move the radiographic imaging device 10.

Note that the structures of the mounting portions and the casters, and the way of mounting the casters, at the moving portions 900 are not limited to the mounting portions 902 and the casters 904 of the present Example. For example, concave portions, that are provided in the back surface plate 29 and are recessed toward the top plate 24 side, may be used as the mounting portions, and mounting may be carried out by embedding the casters within these mounting portions.

EXAMPLE 2-2

Figure 33:
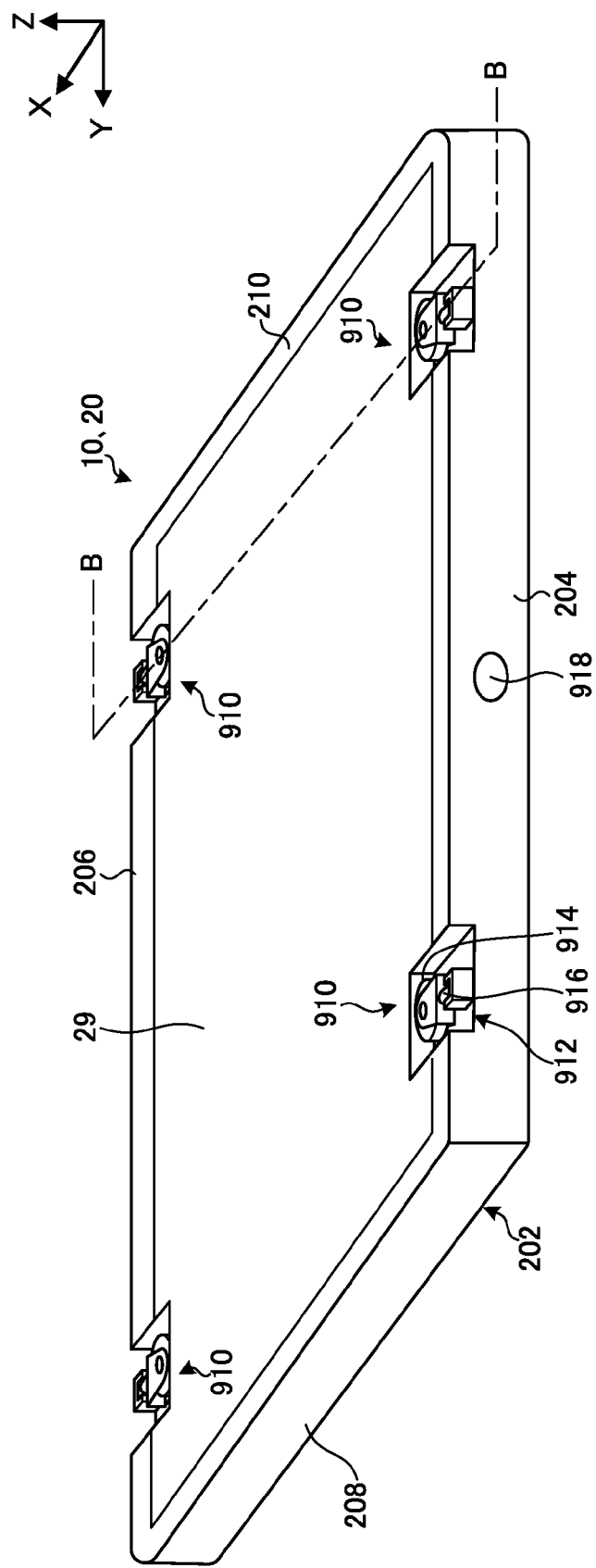
FIG. 33 is a concrete example of a case in which moving portions are provided at the back surface plate of a radiographic imaging device of Example 2-2 of the sixth embodiment of the present invention.

A concrete example of a case in which moving portions are provided at the back surface plate of the radiographic imaging device 10 of the present Example is shown in FIG. 33. A case is shown in which, at the radiographic imaging device 10 of the present Example, four wheels 914 are provided at the back surface plate 29 and the frame main body 202 of the panel case 20 that is provided so as to face the top plate 24.

Moving portions 910 of the present Example have the four wheels 914, and four accommodating portions 912 that accommodate the wheels 914 respectively.

Two of the accommodating portions 912 are provided at each of the first frame 204 side and the second frame 206 side of the panel case 20.

In a case in which the radiographic imaging device 10 is not to be moved such as in a case in which image capturing is to be carried out or the like, the wheels 914 are accommodated within the accommodating portions 912. On the other hand, in a case in which the radiographic imaging device 10 is to be moved, the wheels 914 are taken-out from the accommodating portions 912, and are set beneath the radiographic imaging device 10 (at least one of the back surface plate 29 and the frame main body 202) so as to be able to roll in the moving direction.

Figure 34:
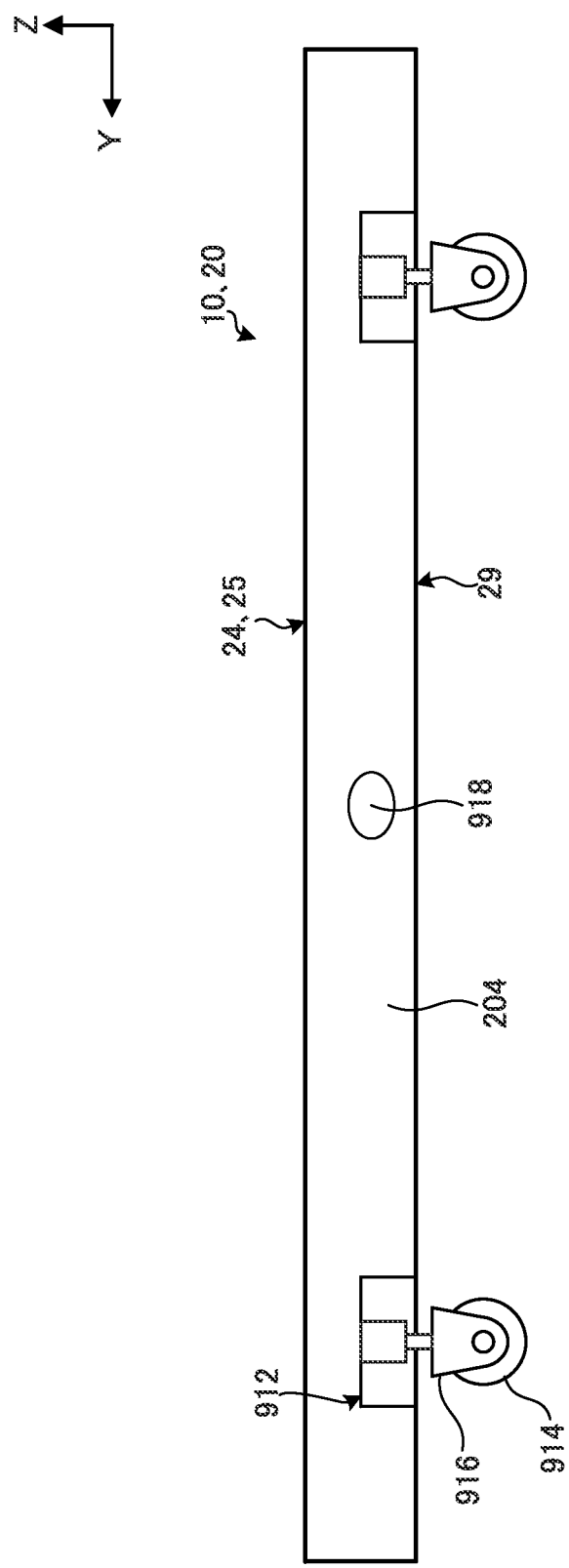
FIG. 34 is a side view in which a state, in which wheels are set beneath the radiographic imaging device, is viewed from a first frame side at the radiographic imaging device of Example 2-2 of the sixth embodiment of the present invention.
Figure 35:
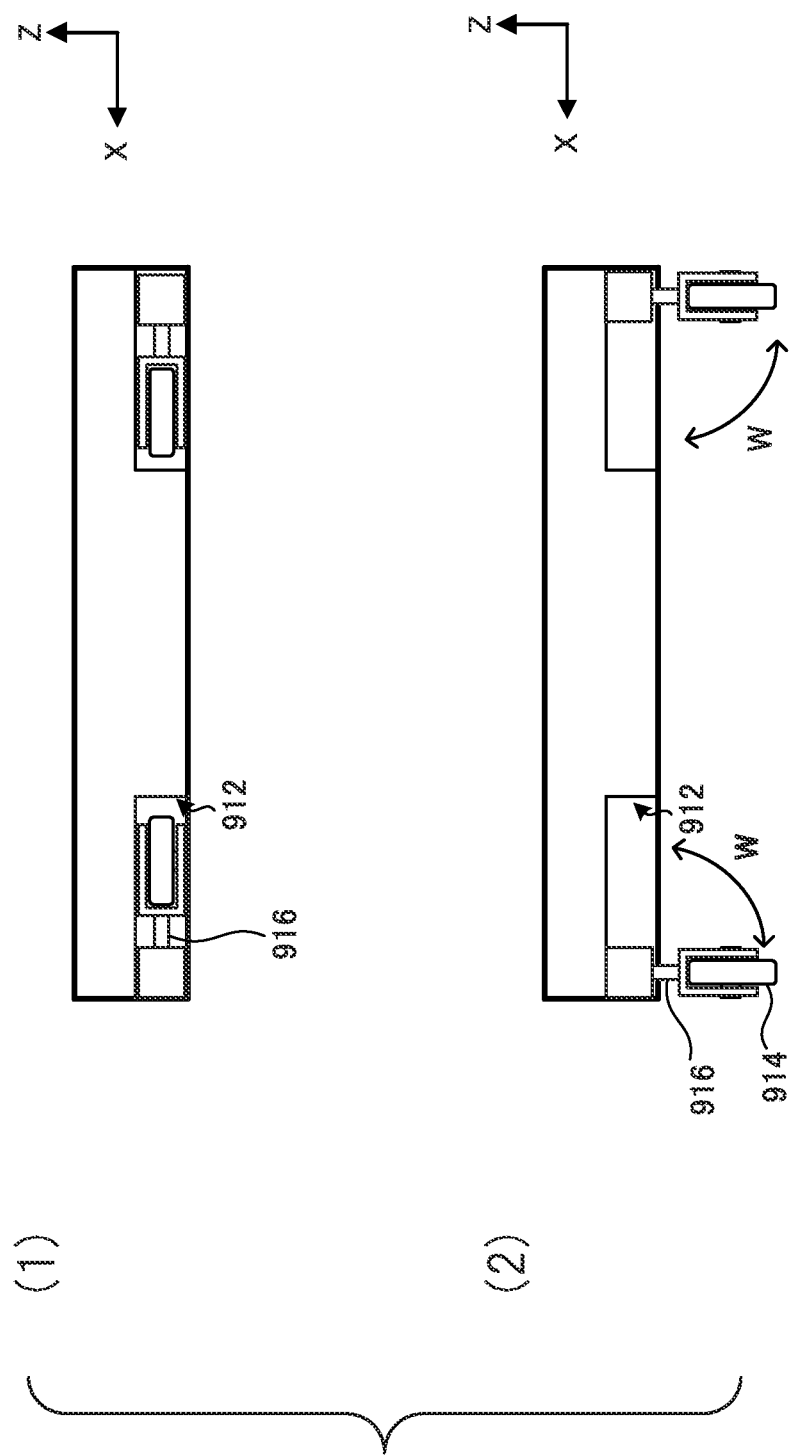
FIG. 35 is cross-sectional views in which the radiographic imaging device shown in FIG. 33 is cut along cutting plane line B-B.

FIG. 34 is a side view in which the radiographic imaging device 10 of the present Example, that is in a state in which the wheels 914 are set beneath the radiographic imaging device 10, is seen from the first frame 204 side. Moreover, FIG. 35 is side views in which the radiographic imaging device 10 of the present Example that is shown in FIG. 33 is cut along cutting plane line B-B. FIG. 35(1) shows the state in which the wheels 914 are accommodated in the accommodating portions 912, and FIG. 35(2) shows the state in which the wheels 914 are set beneath the radiographic imaging device 10.

As shown in FIGS. 34 and 35, the wheels 914 are connected to the interiors of the accommodating portions 912 by rotating shafts 916 that are examples of shafts. The wheels 914 can rotate in the arrow W directions of FIG. 35(2) toward the interior or the exterior of the panel case 20, with the places of connection being the centers of rotation.

Note that, in the present Example, the four moving portions 910 have the same structure.

Although not illustrated in FIGS. 33 through 35, driving portions, for taking the accommodated wheels 914 out and setting them beneath the radiographic imaging device 10, are provided within the accommodating portions 912. At the moving portions, the rotating shafts 916 are fixed, or, in a case in which a switch 918 provided at the frame main body 202 is pressed by the user or the like, this fixing is released. At the moving portions, in a case in which the radiographic imaging device 10 is not to be moved such as in a case in which image capturing is to be carried out or the like, the rotating shafts 916 are fixed within the accommodating portions 912 such that movement of the wheels 914 in the arrow W directions is suppressed.

Note that it is preferable that, in the state in which the wheels 914 are accommodated in the accommodating portions 912, the wheels 914 and the like do not jut-out further toward the outer side of the panel case 20 than the back surface plate 29. By doing so, the wheels 914 can be prevented from getting in the way in a case in which, for example, the radiographic imaging device 10 is set on an imaging stand or the floor.

On the other hand, at the moving portions, in a case in which the user presses the switch 918 in a case in which the radiographic imaging device 10 is to be moved or the like, the fixing of the rotating shafts 916 is cancelled, and the wheels 914 are moved in the arrow W directions, and the rotating shafts 916 are fixed again in the state in which the rotating shafts 916 have moved approximately 90° in the arrow W directions (the state shown in FIG. 35(2)).

The moving portions are not particularly limited provided that they have mechanisms that fix the rotating shafts 916 in accordance with the switch 918.

In this way, at the radiographic imaging device 10 of the present Example, the wheels 914 are provided at the back surface plate 29 and the frame main body 202 of the panel case 20. In a case in which the radiographic imaging device 10 is not to be moved, the wheels 914 are accommodated within the accommodating portions 910 of the panel case 20. In a case in which the radiographic imaging device 10 is to be moved, the rotating shafts 916 are moved approximately 90° in the arrow W direction, and the wheels 914 are set at the lower portion of the radiographic imaging device 10. In this state, by setting the back surface plate 29 to be the lower (e.g., the floor) side, and causing the wheels 914 to contact and move along the floor surface or the like, the user can easily move the radiographic imaging device 10.

Note that, although a case in which the wheels 914 are made to roll by the rotating shafts 916 has been described, the present Example is not limited to this. For example, the wheels 914 may be accommodated within and taken-out from the accommodating portions of the panel case 20 by a fold-up method utilizing shafts other than these.

EXAMPLE 2-3

Figure 36:
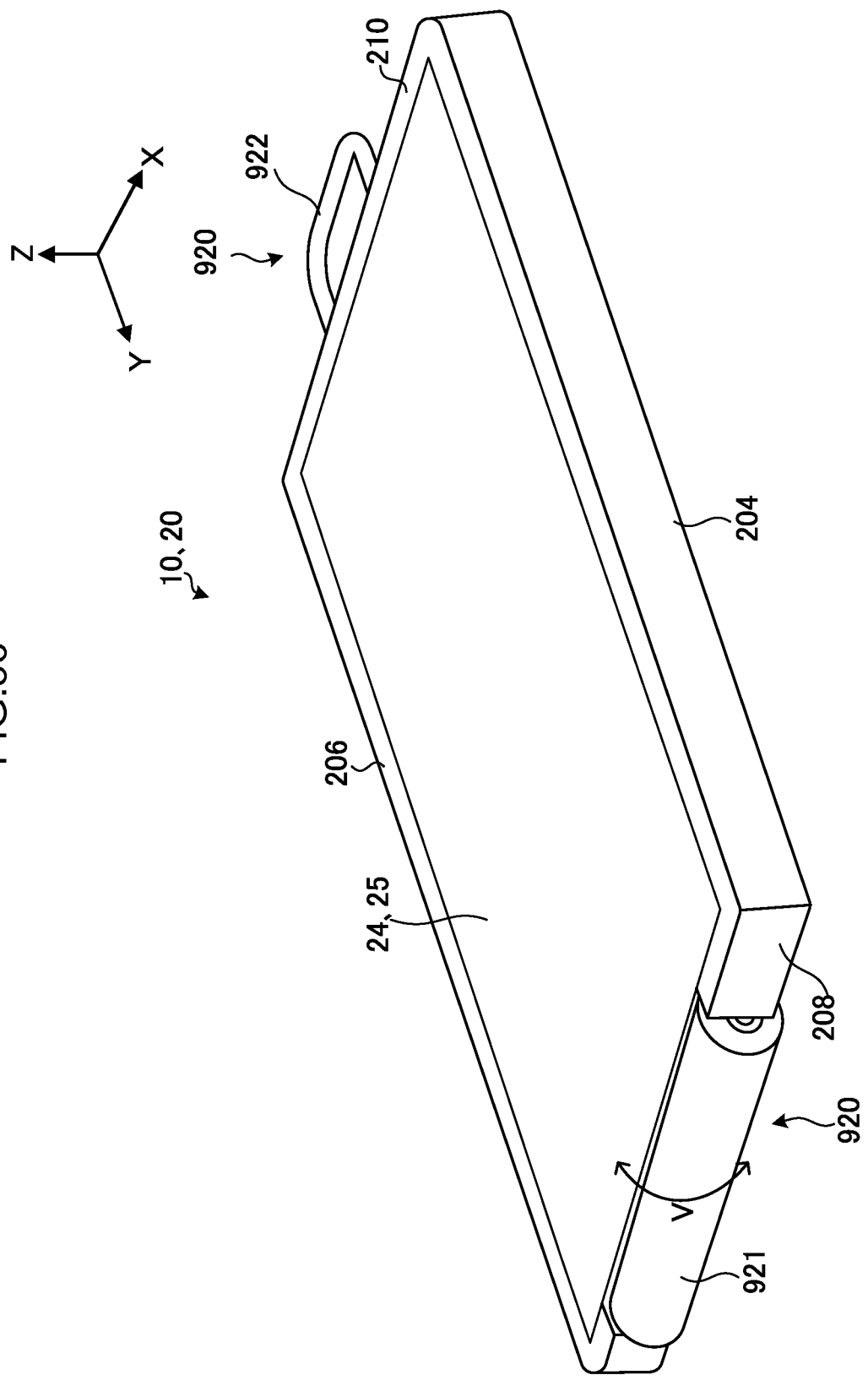
FIG. 36 is a concrete example of a case in which moving portions are provided at two facing sides of a frame main body of a radiographic imaging device of Example 2-3 of the sixth embodiment of the present invention.

A concrete example of a case, in which moving portions are provided at two facing sides of the frame main body 202 of the radiographic imaging device 10 of the present Example, is shown in FIG. 36. A case is shown in which, at the radiographic imaging device 10 of the present Example, rollers 921 that correspond to examples of wheels are provided at the third frame 208 and at the fourth frame 210 that faces the third frame 208.

A moving portion 920 of the present Example has the rollers 921 and a grasping portion 922.

The roller 921 is mounted to the third frame 208 so as to be able to roll in the moving directions (the arrow V directions shown in FIG. 36), by an unillustrated rotating shaft. Note that, at the radiographic imaging device 10 of the present Example, description is given of a case in which the one roller 921 is provided as a portion of the moving portion 920, but two or more rollers may be provided. For example, plural rollers whose rotating shafts are shorter than that of the roller 921 may be provided at the third frame 208.

The grasping portion 922 is a so-called handle, and is mounted to the fourth frame 210. The shape and material of the grasping portion 922 are not limited to those of the present Example, and it suffices for the grasping portion to be such that the user who moves the radiographic imaging device 10 can support (including push and pull) the radiographic imaging device 10 in order roll and move the rollers 921. Note that the grasping portion 922 may be made to be detachable from the fourth frame 210 of the frame main body 202.

In this way, at the radiographic imaging device 10 of the present Example, the rollers 921 are provided at the third frame 208 and the fourth frame 210, that face one another, of the frame main body 202. In a case in which the radiographic imaging device 10 is to be moved, movement of the radiographic imaging device 10 can be carried out easily due to the user grasping the grasping portion 922 and pushing or pulling the radiographic imaging device 10 in a state in which the rollers 921 have been made to touch the floor surface or the like.

Figure 37:
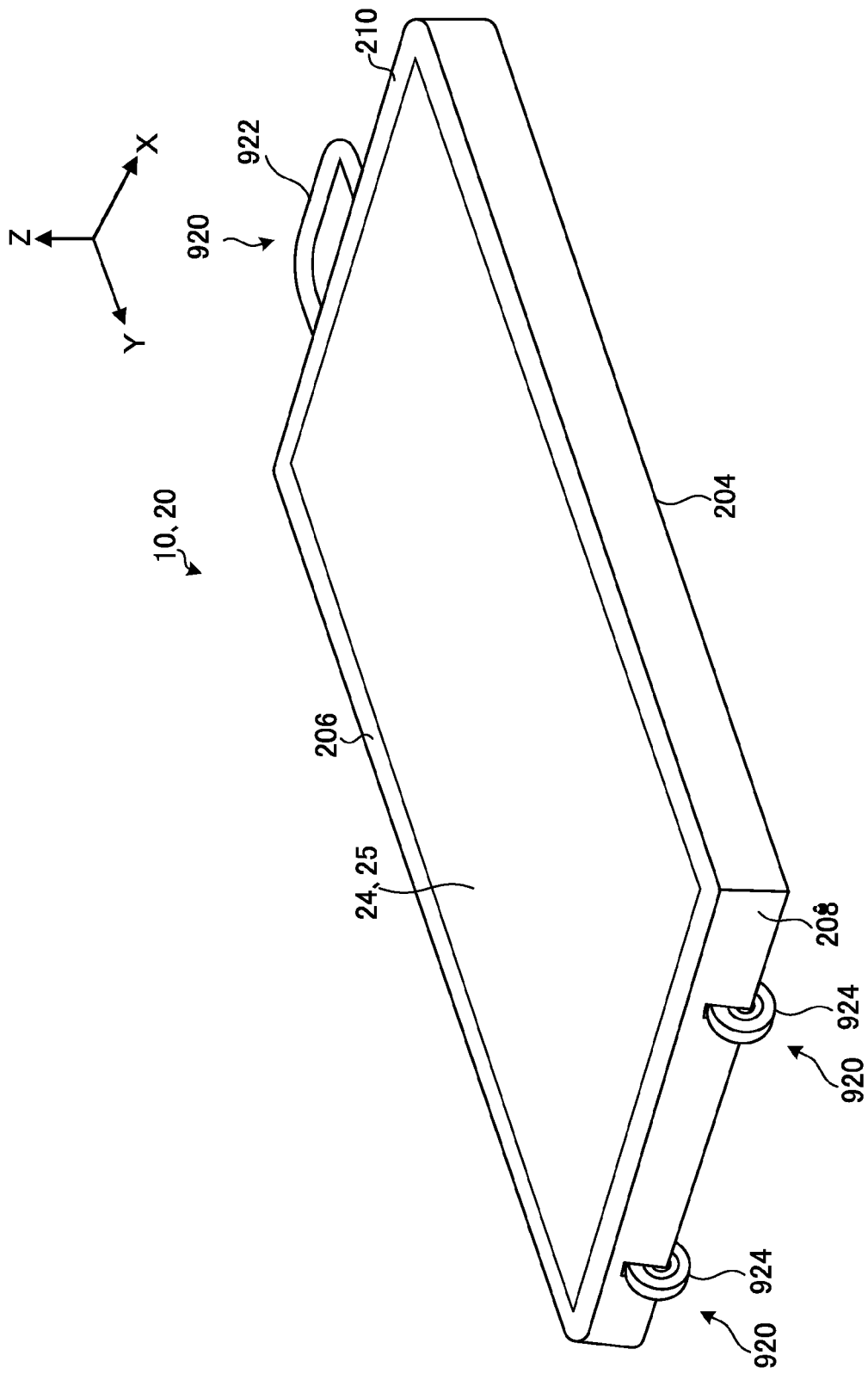
FIG. 37 is another concrete example of a case in which moving portions are provided at two facing sides of the frame main body of the radiographic imaging device of Example 2-3 of the sixth embodiment of the present invention.

Note that a case in which the rollers 921 are used as examples of the wheels in the present Example is shown in FIG. 36, but the wheels are not limited to the rollers 921. As described above, the wheels may be rollers of a shape that is different from that of the rollers 921. Further, as shown in FIG. 37 for example, there may be two wheels 924 that can roll in the moving direction of the radiographic imaging device 10.

As described above, at the radiographic imaging device 10 of the present embodiment, the panel case 20 of the radiographic imaging device 10 is provided with wheels that are used in a case in which the user moves the radiographic imaging device 10. The radiographic imaging device 10 can be easily moved due to the wheels rolling in accordance with the moving direction.

Further, at the radiographic imaging devices 10 of the above-described respective Examples, the wheels are not provided at the top plate 24 side of the panel case 20, and concretely, are not provided at the upper side of the sensor units 300, 400, 500. Therefore, there is no worry that images of the wheels will be captured in the radiological image, and thus, there is no concern that the image quality of the radiological image will deteriorate due to the moving portions.

Note that the above-described Examples of the present embodiment may be combined together. For example, the grasping portion 922 may be provided at the radiographic imaging devices 10 of Examples 2-1, 2-2. In this case as well, the grasping portion 922 may be detachable.

Further, the positions of the panel case 20 at which the moving portions 900, 910 are provided at not limited to the positions of above-described Examples 2-1, 2-2. For example, the positions may be at the side surfaces (the second frame 206 and the like) of the panel case 20.

Other Embodiments

The present invention has been described above by using plural embodiments, but the present invention is not limited to the above-described embodiments, and can be changed in various ways within a scope that does not depart from the gist thereof. For example, in the present invention, the radiation is not limited to X-rays, and, for example, γ-rays, electron beams, neutron beams, proton beams, heavy particle beams, or the like, that are used at least in medical care, can be used. Further, the present invention is not necessarily limited to a radiographic imaging device for medical care, and can be applied to, for example, a radiographic imaging device for nondestructive inspection.

Further, in the above-described respective embodiments, description is given of cases in which the respective radiation detection panels (30, 40, 50) have the signal processing section 320B, the detector control section 320C, the image memory 320D and the communication section 320E at the circuit unit (320, 420, 520). However, the present invention is not limited to this. Some of these functional portions and memories and the like that the circuit unit has may be provided at the exteriors of the respective radiation detection panels (30, 40, 50). Namely, a single circuit unit (some of the functions) may be provided at the entire radiographic imaging device 10. For example, the radiographic imaging device 10 shown in FIG. 38 has a control device 90 that includes a detector control section 90C and an image memory 90D, that correspond to the detector control section 320C and the image memory 320D respectively, and a communication section 90E. Further, a case in which the signal processing section 320B and the communication section 320E are provided at the circuit unit (320, 420, 520) of each radiation detection panel (30, 40, 50) is shown.

Further, the subject is not limited to a human, and may be an organism such as an animal other than a human, or a plant or the like, or may be another object.

Embodiments of the present invention are described above, but the present invention is not limited to the embodiments as will be clear to those skilled in the art.

What is claimed is:

1. A radiographic imaging device comprising three radiation detection panels that are a first radiation detection panel, a second radiation detection panel and a third radiation detection panel, each radiation detection panel having:
   a sensor unit that is rectangular flat plate shaped and at which a plurality of detection elements, that detect radiation irradiated from a radiation irradiating section, are arrayed in a matrix structure; and
   a circuit unit that is connected to the sensor unit, and that is disposed at a first side and a second side of the sensor unit that are adjacent to one another, and that carries out reading-out of radiological image information detected by the detection elements, or signal processing of the read-out radiological image information, wherein the circuit unit is not disposed at a third side that faces the first side and at a fourth side that faces the second side of the sensor unit, and the first radiation detection panel and the third radiation detection panel are disposed such that the third sides or the fourth sides of the sensor units face one another, and a portion of a second effective imaging region at the first side or the second side of the sensor unit of the second radiation detection panel, and a portion of a first effective imaging region at the third side or the fourth side of the sensor unit of the first radiation detection panel, are overlapped in a radiation irradiating direction, and a portion of a second effective imaging region at the third side or the fourth side of the sensor unit of the second radiation detection panel, and a portion of a third effective imaging region at the third side or the fourth side of the sensor unit of the third radiation detection panel, are overlapped in the radiation irradiating direction, and the second radiation detection panel is disposed at a side opposite the radiation irradiating section side of the first radiation detection panel and the third radiation detection panel.

2. The radiographic imaging device of claim 1, wherein the sensor unit and the circuit unit are connected via a flexible substrate.

3. The radiographic imaging device of claim 1, wherein the circuit unit is disposed at the side opposite the radiation irradiating section side of the first radiation detection panel, the second radiation detection panel or the third radiation detection panel.

4. The radiographic imaging device of claim 1, wherein at least a portion of the circuit unit is disposed along a side surface of the first radiation detection panel, the second radiation detection panel or the third radiation detection panel.

5. The radiographic imaging device of claim 1, wherein the circuit unit of the second radiation detection panel is disposed so as to overlap the first radiation detection panel at the side opposite the radiation irradiating section side of the first radiation detection panel.

6. The radiographic imaging device of claim 3, wherein a blocking plate that blocks radiation is provided between the sensor unit and the circuit unit.

7. The radiographic imaging device of claim 6, wherein the blocking plate is formed of a metal material.

8. The radiographic imaging device of claim 1, wherein the first radiation detection panel, the second radiation detection panel and the third radiation detection panel are accommodated within one panel case.

9. The radiographic imaging device of claim 8, wherein a reinforcing member is provided between the sensor unit and the circuit unit and reinforces the sensor unit and mounts the first radiation detection panel, the second radiation detection panel or the third radiation detection panel to the panel case.

10. The radiographic imaging device of claim 9, wherein
the sensor unit has a phosphor layer that converts radiation into light, and a photoelectric conversion panel that includes photoelectric conversion elements that convert light, that has been obtained by conversion by the phosphor layer, into electric signals and switching elements that are connected in series to the photoelectric conversion elements, and the phosphor layer and the photoelectric conversion panel are layered on the reinforcing member.

11. The radiographic imaging device of claim 9, wherein the reinforcing member is formed of a carbon fiber reinforced plastic material, a light metal material, or a light alloy material.

12. The radiographic imaging device of claim 10, wherein the sensor unit uses an irradiation side sampling in which the photoelectric conversion panel is disposed at the radiation irradiating section side, the phosphor layer is disposed at the side opposite the radiation irradiating section side, and light is collected from the radiation irradiating section side of the phosphor layer.

13. The radiographic imaging device of claim 8, further comprising an external connection cable, that has a power line and a signal line and that can be connected to a side surface of the panel case at an intermediate portion in a direction of arraying of the first radiation detection panel, the second radiation detection panel and the third radiation detection panel.

14. The radiographic imaging device of claim 8, further comprising an external connection cable, that has a power line and a signal line and that can be connected to a side surface of the panel case at one end portion in a direction of arraying of the first radiation detection panel, the second radiation detection panel and the third radiation detection panel.

15. The radiographic imaging device of claim 8, further comprising an external connection cable, that has a power line and a signal line and that can be connected to a side surface of the panel case in an array width direction of the first radiation detection panel, the second radiation detection panel and the third radiation detection panel.

16. The radiographic imaging device of claim 8, wherein the panel case has an imaging surface on which marks, that indicate positions corresponding respectively to a first overlapping region, at which the first effective imaging region and the second effective imaging region overlap, and a second overlapping region, at which the second effective imaging region and the third effective imaging region overlap, are marked on the radiation irradiating section side.

17. The radiographic imaging device of claim 16, wherein marks, that indicate positions corresponding respectively to the first effective imaging region, the second effective imaging region and the third effective imaging region, are further marked on at least one of the imaging surface or a side surface of the panel case.

18. The radiographic imaging device of claim 16, wherein marks, that indicate positions corresponding respectively to the first effective imaging region, the second effective imaging region and the third effective imaging region, are further marked on at least one of the imaging surface and a side surface of the panel case.

19. The radiographic imaging device of claim 16, wherein marks, that indicate positions corresponding to seams of a grid portion in a case in which capturing of a radiological image is carried out by using the grid portion at which are joined together a plurality of grids that remove scattered radiation that is included in the radiation that has been transmitted through the subject, are further marked at at least one of the imaging surface or a side surface of the panel case.

20. The radiographic imaging device of claim 16, wherein marks, that indicate positions corresponding to sizes in cases in which trimming of a radiological image is to be carried out, are further marked at at least one of the imaging surface or a side surface of the panel case.

21. The radiographic imaging device of claim 16, wherein, in a case in which a plurality of types of marks are marked at at least one of the imaging surface or a side surface of the panel case, methods of marking the marks are made to differ in accordance with the types.

22. The radiographic imaging device of claim 16, wherein marks, that indicate positions corresponding respectively to the first overlapping region and the second overlapping region, are marked on a side surface of the panel case.

23. The radiographic imaging device of claim 8, wherein the panel case has wheels.

24. The radiographic imaging device of claim 23, wherein
   the wheels are provided at a plurality of casters that are removable with respect to the panel case, and
   mounting portions, that mount the plurality of casters respectively to the panel case, are provided at the panel case.

25. The radiographic imaging device of claim 23, wherein
   the panel case has accommodating portions that accommodate the wheels, and
   the wheels are connected to interiors of the accommodating portions by shafts that fix the wheels, that have been taken-out from the accommodating portions, to side surfaces of the panel case.

26. The radiographic imaging device of claim 23, wherein the wheels are provided at a back surface plate of the panel case that is at a side opposite the radiation irradiating section side.

27. The radiographic imaging device of claim 23, wherein
   the wheels are provided at one side of the panel case, and
   wherein the radiographic imaging device further comprises
   a grasping portion, that is provided at a side of the panel case that faces the one side, or a grasping portion, that is removable with respect to a side of the panel case that faces the one side.

* * * * *